(12) United States Patent
Su et al.

(10) Patent No.: US 11,606,038 B2
(45) Date of Patent: Mar. 14, 2023

(54) INPUT VOLTAGE DEPENDENT CONTROL FOR ACTIVE CLAMP FLYBACK

(71) Applicant: Diodes Incorporated, Plano, TX (US)

(72) Inventors: Wei Chuan Su, Taipei (TW);
Feng-Jung Huang, Taoyuan (TW);
Yuan-Hung Lo, Taoyuan (TW);
Hao-Ming Chen, Taipei (TW)

(73) Assignee: Diodes Incorporated, Plano, TX (US)

( * ) Notice: Subject to any disclaimer, the term of this patent is extended or adjusted under 35 U.S.C. 154(b) by 0 days.

(21) Appl. No.: 17/653,908

(22) Filed: Mar. 8, 2022

(65) Prior Publication Data

US 2022/0376627 A1 Nov. 24, 2022

Related U.S. Application Data

(63) Continuation of application No. 17/171,929, filed on Feb. 9, 2021, now Pat. No. 11,336,190, which is a continuation-in-part of application No. 17/066,088, filed on Oct. 8, 2020, now Pat. No. 11,228,240, which is a continuation-in-part of application No. 16/667,585, filed on Oct. 29, 2019, now Pat. No. 10,833,578.

(60) Provisional application No. 62/986,449, filed on Mar. 6, 2020, provisional application No. 62/816,048, filed on Mar. 8, 2019.

(51) Int. Cl.
*H02M 3/335* (2006.01)
*H02M 1/00* (2006.01)
*H02M 1/14* (2006.01)
*G01R 19/165* (2006.01)

(52) U.S. Cl.
CPC .. *H02M 3/33576* (2013.01); *G01R 19/16538* (2013.01); *H02M 1/0009* (2021.05); *H02M 1/0025* (2021.05); *H02M 1/143* (2013.01)

(58) Field of Classification Search
CPC ......... H02M 3/33538; H02M 3/33546; H02M 3/33515; H02M 3/33576; H02M 3/33553; H02M 3/33507; H02M 3/33592; H02M 3/33523; H02M 3/3353; H02M 3/33569; H02M 2001/0058; H02M 2001/0009; H02M 2003/1557; H02M 1/4241; H02M 2007/4818; H02M 2007/4815; H02M 2007/4811
See application file for complete search history.

(56) References Cited

U.S. PATENT DOCUMENTS

2018/0254710 A1* 9/2018 Wang ..................... H02M 1/44

* cited by examiner

*Primary Examiner* — Bryan R Perez

(74) *Attorney, Agent, or Firm* — Steven A. Shaw; Diodes Incorporated

(57) ABSTRACT

A power converter and control circuit are provided. The control circuit has a power controller for turning on the power switch to maintain a desired output voltage and mode selection switch provides a mode selection signal. Depending on the magnitude of an input voltage of the power converter, in which the mode selection circuit compares the input voltage of the power converter with a reference voltage, a modulation controller is configured to turn on a modulation switch to activate the capacitor according to the mode selection signal.

15 Claims, 49 Drawing Sheets

$$f_{MAX} = \frac{1}{t_{ON} + t_{DIS} + (K-1)T_{QR} + \frac{1}{2}T_{QR}}$$

$$f_{MIN} = \frac{1}{t_{ON'} + t_{DIS} + (K-1)T_{QR} + \frac{1}{2}T_{QR1}}$$

Spectrum of $N^{th}$ harmonic $N\left(f_{avg} - \frac{1}{2}\Delta f\right)$   $Nf_{avg}$   $N\left(f_{avg} + \frac{1}{2}\Delta f\right)$ Mod ON time with high $V_{IN}$ Mod ON time with high $V_{IN}$ Mod ON time with medium $V_{IN}$ Mod ON time with middle $V_{IN}$ Mod ON time with low $V_{IN}$ Mod ON time with low $V_{IN}$ though for a switching frequency to a power converter. The power switch is turned on again in the next switching cycle.

INPUT VOLTAGE DEPENDENT CONTROL FOR ACTIVE CLAMP FLYBACK

CROSS-REFERENCES TO RELATED APPLICATIONS

This application is a Continuation of U.S. patent application Ser. No. 17/171,929, filed Feb. 9, 2021, entitled "INPUT VOLTAGE DEPENDENT CONTROL FOR ACTIVE CLAMP FLYBACK," which is a continuation-in-part of U.S. patent application Ser. No. 17/066,088, filed Oct. 8, 2020, entitled "INPUT VOLTAGE ADAPTIVE JITTER IN POWER CONVERTER," which is a continuation-in-part of U.S. patent application Ser. No. 16/667,585, filed Oct. 29, 2019, entitled "CIRCUIT AND METHOD FOR JITTER GENERATION IN QUASI-RESONANT CONVERTER, which claims priority to U.S. Provisional Patent Application No. 62/816,048, filed Mar. 8, 2019, entitled "CIRCUIT AND METHOD FOR JITTER GENERATION IN QUASI-RESONANT CONVERTER." U.S. patent application Ser. No. 17/066,088 also claims priority to U.S. Provisional Patent Application No. 62/986,449, filed Mar. 6, 2020, entitled "INPUT VOLTAGE ADAPTIVE JITTER FOR QUASI-RESONANT CONTROL." The content of all the above-listed applications is incorporated by reference in their entirety herein for all purposes.

BACKGROUND

Embodiments of the invention relate to switching mode power supplies. More particularly, the invention provides methods and apparatus for reducing electromagnetic interference (EMI) of switching mode power supplies.

Regulated power supplies are indispensable in modern electronics. For example, the power supply in a personal computer often needs to receive power input from various outlets. Desktop and laptop computers often have regulated power supplies on the motherboard to supply power to the CPU, memories, and periphery circuitry. Regulated power supplies are also used in a wide variety of applications, such as home appliances, automobiles, and portable chargers for mobile electronic devices, etc.

In general, a power supply can be regulated using a linear regulator or a switching mode controller. A linear regulator maintains the desired output voltage by dissipating excess power. In contrast, a switching mode controller rapidly switches a power transistor on and off with a variable duty cycle or variable frequency and provides an average output that is the desired output voltage.

In such a switched mode power supply system, a switch is connected to the primary winding of the transformer. In the switching power supplies, the power transistor switches on and off periodically to convert the primary current of the transformer to the secondary side. The stable output voltage will be obtained by regulating the duty cycle or frequency of the primary side switch. Magnetic energy is stored in the inductance of the primary winding when the switch is turned on, and the energy is transferred to the secondary winding when the switch is turned off. The energy transfer results in a current flowing through the secondary winding and the rectifying diode. When the energy transfer is completed, the current stops flowing through the diode. If the switching mode power supply, also referred to as the flyback converter, operates in discontinuous conduction mode (DCM), during the discontinuous time, a resonant waveform of substantially sinusoidal oscillation of decreasing amplitude appears at the secondary winding and across the power switch due to the built-in inductance and capacitance in the converter. After the discontinuous time, the power switch is turned on again in the next switching cycle.

In quasi-resonant (QR) switching, the controller waits for one of the valleys in the resonant waveform of the drain voltage and then turns on the power switch. Compared with the traditional continuous conduction mode (CCM) and discontinuous conduction mode (DCM) of operation in a flyback converter, quasi-resonant switching can reduce turn-on losses at the power switch, thus increasing efficiency and lowering device temperatures.

Compared with linear regulators, switching mode power supplies have the advantages of smaller size, higher efficiency and larger output power capability. On the other hand, they also have the disadvantages of greater noise, especially electromagnetic Interference (EMI) at the power transistor's switching frequency or its harmonics.

EMI is a critical issue in the design of a switching mode power supply. In order to reduce EMI, different frequency jittering techniques can be used. For example, switching frequencies may be varied by frequency modulation in order to spread out the electromagnetic radiation energy across a frequency range. One way to vary the switching frequency is to add a jitter component to the system clock. This technique helps reducing average EMI emission. However, implementing effective jittering can be difficult in a quasi-resonant (QR) converter, as explained further below.

BRIEF SUMMARY OF THE INVENTION

The inventor has recognized that, in a quasi-resonant (QR) converter, it is difficult to implement effective frequency jitter. Under discontinuous conduction mode (DCM), the flyback converter has an LC resonant waveform during the discontinuous time after the secondary side current is discharged. The QR operation turns on the power switch at a valley point of resonant voltage. The turn-on condition at a valley point of the resonant voltage can limit the switching frequencies of the flyback system and prevent the switching frequency to spread over a relatively large frequency range. As a result, the effectiveness of the jittering is limited.

Embodiments of the invention teach a technique for introducing jitter in the switching frequency of a power converter. The power converter includes a power switch controlling the primary current flow, and a time-varying capacitance is coupled in parallel to the power switch. The time-varying capacitance adds a frequency jitter to the frequency of the converter.

Further embodiments of the invention teach a power converter having a power switch controlling current flow in the power converter and a variable capacitance coupled in parallel to the power switch. The variable capacitance is configured to add a frequency jitter to the power converter. In some embodiments, the frequency jitter comprises a first portion that varies with an input voltage of the power converter and a second portion that is a time-varying function. The first portion that varies with an input voltage can reduce the switching loss of the power converter. In some embodiments, the variable capacitance comprises a transistor coupled in series with a capacitor.

As an example, this invention teaches a power converter that includes a transformer having a primary winding for coupling to an input voltage, a secondary winding providing an output voltage of the power converter, and a sensing circuit for providing a sensing signal, which monitors a resonant waveform of the power converter during discontinuous time. The power converter includes a power switch for coupling to the primary winding of the power converter to control a primary current flow, and a capacitor and a modulation switch coupled in parallel to the power switch.

The power converter can also include a control circuit that includes a power controller for turning on the power switch in response to the resonant waveform in the sensing signal during a discontinuous time, and a jitter controller for turning on the modulation switch in response to the resonant waveform in the sensing signal during the discontinuous time. The jitter controller varies a turn-on time of the modulation switch to add a frequency jitter to a switching frequency of the power converter. The frequency jitter can include a first portion that varies with the input voltage of the power converter and a second portion that is a time-varying function.

As another example, this invention teaches a method for controlling a power converter. The method includes turning on a power switch in response to a resonant waveform in a sensing signal during a discontinuous time of the power converter, wherein the power switch is coupled to a primary winding of the power converter to control a primary current flow. The method also includes adding a capacitance in parallel to the power switch during the discontinuous time, to vary an oscillation period of the resonant waveform to add a frequency jitter to a switching frequency of the power converter. The method can add a capacitance in parallel to the power switch by turning on a modulation switch that is coupled in series with a capacitor, wherein the capacitor and the modulation switch are coupled in parallel with the power switch. The frequency jitter can include a first portion that varies with an input voltage of the power converter and a second portion that is a time-varying function.

Embodiments of the invention also teach a power converter having a power switch controlling current flow in the power converter and a variable capacitance coupled in parallel to the power switch. The variable capacitance is configured to add a frequency jitter to the power converter. In some embodiments, the frequency jitter comprises a first portion that varies with an input voltage of the power converter and a second portion that is a time-varying function. In some embodiments, the variable capacitance comprises a transistor couple in series with a capacitor.

In another example, an embodiment of the invention teaches a method for controlling a quasi-resonant (QR) converter to reduce electromagnetic interference (EMI). The converter includes a power switch coupled to a primary winding of the converter to control a primary current flow, and a sensing signal monitoring the converter through an auxiliary winding. The method includes turning on the power switch at a valley point of a resonant waveform in the sensing signal during a discontinuous time of the converter for quasi-resonant (QR) operation. The method further includes adding a capacitance in parallel to the power switch at a peak point of the resonant waveform in the sensing signal during the discontinuous time, to vary an oscillation period of the resonant waveform, which leads to variations of the discontinuous time and changes the switching frequency of the converter. A modulation switch with a time-varying on-time can be used to control the duration of time in which the additional capacitance is in effect. For example, the time-varying duration can be a linear function of time to spread out the switching frequency across a relatively large frequency range.

In another example, another embodiment of the invention teaches a control circuit for a quasi-resonant (QR) converter. The control circuit includes a quasi-resonant controller for turning on a power switch at a valley point of a resonant waveform in a sensing signal during a discontinuous time of the converter. The power switch is coupled to a primary winding of the converter to control a primary current flow, and the sensing signal is monitoring the resonant waveform of the converter through an auxiliary winding. The control circuit also includes a jitter controller for adding a capacitance in parallel to the power switch at a peak point of the resonant waveform in the sensing signal during the discontinuous time. The jitter controller varies an oscillation period of the resonant waveform to add a frequency jitter to a switching frequency of the converter.

In another example, an embodiment of this invention teaches a quasi-resonant (QR) converter. The converter includes a transformer having a primary winding for coupling to an external input voltage, a secondary winding providing an output voltage of the converter, and an auxiliary winding for providing a sensing signal of the converter. The converter also has a power switch for coupling to the primary winding of the converter to control a primary current flow, and a capacitor and a modulation switch coupled in parallel to the power switch, with the modulation switch coupled in series with the capacitor. The converter also has a control circuit that includes a quasi-resonant controller and a jitter controller. The quasi-resonant controller turns on the power switch at a valley point of a resonant waveform in the sensing signal during a discontinuous time. The jitter controller turns on the modulation switch at a peak point of the resonant waveform in the sensing signal during the discontinuous time. The jitter controller varies a turn-on time of the modulation switch to add a frequency jitter to a switching frequency of the converter.

In another example, an additional embodiment of this invention teaches a control circuit for a quasi-resonant (QR) converter. The control circuit includes a quasi-resonant controller for turning on a power switch at a valley point of a resonant waveform in a sensing signal during a discontinuous time of the converter, wherein the power switch is coupled to a primary winding of the converter to control a primary current flow, and the sensing signal monitors the resonant waveform of the converter through an auxiliary winding. The control circuit also includes a jitter controller for modulating a capacitance coupled in parallel to the power switch to vary an oscillation period of the resonant waveform to add a frequency jitter to a switching frequency of the converter. The frequency jitter includes a first portion that varies with an input voltage of the converter and a second portion that is a time-varying function. In an embodiment, the jitter controller starts varying the oscillation period at a peak point of the resonant waveform in the sensing signal during the discontinuous time.

In another example, an embodiment of this invention teaches a method for controlling a quasi-resonant (QR) converter. The method includes turning on a power switch at a valley point of a resonant waveform in a sensing signal during a discontinuous time of the converter. The power switch is coupled to a primary winding of the converter to control a primary current flow, and the sensing signal monitors the resonant waveform of the converter through an auxiliary winding. The method also includes modulating a capacitance coupled in parallel to the power switch to vary an oscillation period of the resonant waveform to add a frequency jitter to a switching frequency of the converter. The oscillation period includes an offset that varies with an input voltage of the converter and a time-varying dithering period. In an embodiment, the method also includes starting to vary the oscillation period at a peak point of the resonant waveform in the sensing signal during the discontinuous time.

In a flyback converter, to reduce the switching loss, a modulation switch $Q_M$ can be turned on to connect a modulation capacitor $C_{SN}$ in parallel with the capacitance $C_{OSS}$ of the power switch for inducing a larger negative resonant current on Lm. However, in order to precisely control the negative current on Lm, the control circuit needs to accurately detect the peak of the resonant waveform for turning on the $Q_M$. As a result, the transformer must be operated under discontinuous conduction mode (DCM).

An aspect of this invention teaches to change the operating mode of the flyback system according to the input voltage. The efficiency of a flyback system is determined by different factors depending on the input voltage. The efficiency of a flyback system is often dominated by switching loss under high input voltage, and can be dominated by conduction loss under low input voltage. By changing the operating mode, the flyback system can benefit from lower peak current under low input voltage and can also benefit from drain-source voltage $V_{DS}$ reduction under high input voltage.

In an example, this invention teaches a power converter that includes a transformer having a primary winding for coupling to an input voltage, a secondary winding providing an output voltage of the power converter, and a sensing circuit for providing a sensing signal monitoring the converter through an auxiliary winding. The power converter also includes a power switch for coupling to the primary winding of the power converter to control a primary current flow, a capacitor and a modulation switch coupled in parallel to the power switch, the modulation switch being coupled in series with the capacitor, and a control circuit. The control circuit includes a power controller for turning on the power switch to maintain a desired output voltage and a mode selection circuit for comparing the input voltage with a reference voltage and providing a mode selection signal that indicates a high input voltage mode if the input voltage is higher than the reference voltage and a low input voltage mode if the input voltage is lower than the reference voltage. The control circuit further includes a modulation controller configured to turn on the modulation switch to activate the capacitor according to the mode selection signal. In the low input voltage mode, the modulation switch is turned on in a demagnetization-time during which the secondary winding discharges. In the high input voltage mode, the modulation switch is turned on in a discontinuous time during which no current flows in the transformer and the sensing signal is characterized by a resonant waveform.

In another example, this invention teaches a control circuit for a power converter. The controller includes a power controller for turning on a power switch to maintain a desired output voltage. The power switch is coupled to a primary winding of the power converter to control a primary current flow. The controller also includes a modulation controller configured to activate a modulation capacitance coupled in parallel to the power switch. In a low input voltage mode, the modulation switch is turned on in a demagnetization-time during which the secondary winding discharges. In a high input voltage mode, the modulation switch is turned on in a discontinuous time.

In another example, the invention teaches a method for controlling a power converter. The method includes turning on a power switch to maintain a desired output voltage, wherein the power switch is coupled to a primary winding to control a primary current flow and the output voltage is provided by a secondary winding. The method also includes adding a capacitance in parallel to the power switch at a time determined by a magnitude of an input voltage to the power converter. In a low input voltage mode, the capacitance is added in a demagnetization-time during which the secondary winding discharges. In a high input voltage mode, the capacitance is added in a discontinuous time.

DEFINITIONS

The terms used in this disclosure generally have their ordinary meanings in the art within the context of the invention. Certain terms are discussed below to provide additional guidance to the practitioners regarding the description of the invention. It will be appreciated that the same thing may be said in more than one way. Consequently, alternative language and synonyms may be used.

A power switch as used herein refers to a semiconductor switch, for example, a transistor, that is designed to handle high power levels.

A power MOSFET is a specific type of metal oxide semiconductor field-effect transistor (MOSFET) designed to handle significant power levels. An example of a power MOSFET for switching operations is called a double-diffused MOS or simply DMOS.

A body diode in a power MOSFET is formed when the body and source are coupled together, and the body diode is formed between drain and source. The diode is located between the drain (cathode) and the source (anode) of the MOSFET making it able to block current in only one direction.

A power converter is an electrical or electro-mechanical device for converting electrical energy, such as converting between AC and DC or changing the voltage, current, or frequency, or some combinations of these conversions. A power converter often includes voltage regulation.

A regulator or voltage regulator is a device for automatically maintaining a constant voltage level.

A switching regulator, or switch mode power supply (SMPS) is a power converter that uses an active device that switches on and off to maintain an average value of output. In contrast, a linear regulator is made to act like a variable resistor, continuously adjusting a voltage divider network to maintain a constant output voltage, and continually dissipating power.

Continuous conduction mode (CCM) is an operational mode of a power converter, in which the system turns on the primary side current before the secondary side current is stopped.

Discontinuous conduction mode (DCM) is an operational mode of a power converter, in which there exists a discontinuous time period, during which the current flow is stopped on both the primary side and the secondary side. The primary side is turned on again following the discontinuous time period.

Quasi-resonant (QR) mode is an operational mode of a power converter operating in discontinuous conduction mode (DCM), in which the primary side is turned on at a valley point of a resonant waveform during the discontinuous time period. Quasi-resonant operation can reduce switching loss of the power converter.

An operational amplifier (op-amp or opamp) refers to a DC-coupled high-gain electronic voltage amplifier with a differential input and, usually, a single-ended output. An operational amplifier can be characterized by a high input impedance and a low output impedance, and can be used to perform mathematical operations in analog circuits.

A voltage reference is an electronic device that ideally produces a fixed (constant) voltage irrespective of the loading on the device, power supply variations, temperature changes, and the passage of time.

A reference voltage is a voltage value that is used as a target for a comparison operation.

When the term "the same" is used to describe two quantities, it means that the values of two quantities are determined the same within measurement limitations.

BRIEF DESCRIPTION OF THE DRAWINGS

FIGS. 6-10 are schematic or waveform diagrams illustrating the structures and functions of various components in the control circuit in a converter that embody certain aspects of this invention;

FIG. 6 shows schematic and waveform diagrams illustrating the structures and functions of a valley detector and a peak detector in the control circuit in a converter that embodies certain aspects of this invention;

FIG. 9 is a simplified schematic diagram illustrating a first example of a quasi-resonant controller that embodies certain aspects of this invention;

FIG. 10 is a simplified schematic diagram illustrating a second example of a quasi-resonant controller that embodies certain aspects of this invention;

DETAILED DESCRIPTION OF THE INVENTION

Figure 1:
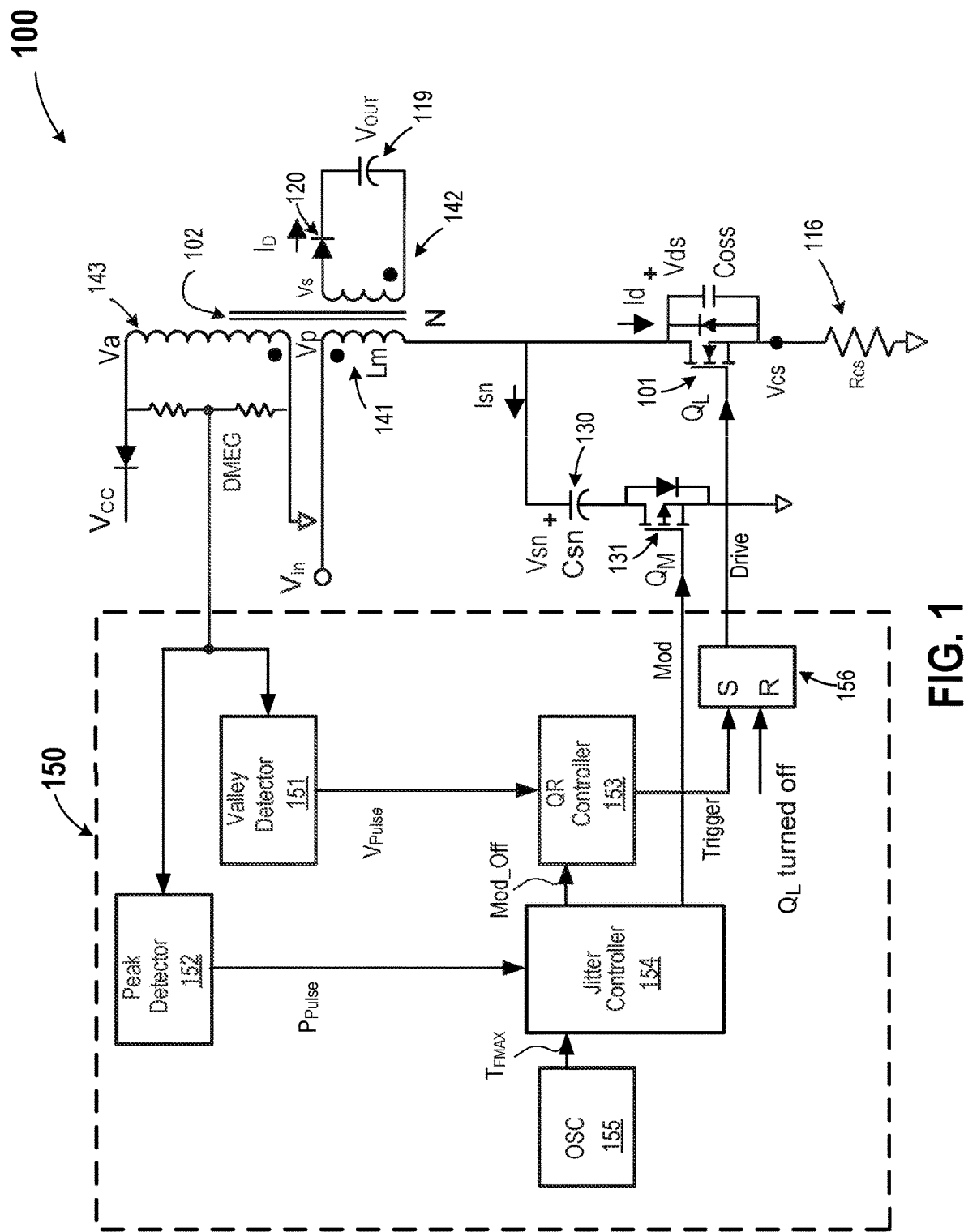
FIG. 1 is a simplified schematic diagram of a flyback converter that embodies certain aspects of this invention.

FIG. 1 is a simplified schematic diagram of a flyback converter that embodies certain aspects of this invention. Flyback converter 100 includes a transformer 102, which includes a primary winding 141 for coupling to an input voltage $V_{in}$ and a secondary winding 142 for providing the output voltage $V_{out}$ through a rectifying diode 120 and a capacitor 119. A current in the rectifying diode is $I_D$. Transformer 102 also has an auxiliary winding 143 for providing a sensing signal DMEG monitoring a resonant waveform of the converter during a discontinuous time. Auxiliary winding 143 also provides a voltage $V_{cc}$, which can be used as a power supply for the support circuitry, such as a control circuit. In FIG. 1, Vp denotes the voltage at the primary winding, Vs denotes the voltage at the secondary winding, and Va denotes the voltage at the auxiliary winding. In FIG. 1, $L_m$ represents the inductance of the primary winding, and N represents the ratio of coil turns in the primary winding to the secondary winding. $C_{oss}$ represents the capacitance associated with primary switch 101, including the capacitance from the body diode. Vds represents the drain-source voltage across the primary switch.

Converter 100 includes a control circuit 150. Power supply 100 also includes a power switch 101 (also designated as $Q_L$) coupled to primary winding 141 and control circuit 150 for receiving a control signal to turn on and off power switch 101 to control the primary current through primary winding 141 in order to regulate output voltage $V_{OUT}$. In FIG. 1, power switch 101 is shown as a MOSFET power transistor. In the embodiment of FIG. 1, control circuit 150 can receive its operating power from $V_{cc}$ provided by the auxiliary winding. Control circuit 150 can also receive sensing signal DMEG from auxiliary winding 143. Control circuit 150 can also receive a current sense signal Vcs representative of the primary current through a current sense resistor 116 with a resistance Rcs. Control circuit 150 provides a control signal Drive to control power switch 101. Control circuit 150 turns on the power switch 101 based on information provided by the sensing signal DMEG and turns off the power 101 based on information provided by the current sense signal Vcs.

As shown in FIG. 1, converter 100 also has a modulation capacitor 130 (also designated as $C_{sn}$) and a modulation switch 131 (also designated as $Q_M$) coupled in parallel to power switch 101. In this arrangement, modulation switch 131 is coupled in series with capacitor 130. Control circuit 150 includes a valley detector 151 for detecting valley points in the resonant waveform in the sensing signal DMEG during the discontinuous time of converter 100. Control circuit 150 also includes a peak detector 152 for detecting peak points in the resonant waveform in the sensing signal during the discontinuous time. Control circuit 150 also includes a quasi-resonant (QR) controller 153 for turning on the power switch 101 at a valley point of a resonant waveform in the sensing signal during a discontinuous time. Control circuit 150 further includes a jitter controller 154 for turning on the modulation switch 131 at a peak point of the resonant waveform in the sensing signal during the discontinuous time. Control circuit 150 also includes an oscillator OSC 155, which provides a $T_{FMAX}$ signal to jitter controller 154. In addition to the $T_{FMAX}$ signal, jitter controller 154 also receives a Ppulse signal from peak detector 152, and provides a Mod_Off signal to QR controller 153. QR controller 153 also receives a Vpulse signal from valley detector 151. Control circuit 150 also includes a flipflop 156 that outputs the Drive signal.

As explained in detail below, the jitter controller 154 varies a turn-on time of the modulation switch 131 to add a frequency jitter to the switching frequency of the converter. The waveform of Vds is mirrored to the auxiliary winding and detected by a peak detector and a valley detector. The jitter controller determines the target peak count to turn on $Q_M$ and linearly modulates the on time of $Q_M$. After $Q_M$ is turned off, the QR controller is enabled by the jitter controller to wait for proper valley count and turn on $Q_L$ at the valley of Vds.

Figures 2A, 2B:
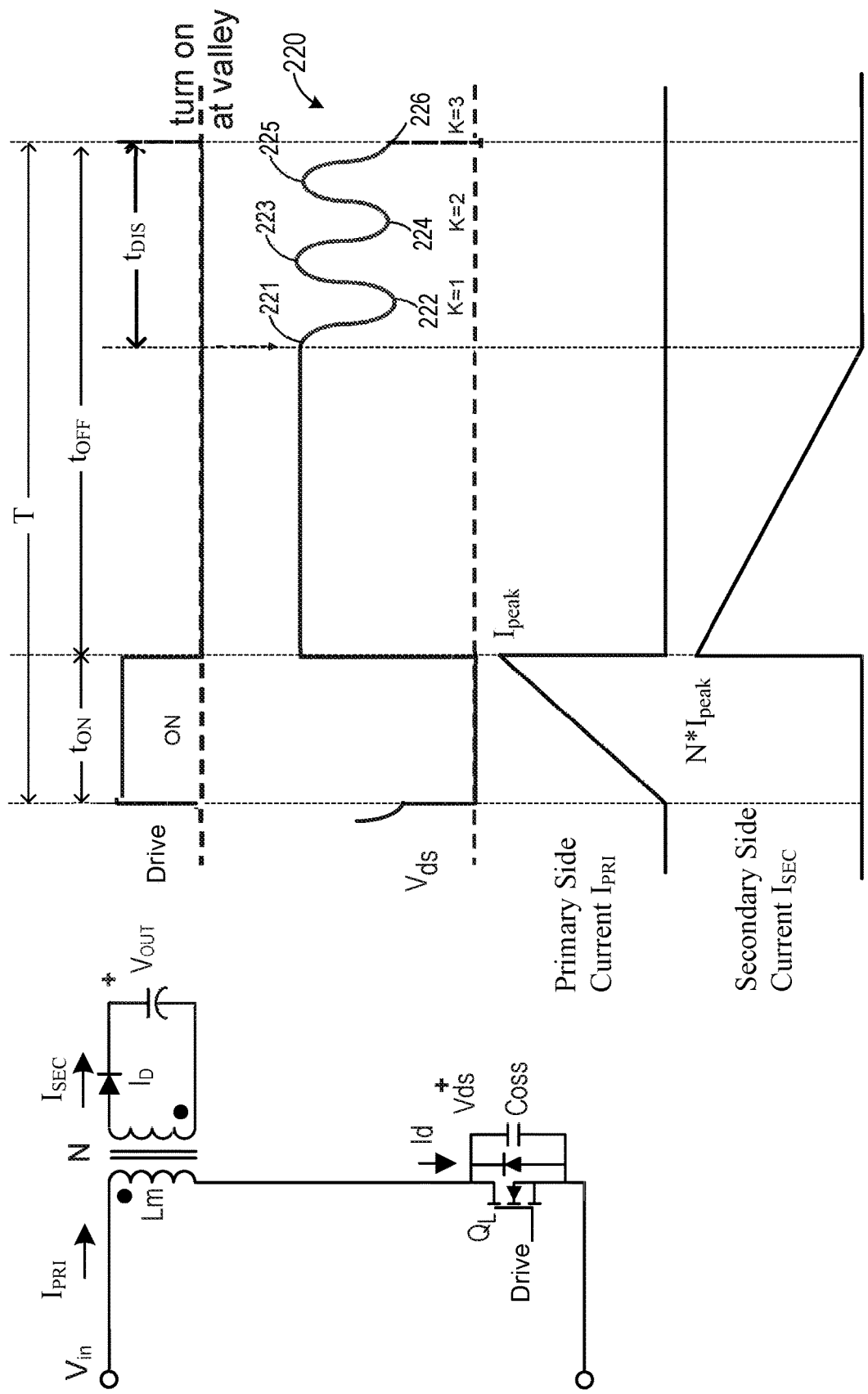
FIG. 2A is a simplified schematic diagram of part of flyback converter 100 of FIG. 1.
FIG. 2B shows waveform diagrams that illustrate a quasi-resonant operation of the converter that embodies certain aspects of this invention.

FIG. 2A is a simplified schematic diagram of part of flyback converter 100 of FIG. 1, and FIG. 2B shows waveform diagrams that illustrate a quasi-resonant operation of the converter that embodies certain aspects of this invention. In FIG. 2B, the following waveforms are shown over a switch cycle T of the converter. The first waveform "Drive" shows the control signal Drive applied to the primary switch 101. The second waveform "Vds" shows the drain-to-source voltage Vds of the primary switch, which can be reflected in the sensing signal DMEG of FIG. 1. The third waveform shows the primary current $I_{PRI}$ feeding into the primary side of the transformer. The fourth waveform shows the secondary current $I_{SEC}$ flowing out of the secondary side of the transformer. As can be seen in FIG. 2B, the primary switch is turned on during time period $t_{ON}$, and turned off during time period $t_{OFF}$. During time period $t_{ON}$, the primary current flows through the primary switch. The secondary current flows during a first portion of time period $t_{OFF}$. Time period $t_{DIS}$ is a discontinuous time, during which both the primary current and the secondary current are off. During discontinuous time $t_{DIS}$, a resonant waveform 220 exists in the waveforms of Vds, as well as DMEG. In the example of FIG. 2B, resonant waveform 220 is shown to have three peak points 221, 223, and 225 and three valley points 222, 224, and 226, marked by K=1, K=2, and K=3. In a quasi-resonant operation, the quasi-resonant controller 153 in FIG. 1 turns on the power switch at a valley point of a resonant waveform in the sensing signal during the discontinuous time. In FIG. 2B, the primary switch is turned on at the third valley point (K=3) of resonant waveform 220.

In a quasi-resonant operation, the turn-on condition "valley of resonant voltage" can improve power efficiency, but limits the switching frequency of the flyback system. According to FIG. 2, the equation of power delivery $P_{OUT}$ in one switching cycle of the converter is:

$$P_{OUT} = \frac{E_{Lm}}{T} = \frac{\frac{1}{2}L_m I_{peak}^2}{\frac{V_{IN}+NV_{OUT}}{L_m} \times I_{peak} + \left(K-\frac{1}{2}\right)T_{QR}}$$

$$T = \frac{V_{IN}+NV_{OUT}}{L_m} \times I_{peak} + \left(K-\frac{1}{2}\right)T_{QR}$$

where $E_{Lm}$ is the energy stored in Lm, K is the valley count, and $T_{QR}$ is an oscillation period of the resonant waveform. In one switching period T, the power convertor stores energy $E_{Lm}$ into Lm during $t_{ON}$ and delivers the $E_{Lm}$ to output during $t_{OFF}$. Thus, the average transferred power $P_{OUT}$ is equal to the $E_{Lm}$ over T. In the $P_{OUT}$ equation, the only variable that can be modulated is the peak current $I_{peak}$ because the valley count K should be a natural number. However, a power convertor should deliver $P_{OUT}$ equal to the load that application is required. The $I_{peak}$ has only one solution with a specific number K, and the switching period T is a constant value given by the couple of solution $I_{peak}$ and K. As a result, any disturbance of $I_{peak}$ for dithering switching period will be compensated by an external feedback loop and the switching frequency will converge to the given value which can fulfill the output load $P_{OUT}$.

The invention teaches a control circuit for a quasi-resonant (QR) converter. As shown in the converter 100 shown in FIGS. 1, 2A, and 2B, for quasi-resonant operation, control circuit 150 includes a quasi-resonant controller 153 for turning on a power switch 101 at a valley point 222, 224, or 226, etc., of a resonant waveform 220 in a sensing signal DMEG during a discontinuous time $t_{DIS}$ of the converter. The power switch is coupled to a primary winding 141 of the converter to control a primary switch, and the sensing signal DMEG monitoring the resonant waveform through an auxiliary winding 143. Control circuit 150 also includes a jitter controller 154 for adding a capacitance 130 in parallel to the power switch 101 at a peak point of the resonant waveform 220 in the sensing signal DMEG during the discontinuous time $t_{DIS}$. For example, the capacitance can be added at peak points such as peak points 221, 223, or 225, etc. By varying the length of time during which the capacitance is coupled, the jitter controller 154 can vary the oscillation period $T_{QR}$ of the resonant waveform to add a frequency jitter to the switching frequency of the converter.

Figure 3:
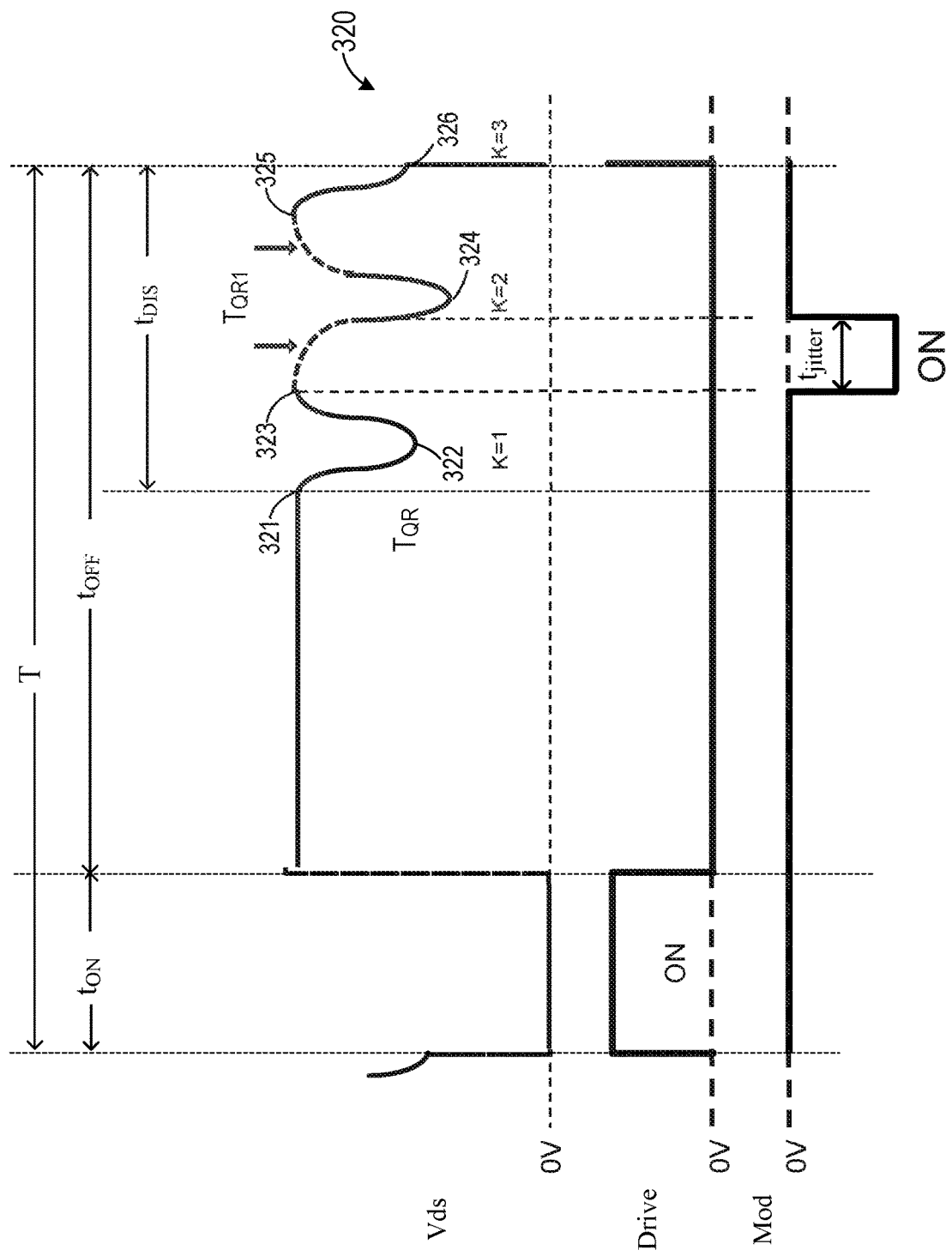
FIG. 3 is a waveform diagram that illustrates a jitter in a quasi-resonant operation of the converter that embodies certain aspects of this invention.

FIG. 3 is a waveform diagram that illustrates a jitter operation in a quasi-resonant operation of the converter that embodies certain aspects of this invention. In FIG. 3, the following waveforms are shown over a switch cycle T of the converter, with reference to FIGS. 1, 2A, and 2B. The top waveform Vds shows the drain-to-source voltage "Vds" of the primary switch. The middle waveform "Drive" shows the control signal Drive applied to the primary switch 101. The bottom waveform "Mod" shows the control signal Mod applied to the modulation switch 131. A resonant waveform 220 exists in the waveforms of Vds during the discontinuous time. In the example of FIG. 3, resonant waveform 320 is shown to have three peak points 321, 323, and 325, and three valley points 322, 324, and 326, marked by K=1, K=2, and K=3. In the quasi-resonant operation, the quasi-resonant controller 153 in FIG. 1 turns on the power switch 101 at a valley point 326 of the resonant waveform in the sensing signal during the discontinuous time. In FIG. 3, the primary switch is turned on at the third valley point 326 (K=3) of resonant waveform 320, at the end of the switching period T of the switching cycle.

In FIG. 3, the control signal Mod turns on the modulation switch 131 for a time period $t_{jitter}$. During the time period $t_{jitter}$, modulation switch 131 is on, and modulation capacitor 130 is connected in parallel with primary switch 101, causing a modulation capacitor $C_{sn}$ to be connected in parallel to the capacitance of the primary switch $C_{oss}$. Accordingly, during the time period $t_{jitter}$, the oscillation period for resonant waveform 320 is increased from $T_{QR}$ to $T_{QR1}$.

$$T_{QR}=2\pi\sqrt{L_m C_{oss}}$$

$$T_{QR1}=2\pi\sqrt{L_m(C_{oss}+C_{sn})}$$

where $L_m$ is the inductance of the primary winding, $C_{oss}$ is the capacitance associated with the primary switch, and $C_{sn}$ is the capacitance of the modulation capacitor. By varying the time period during which the modulation capacitor $C_{sn}$ is connected, the period T of the switching cycle of the converter is also changed.

In order to reduce the hard switching loss as turning on MOS transistors, the modulation switch $Q_M$ should be turned on at a peak point of Vds, and the primary switch $Q_L$ should be turned on at a valley point of Vds. To fulfill the turn on timings, peak and valley detectors sense the DMEG node and produce pulse signals $P_{Pulse}$ and $V_{Pulse}$ based on the peaks and valleys of Vds sinusoid oscillation.

Figure 4A:
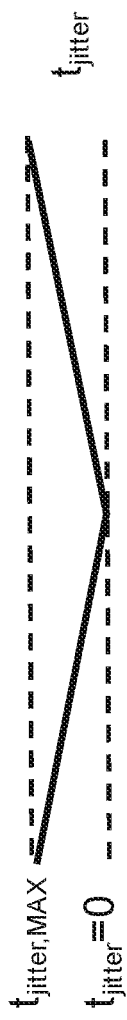
FIGS. 4A-4D illustrate an example of providing jitter to a converter that that embodies certain aspects of this invention.
Figure 4B:
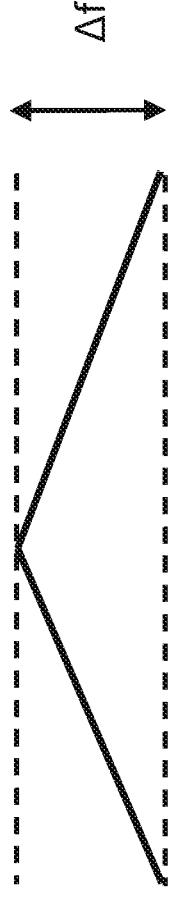
Figure 4C:
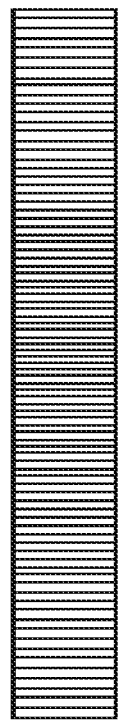
Figure 4D:
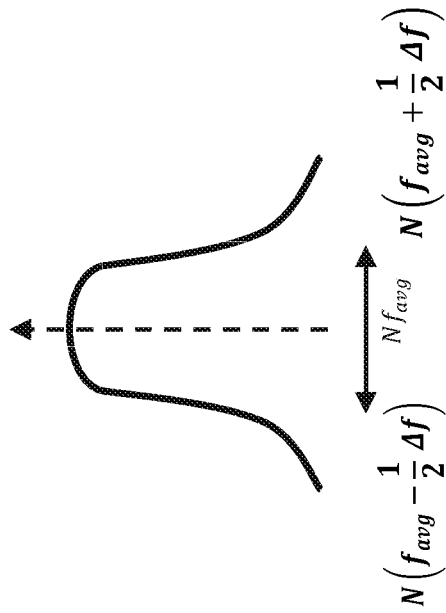

In order to introduce jitter into the switching cycle, the turn-on time $t_{jitter}$ for modulation switch 131 is varied over time. FIGS. 4A-4D illustrate an example of varying the turn-on time $t_{jitter}$ that embodies certain aspects of this invention. FIG. 4A shows that the time period $t_{jitter}$, the modulation switch on-time, is varied in a linear manner between a minimum of 0 and a maximum of $t_{jitterMax}$. FIG. 4B shows a corresponding switch frequency variation over a range of $\Delta f$. FIG. 4C shows a corresponding variation in the switch frequency waveform. FIG. 4D shows a spectrum plot of the Nth harmonic of the switch frequency waveform, with a center frequency of $Nf_{avg}$. Even though the example in FIGS. 4A-4D illustrates a linear function for the jitter frequency, other time-varying functions can also be used.

The maximum range of the frequency spectrum is dependent on the valley count of the primary switch turn on and the value of modulation capacitor $C_{sn}$. If the modulation switch $Q_M$ turn-on signal is applied on the same valley count as the primary switch turn on, the dithering range of the total switching period will be only a half cycle of mixed LC resonant and can be expressed as follows.

$$\frac{1}{2}(T_{QR1} - T_{QR}).$$

$$\Delta T \le \frac{1}{2}(T_{QR1} - T_{QR}) = \pi\sqrt{L_m C_{OSS}}\left(\sqrt{1 + \frac{C_{sn}}{C_{OSS}}} - 1\right) \text{ for } K_{jitter} = K_{QR}.$$

Figure 5A:
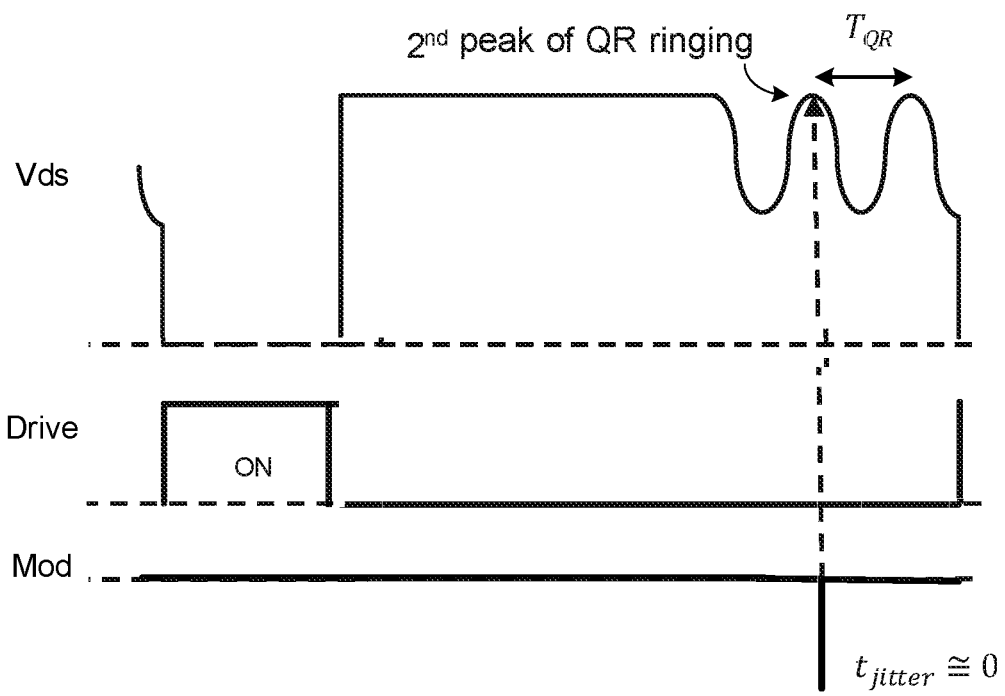
FIG. 5A illustrates the waveforms for the QR converter in which the jitter time $t_{jitter}$ is near zero, and the oscillation period for a resonant waveform is $T_{QR}$, as described above.
Figure 5B:
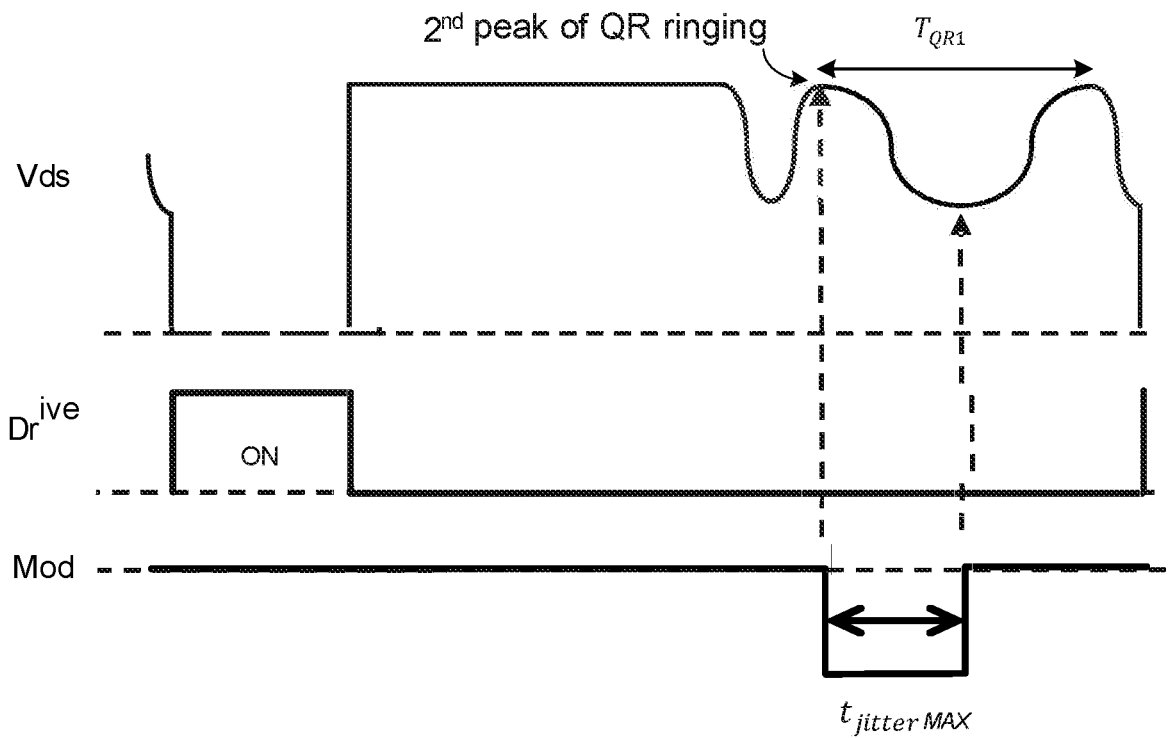
FIG. 5B illustrates the waveforms for the QR converter in which the jitter time $t_{jitter}$ is at the maximum, $t_{jitterMax}$, and the oscillation period for a resonant waveform is $T_{QR1}$, as described above.

FIGS. 5A and 5B illustrate the waveforms for the QR converter in which the jitter causes the oscillation period for the resonant waveform to vary. FIG. 5A illustrates the waveforms for the QR converter in which the jitter time $t_{jitter}$ is nearly zero, and the oscillation period for resonant waveform is $T_{QR}$, as described above. FIG. 5B illustrates the waveforms for the QR converter in which the jitter time $t_{jitter}$ is at the maximum, $t_{jitterMax}$, and the oscillation period for resonant waveform is $T_{QR1}$, as described above.

FIGS. 6-10 are schematic or waveform diagrams illustrating the structures and functions of various components in the control circuit in a converter that embody certain aspects of this invention.

Figure 6:
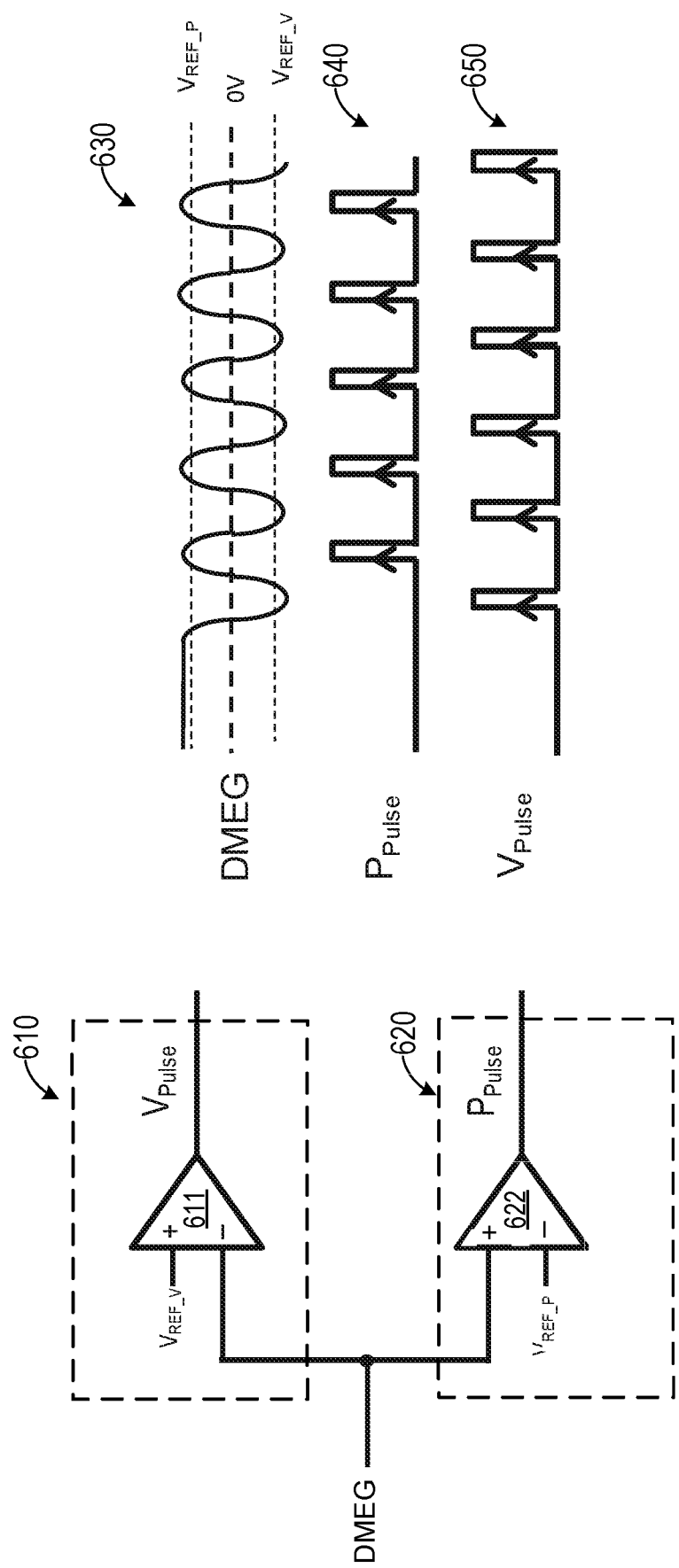

FIG. 6 shows schematic and waveform diagrams illustrating the structures and functions of a valley detector and a peak detector in the control circuit in a converter that embodies certain aspects of this invention. In FIG. 6, a valley detector 610 includes a first comparator 611 for comparing a sensing signal DMEG and a valley reference voltage Vref_V. A peak detector 620 includes a second comparator 622 for comparing a sensing signal DMEG and a peak reference voltage Vref_P. Waveform 630 illustrates the sensing signal DMEG, with the valley reference voltage Vref_V and peak reference voltage Vref_P. Waveform 640 illustrates the output waveform of the second comparator 622, showing a pulse signal $P_{Pulse}$ where the sensing signal DMEG is greater than peak reference voltage Vref_P. Waveform 650 illustrates the output waveform of the first comparator 611, showing a pulse signal $V_{Pulse}$ where the sensing signal DMEG is less than valley reference voltage Vref_V.

Figure 7A:
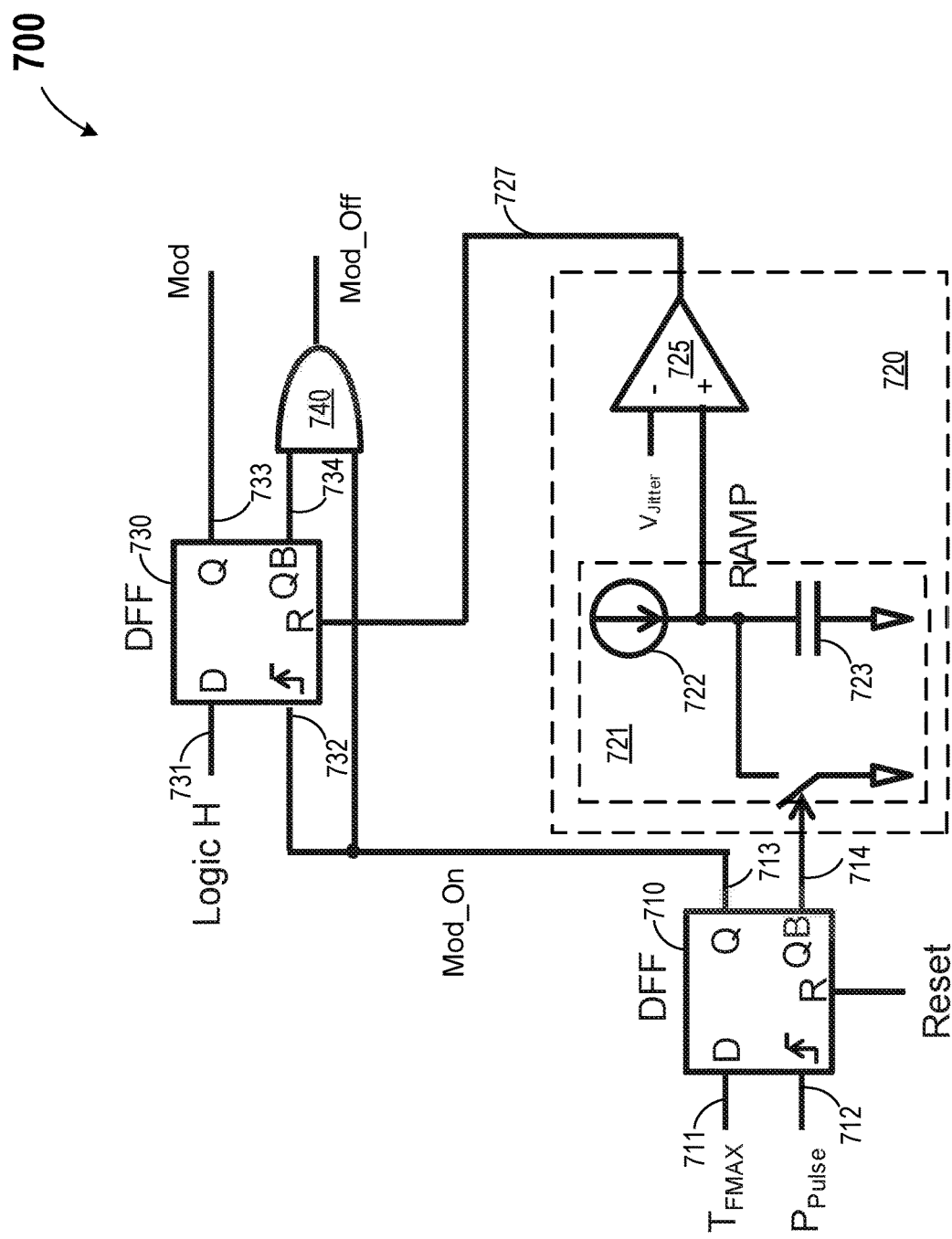
FIG. 7A is a simplified schematic diagram illustrating a jitter controller.
Figure 7B:
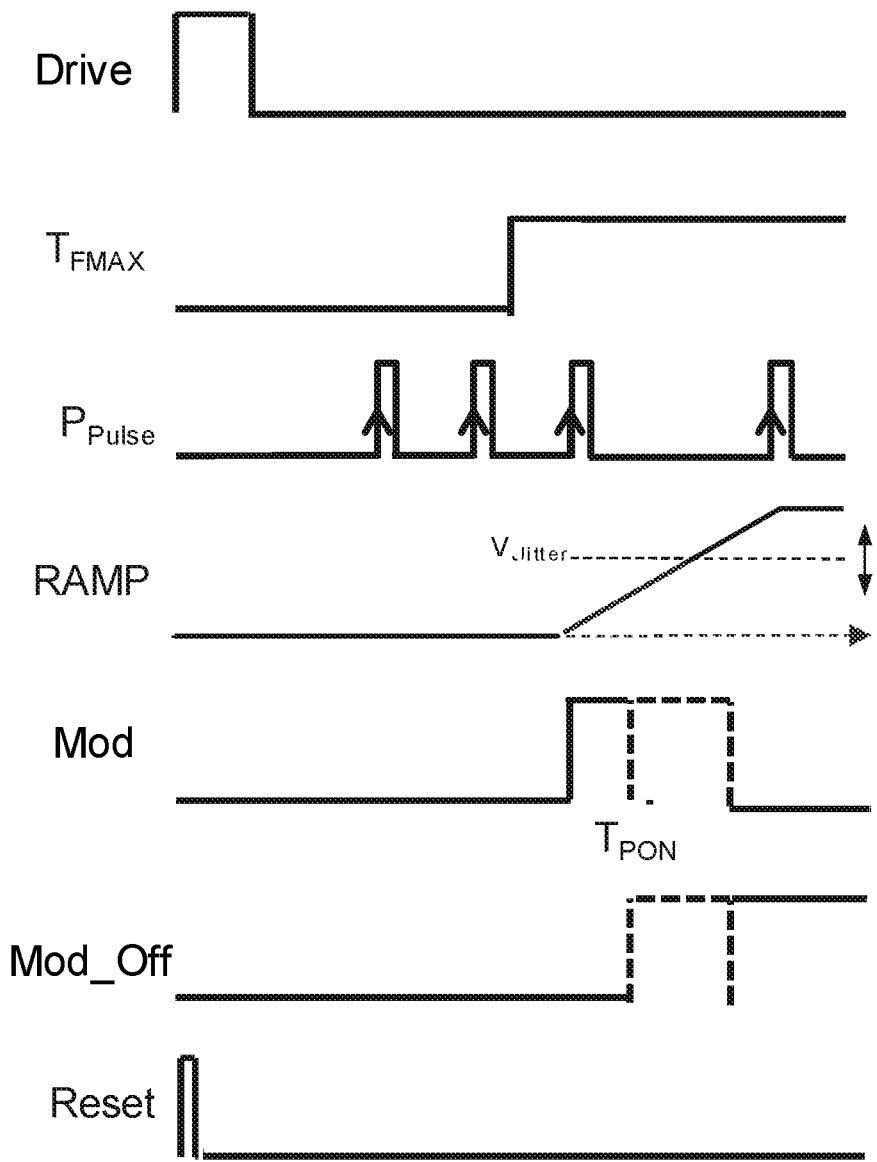
FIG. 7B illustrates a waveform diagram that describes the operation of the jitter controller that embodies certain aspects of this invention.

FIG. 7A is a simplified schematic diagram illustrating a jitter controller, and FIG. 7B illustrates a waveform diagram that describes the operation of the jitter controller that embodies certain aspects of this invention. As shown in FIGS. 7A and 7B, jitter controller 700 is an example of a jitter controller that can be used as jitter controller 154 in converter 100 in FIG. 1. Jitter controller 700 includes two D flipflops. A first D flipflop 710 has a first input terminal 711 for receiving a blanking time signal $T_{FMAX}$, a second input terminal 712 for receiving the peak pulse signal $P_{Pulse}$, a first output terminal 713 for providing a modulation-on signal Mod_On, and a second output terminal 714 for providing a complement of the modulation on signal. Jitter controller 700 also includes a jitter duration circuit 720 having a ramp signal circuit 721 with a current source 722 and capacitor 723 that starts charging the capacitor upon receiving the complement of the modulation on signal, from the second output terminal 714 of the first D flipflop 710, to produce a ramp signal RAMP. Jitter duration circuit 720 also has a comparator 725 for comparing the ramp signal RAMP and a jitter reference voltage $V_{jitter}$ and providing a jitter stop signal 727. A second D flipflop 730 has a first input terminal 731 for receiving logic high signal Logic H, a second input terminal 732 for receiving the modulation on signal Mod_On from the first D flipflop 710, a reset terminal 735 for receiving the jitter stop signal 727, a first output terminal 733 for providing a modulation switch turn-on signal Mod, and a second output terminal 734 for providing a complement of the modulation switch turn-on signal. Jitter controller 700 also has an AND circuit 740 for receiving the modulation on signal Mod_On and the complement of the modulation switch turn-on signal Mod and providing a modulation switch turn-off signal Mod_Off. In FIG. 7B, TPON illustrates the on-time of the modulation switch.

Figure 8A:
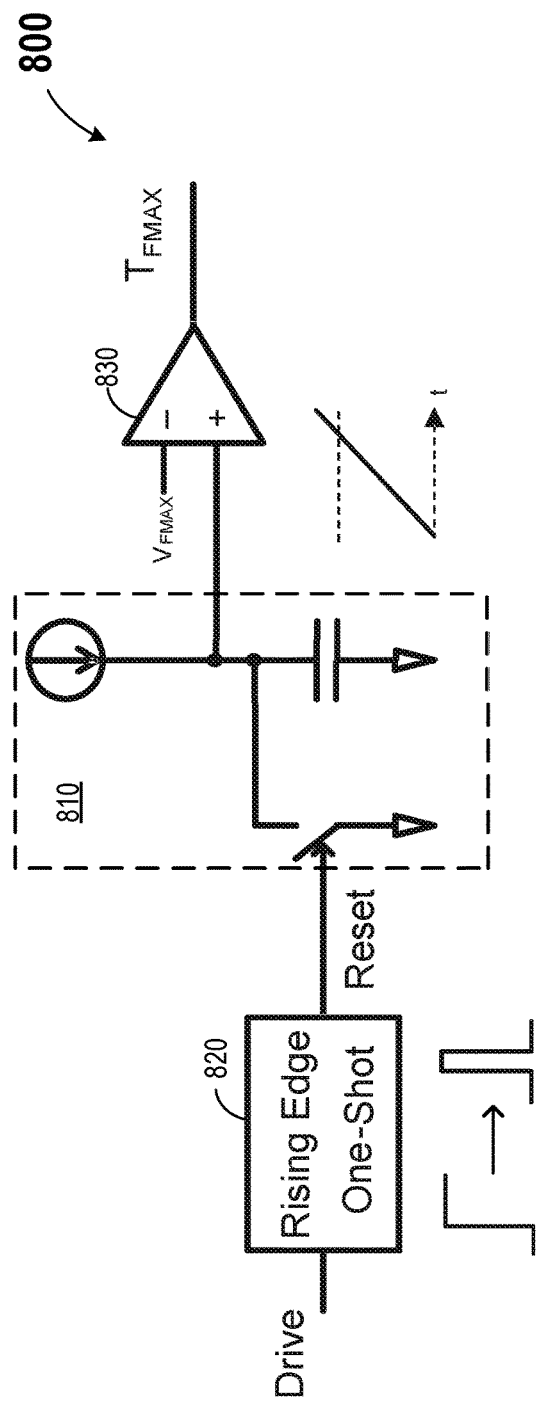
FIG. 8A is a simplified schematic diagram illustrating a blanking time generation circuit.
Figure 8B:
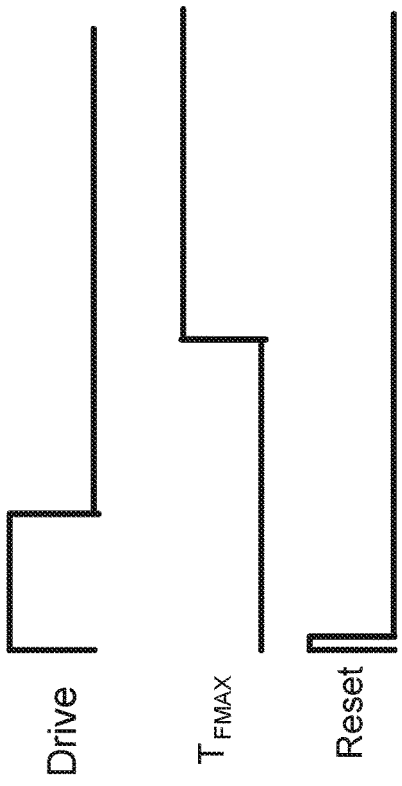
FIG. 8B illustrates a waveform diagram that describes the operation of the blanking time generation circuit that embodies certain aspects of this invention.

FIG. 8A is a simplified schematic diagram illustrating a blanking time generation circuit, and FIG. 8B illustrates a waveform diagram that describes the operation of a blanking time generation circuit that embodies certain aspects of this invention. Similar to jitter duration circuit 720 in jitter controller 700, blanking time generation circuit 800 includes a ramp signal circuit 810 with a current source and capacitor that starts charging the capacitor upon receiving a Reset signal to produce a ramp signal. As shown in FIG. 8A, the Reset signal is a pulse signal produced by a rising edge one-shot circuit 820 at the rising edge of the primary switch $Q_L$ turn-on signal. Blanking time generation circuit 800 also has a comparator 830 for comparing the ramp signal and a reference voltage $V_{FMAX}$ and providing blanking time signal $T_{FMAX}$. FIG. 8B shows the waveforms for the primary switch control signal Drive, blanking time signal $T_{FMAX}$, and the Reset signal. Blanking time signal $T_{FMAX}$ can be used to select the on-set of the modulation switch turn-on signal, as described above in connection with FIGS. 7A and 7B. It also limits the lower bound of the switching period.

Figure 9:
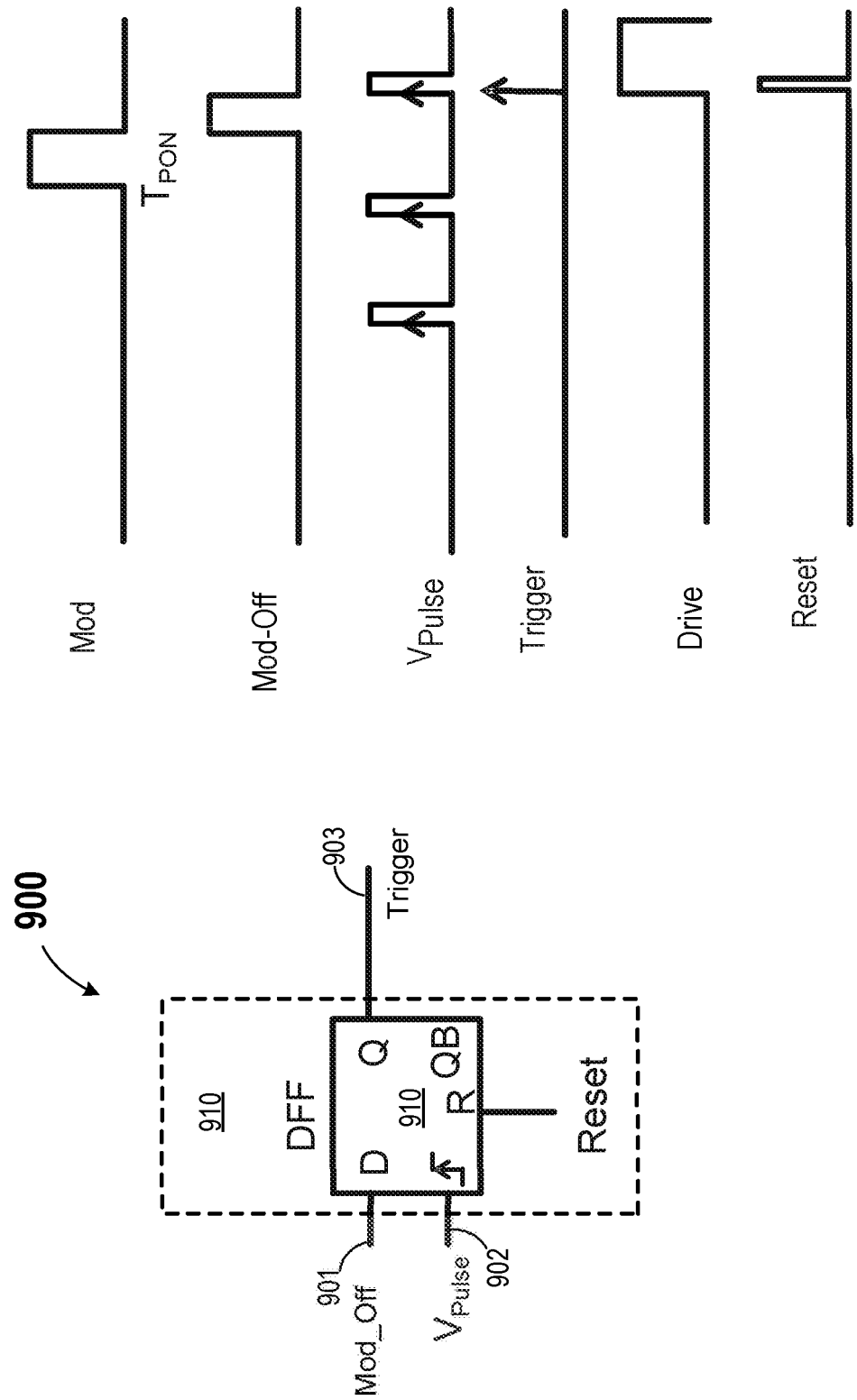
Figure 10:
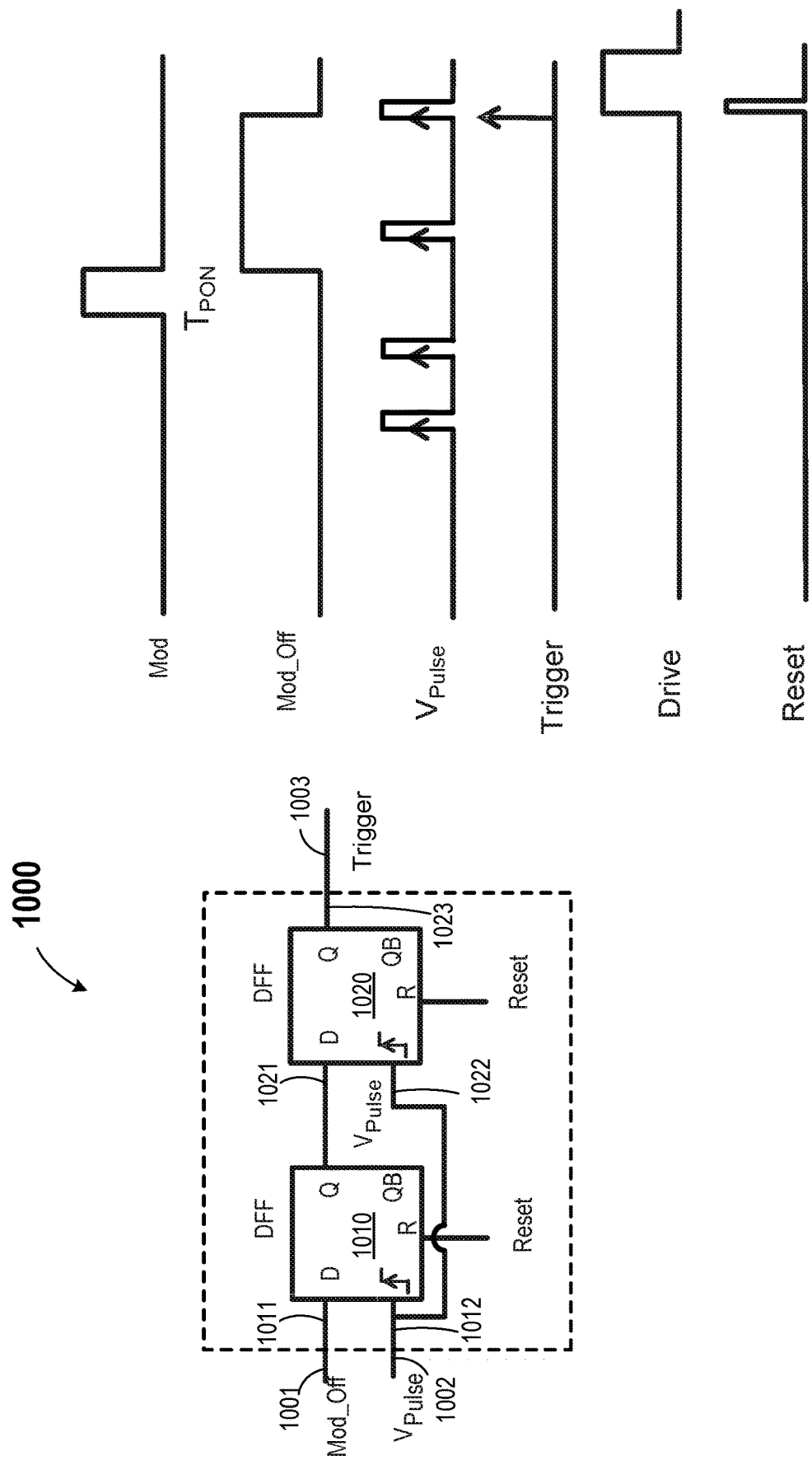

FIG. 9 is a simplified schematic diagram illustrating a first example of a quasi-resonant controller that embodies certain aspects of this invention. FIG. 10 is a simplified schematic diagram illustrating a second example of a quasi-resonant controller that embodies certain aspects of this invention. As shown in FIGS. 9 and 10, quasi-resonant controllers 900 and 1000 are examples of quasi-resonant controllers that can be used as quasi-resonant controller 153 in converter 100 in FIG. 1. As shown in FIG. 9, quasi-resonant controller 900 has a first input terminal 901 for receiving the modulation switch turn-off signal, a second input terminal 902 for receiving the valley pulse signal $V_{Pulse}$, and an output terminal 903 for providing a primary switch turn on signal Trigger. Similarly, as shown in FIG. 10, quasi-resonant controller 1000 has a first input terminal 1001 for receiving the modulation switch turn-off signal, a second input terminal 1002 for receiving the valley pulse signal $V_{Pulse}$, and an output terminal 1003 for providing a primary switch turn on signal Trigger. Both quasi-resonant controller 900 and quasi-resonant controller 1000 provide a primary switch turn-on signal at a valley point of the resonant waveform in the discontinuous time.

As shown in FIG. 9, quasi-resonant controller 900 has a D flipflop 910 that includes a first input terminal 901 for receiving the modulation switch off signal Mod_Off, a second input terminal 902 for receiving the valley pulse signal $V_{Pulse}$, and an output terminal 903 for providing the primary switch turn on signal Trigger. Waveform Mod illustrates the modulation switch turn-on signal. Waveform Mod_Off indicates that the modulation switch is turned off after the modulation switch has been on for a duration determined by the jitter control circuit. Waveform $V_{Pulse}$ shows the valley pulse signals. D flipflop 910 produces the trigger signal Trigger at the rising edge of the first valley pulse signal $V_{Pulse}$ after the modulation switch is turned off. The primary switch control signal Drive is provided by control circuit 150 in FIG. 1 in response to the Trigger signal. The turning on of primary switch indicates the beginning of a new switching cycle, and the D flipflop 910 receives a global signal Reset to standby for the new cycle.

As shown in FIG. 10, quasi-resonant controller 1000 has two D flipflops connected in series. A first D flipflop 1010 includes a first input terminal 1011 for receiving the modulation switch off signal Mod_Off, and a second input terminal 1012 for receiving the valley pulse signal $V_{Pulse}$. A second D flipflop 1020 has a first input terminal 1021 for receiving an output signal from the first D flipflop 1010, and a second input terminal 1022 for receiving the valley pulse signal. The second D flipflop 1020 also has an output terminal 1023 for providing the primary switch trigger signal Trigger. FIG. 10 also shows waveforms that illustrate the same signals as those shown in FIG. 9. A difference between quasi-resonant controller 1000 and quasi-resonant controller 900 is that quasi-resonant controller 1000 includes two D flipflops, whereas quasi-resonant controller 900 has only one D flipflop. As a result, in quasi-resonant controller 1000, the primary switch is turned on at the second valley point after the modulation switch is turned off. The quasi-resonant controller 1000 makes the valley count different from the jitter peak count and the system switching frequency has a wider jitter range.

As described above, quasi-resonant controller 900 has one D flipflop, and quasi-resonant controller 1000 has two D flipflops connected in series. More generally, each quasi-resonant controller can have a flipflop chain having one D flipflop or two or more serially-connected D flipflops. A first one of the one or more D flipflops has a first input terminal for receiving the modulation switch off signal and a second input terminal for receiving the valley pulse signal. A last one of the one or more D flipflops has an output terminal for providing the primary switch trigger signal. Each D flipflop other than the first one of the one or more D flipflops has a first input terminal for receiving an output signal from a preceding D flipflop and a second input terminal for receiving the valley pulse signal. Even though the above examples include D flipflops, it is understood that similar functions can be implemented using other flip-flops or latches that have two stable states and can be used to store state information.

Figure 11A:
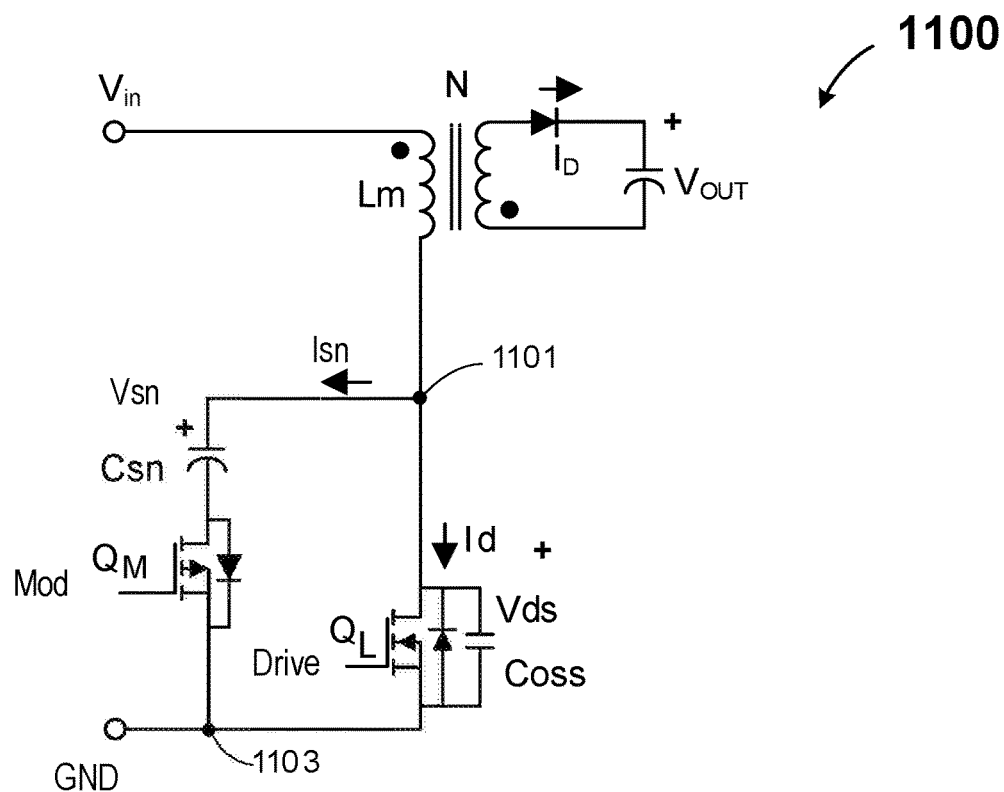
FIG. 11A is a simplified schematic diagram illustrating a quasi-resonant (QR) converter with jitter that embodies certain aspects of this invention.
Figure 11B:
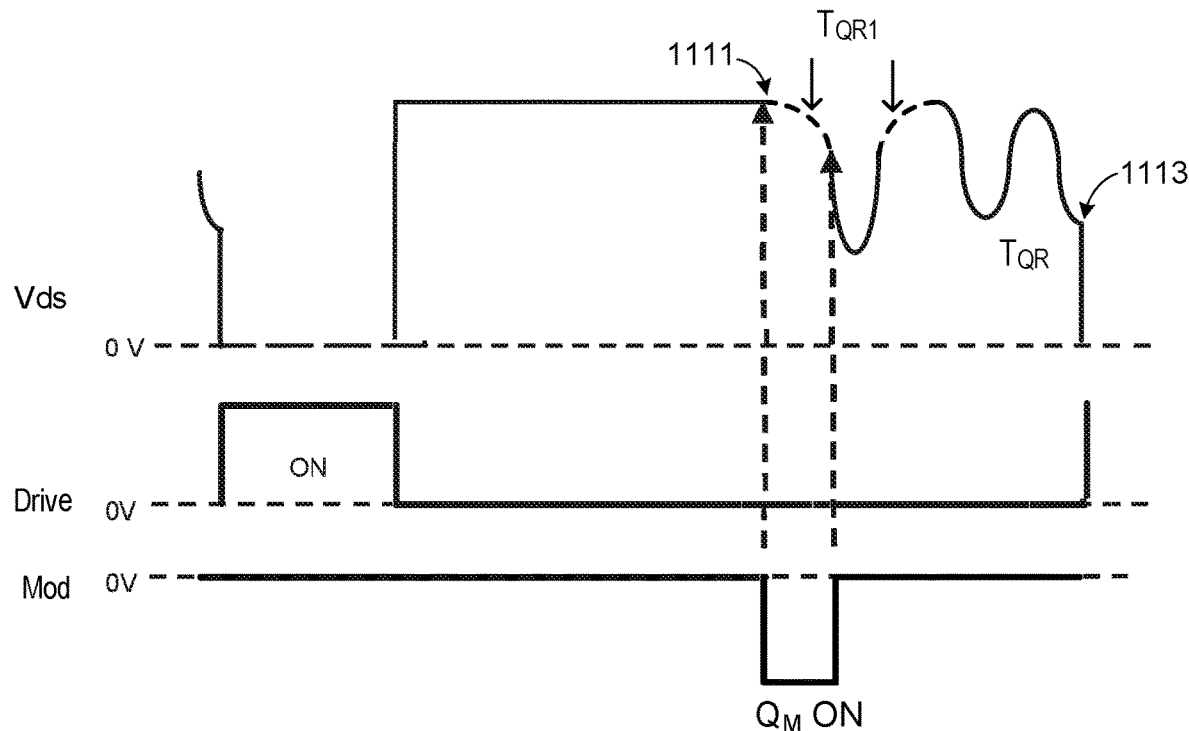
FIG. 11B is a waveform diagram illustrating the operation of the quasi-resonant (QR) converter with jitter of FIG. 11B that embodies certain aspects of this invention.

FIG. 11A is a simplified schematic diagram illustrating a quasi-resonant (QR) converter with jitter that embodies certain aspects of this invention. FIG. 11B is a waveform diagram illustrating the operation of the quasi-resonant (QR) converter with the jitter of FIG. 11B that embodies certain aspects of this invention. FIG. 11A shows part of quasi-resonant (QR) converter 1100, which is similar to quasi-resonant (QR) converter 100 of FIG. 1, that illustrates that the modulation capacitor and the modulation switch are coupled with the primary switch in parallel between an input node of the power switch and a ground terminal. In this case, the power switch $Q_L$ is an NMOS transistor and node 1101 is a drain node of the power switch. The modulation switch $Q_M$ is a PMOS transistor, which has a source node 1103 coupled to the ground node GND. In this case, the modulation switch $Q_M$ is also referred to as a low-side PMOS. FIG. 11B shows that the modulation switch is turned on at the first peak 1111 of the resonant waveform in the discontinuous time, and the primary switch is turned on at the third valley 1113 of the resonant waveform in the discontinuous time. As described above, during the time when the modulation switch is turned on, the modulation capacitor is connected, and the oscillation period of the resonant waveform is $T_{QR1}$. When the modulation switch is turned off, the modulation capacitor is disconnected, and the oscillation period of the resonant waveform is $T_{QR}$. Accordingly, with a time-varying duration of $T_{QR1}$, a jitter is added to the quasi-resonant converter.

Figure 12A:
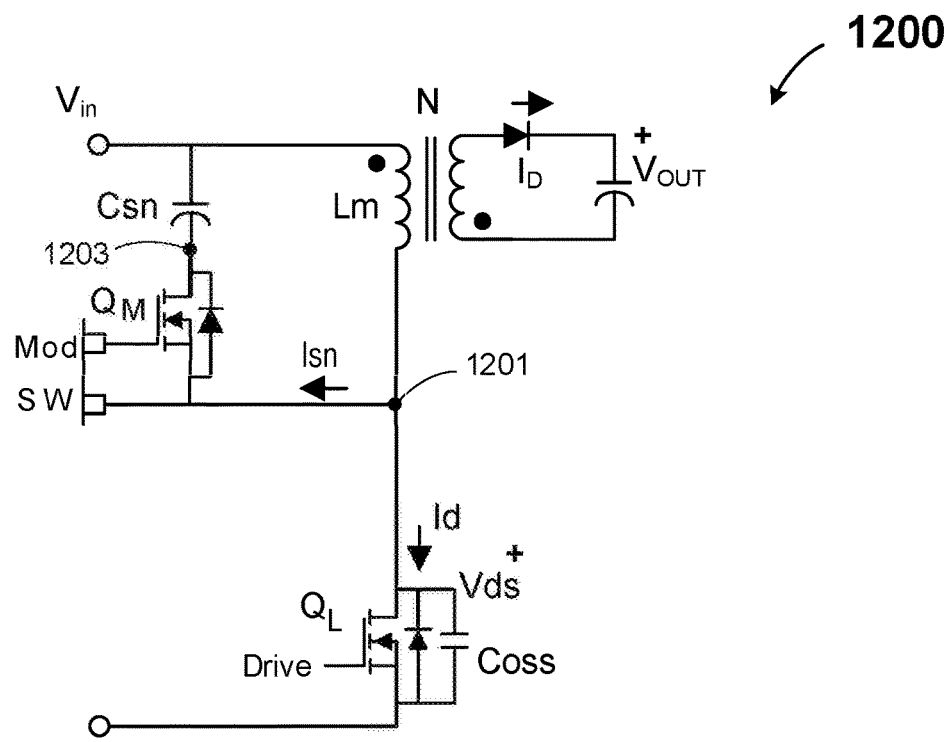
FIG. 12A is a simplified schematic diagram illustrating a quasi-resonant (QR) converter with jitter that embodies certain aspects of this invention.
Figure 12B:
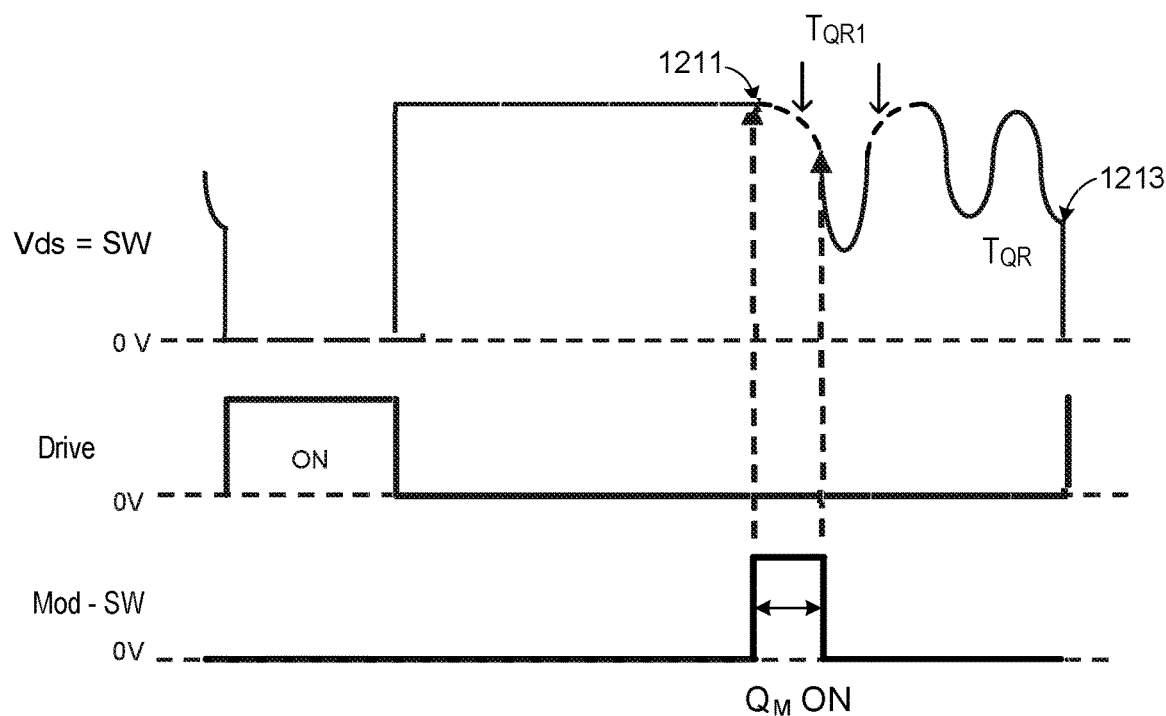
FIG. 12B is a waveform diagram illustrating the operation of the quasi-resonant (QR) converter with jitter of FIG. 12A that embodies certain aspects of this invention.

FIG. 12A is a simplified schematic diagram illustrating a quasi-resonant (QR) converter with jitter that embodies certain aspects of this invention. FIG. 12B is a waveform diagram illustrating the operation of the quasi-resonant (QR) converter with the jitter of FIG. 12A that embodies certain aspects of this invention. FIG. 12A shows part of quasi-resonant (QR) converter 1200, which is similar to quasi-resonant (QR) converter 100 of FIG. 1, except that the modulation capacitor and the modulation switch are coupled with the primary switch in parallel between an input node of the power switch and a power terminal. In this case, the power switch $Q_L$ is an NMOS transistor and node 1201 is a drain node of the power switch. The modulation switch $Q_M$ is an NMOS transistor, which has a drain node 1203 coupled to a power node in series with the modulation capacitor, in this case, $V_{in}$. In this case, the modulation switch $Q_M$ is also referred to as a high-side NMOS. The NMOS $Q_M$ needs a bootstrap driving circuit to provide a control signal for the swinging source voltage. Node SW provides a reference ground for the control signal.

The operation of quasi-resonant (QR) converter 1200 in FIG. 12B is similar to the operation of quasi-resonant (QR) converter 1100 in FIG. 11B. As shown in FIG. 12B, the modulation switch is turned on at the first peak 1211 of the resonant waveform in the discontinuous time, and the primary switch is turned on at the third valley 1213 of the resonant waveform in the discontinuous time. Similar to above, during the time when the modulation switch is turned on, the oscillation period of the resonant waveform is $T_{QR1}$. When the modulation switch is turned off, the oscillation period of the resonant waveform is $T_{QR}$. Accordingly, a jitter is added to the quasi-resonant converter.

Figure 13:
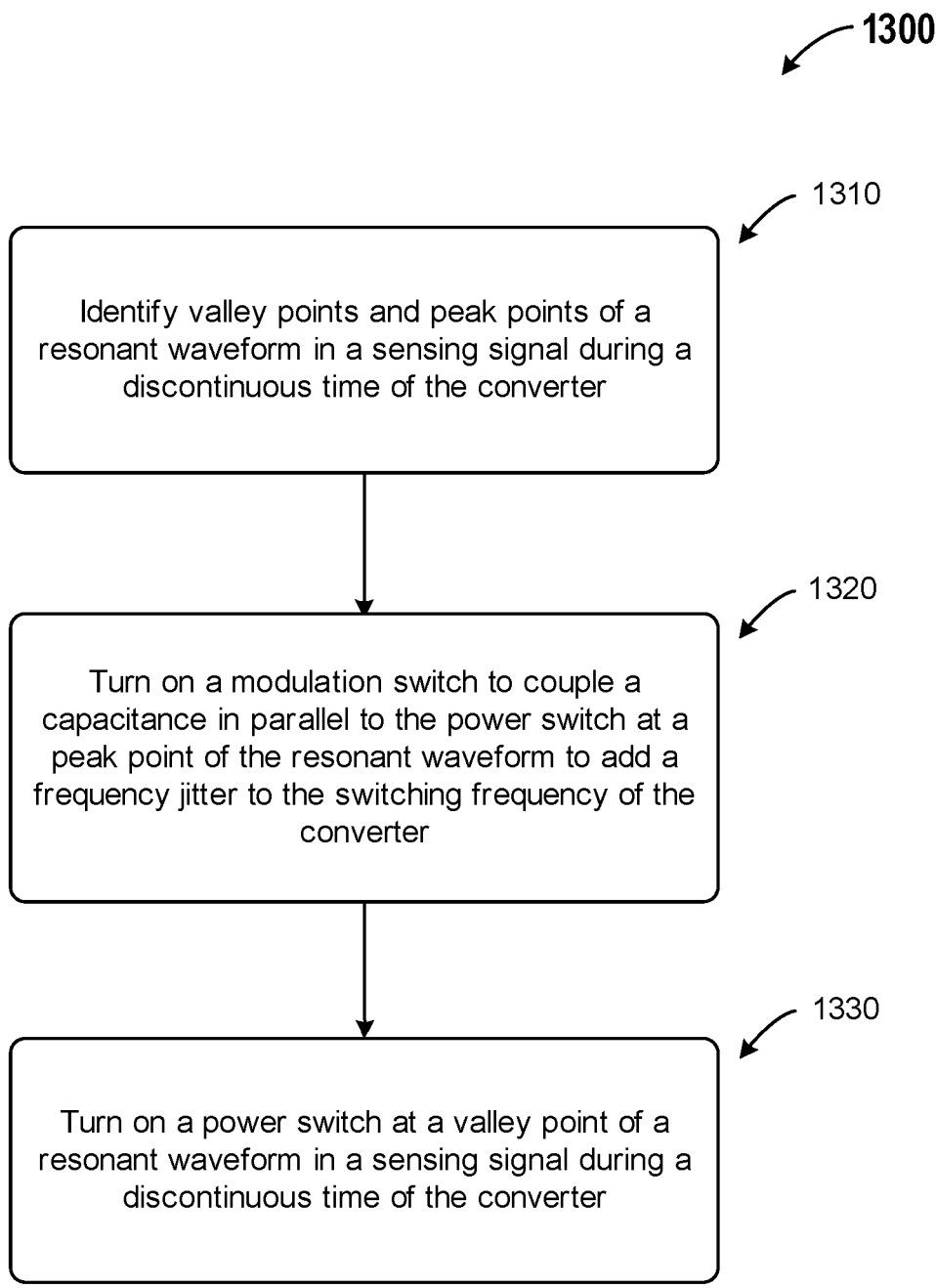
FIG. 13 is a simplified flowchart that illustrates a method for controlling a quasi-resonant (QR) converter that embodies certain aspects of this invention.

FIG. 13 is a simplified flowchart that illustrates a method for controlling a quasi-resonant (QR) converter that embodies certain aspects of this invention. As shown in FIG. 13, method 1300 includes, at 1310, identifying valley points and peak points of a resonant waveform in a sensing signal during a discontinuous time of the converter. Method 1300 also includes, at 1320, turning on a modulation switch to add a capacitance in parallel to the power switch at a peak point of the resonant waveform in the sensing signal during the discontinuous time, to vary an oscillation period of the resonant waveform to add a frequency jitter to a switching frequency of the converter. Method 1300 also includes, at 1330, turning on a power switch at a valley point of a resonant waveform in a sensing signal after the modulation switch has been turned off. The power switch is coupled to a primary winding of the converter to control a primary current flow, and the sensing signal is representative of the resonant waveform.

In method 1300, adding a capacitance in parallel to the power switch can include turning on a modulation switch that is coupled in series with a modulation capacitor. Method 1300 also includes turning on the modulation switch at a first peak point in the resonant waveform after a blanking time, and turning off the modulation switch after a time period based on a time-varying function to vary a turn-on time of the modulation switch. The method can also include turning on the power switch at a valley point of the resonant waveform after a preset off time of the modulation switch.

Figure 14:
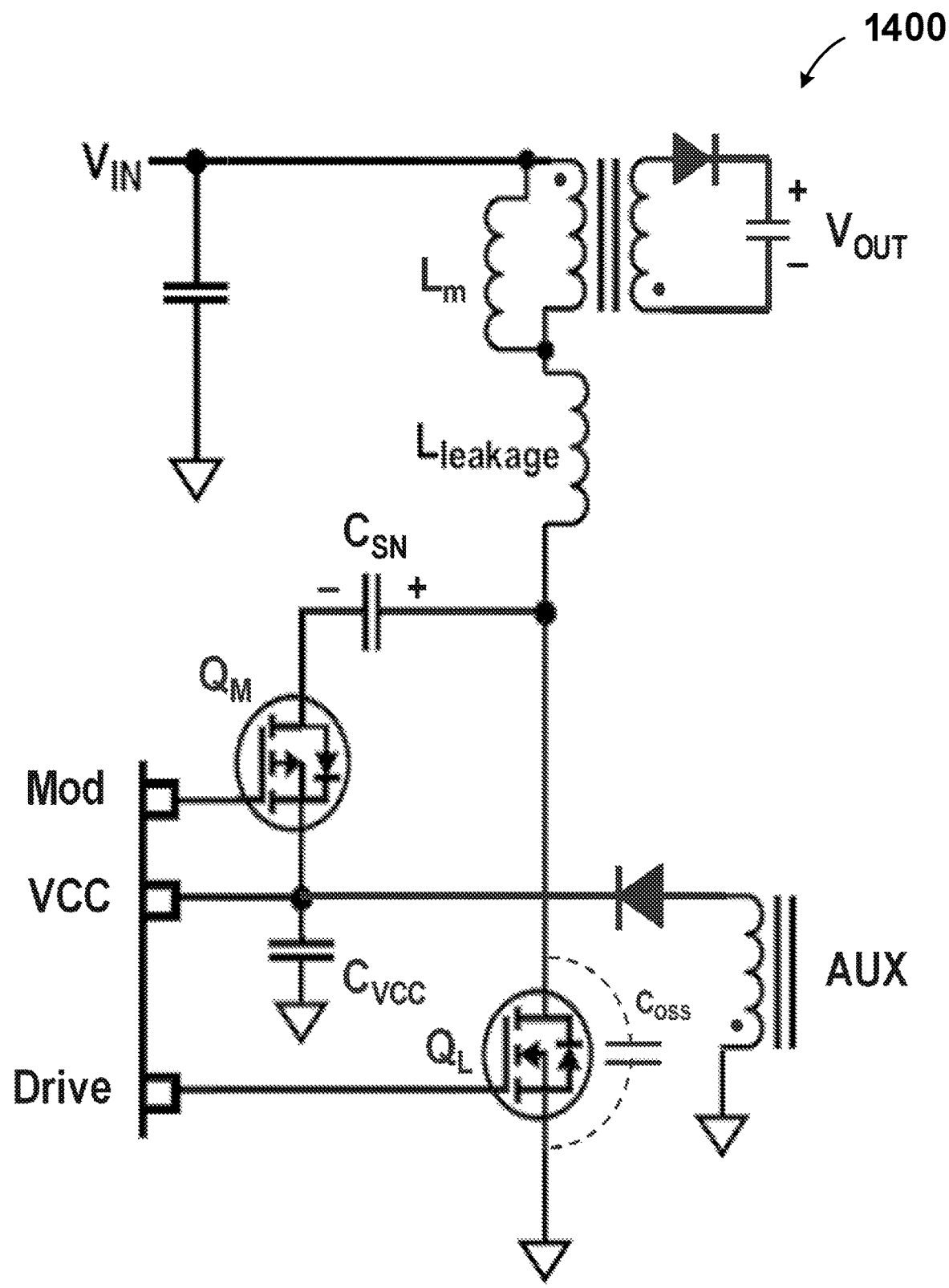
FIG. 14 is a simplified schematic diagram illustrating a power converter with jitter that embodies certain aspects of this invention.

FIG. 14 is a simplified schematic diagram illustrating a power converter with jitter that embodies certain aspects of this invention. FIG. 14 shows part of a power converter 1400, which is similar to flyback converter 100 of FIG. 1, including the inductance $L_m$ of the primary winding and auxiliary winding AUX providing VCC. In this example, a modulation capacitor $C_{SN}$ is shunted with parasitic capacitor $C_{OSS}$ to change the resonant period and modulation switch $Q_M$ is in series with $C_{SN}$ to control the shunted time $t_{jitter}$.

Figure 15:
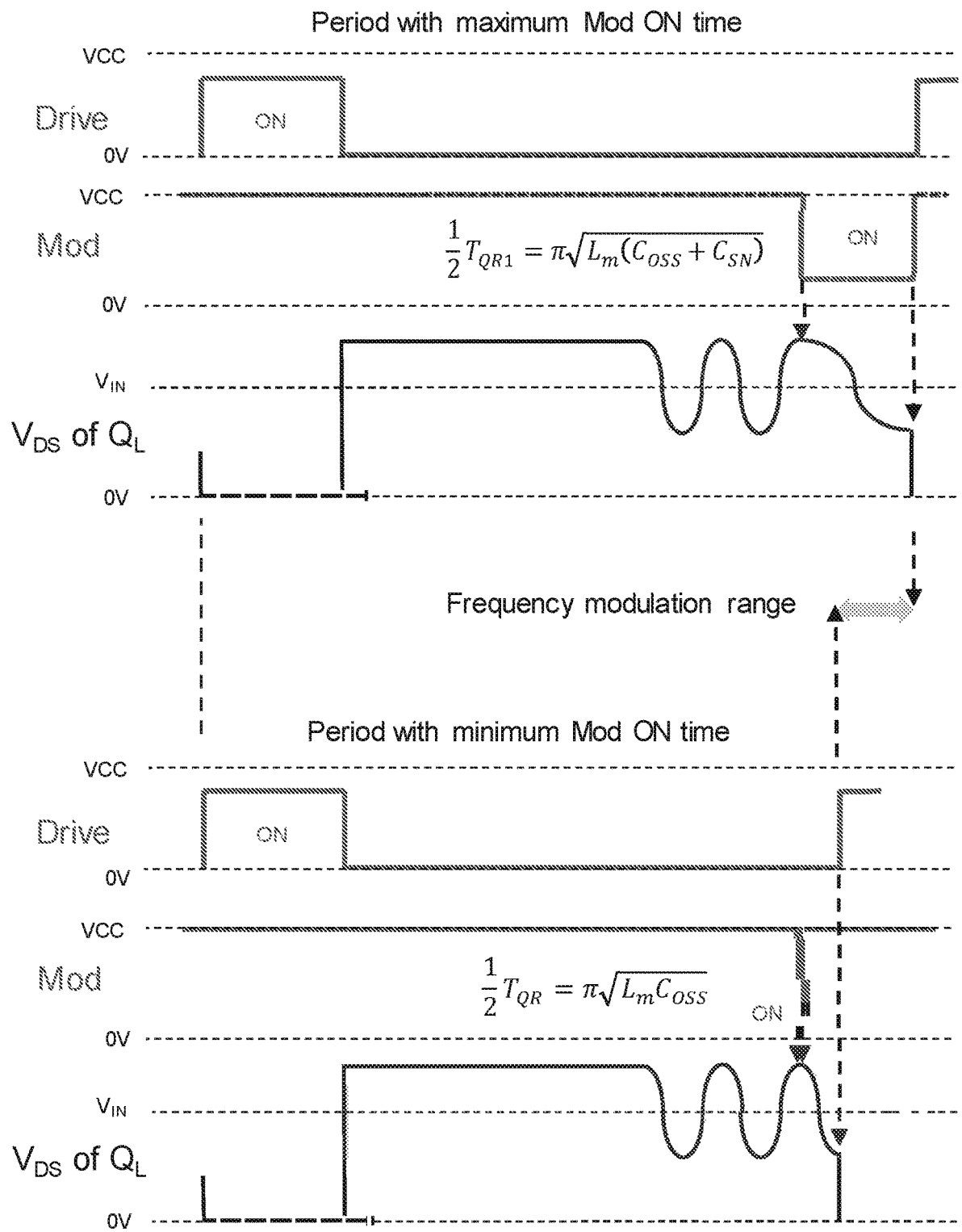
FIG. 15 illustrates the waveforms for the power converter of FIG. 14 that embodies certain aspects of this invention.

FIG. 15 illustrates the waveforms for the power converter of FIG. 14 that embodies certain aspects of this invention. FIG. 15 plots the Drive signal that turns on the power switch $Q_L$, the Mod signal that turns on the modulation switch $Q_M$, and the drain-source voltage $V_{DS}$ of the power switch $Q_L$. As shown in FIG. 15, the switching period of the flyback system can be varied by different $t_{jitter}$ which changes the quasi-resonant oscillation period from $T_{QR}$ to $T_{QR1}$, where, as described above in connection with FIGS. 5A and 5B, $T_{QR}=2\pi\sqrt{L_mC_{oss}}$ is the oscillation period of resonant waveform with modulation switch $Q_M$ turned off, and $T_{QR1}=2\pi\sqrt{L_m(L_{OSS}+C_{sn})}$ is the oscillation period of resonant waveform with modulation switch $Q_M$ turned on.

Figure 16:
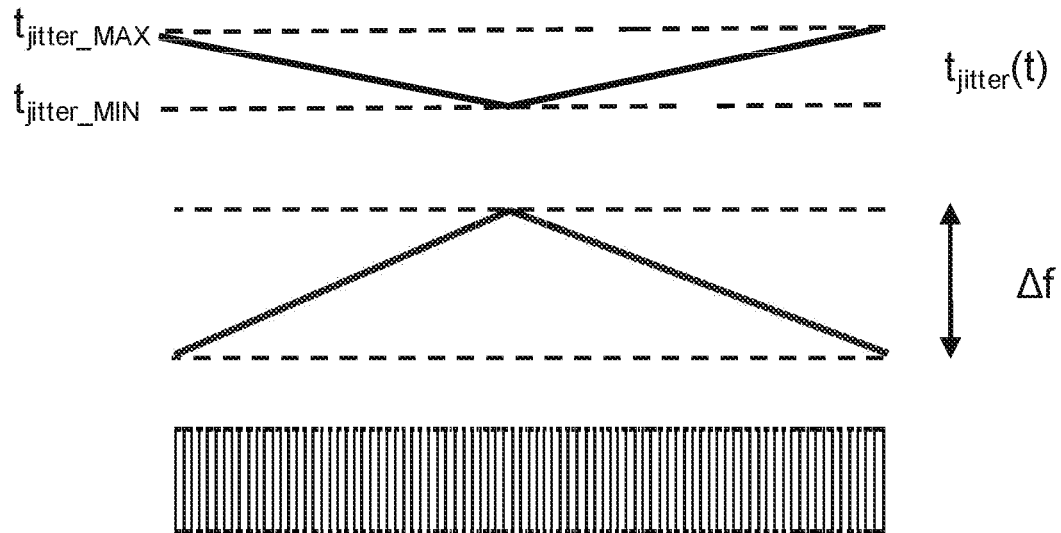
FIG. 16 illustrates a method of providing a range of frequency jitter to a converter that that embodies certain aspects of this invention.
Figure 16:
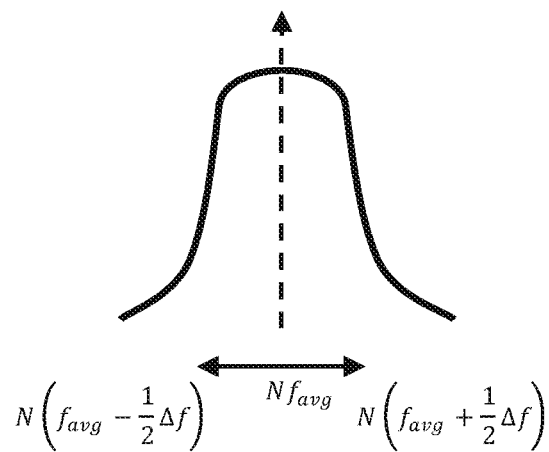

By linearly changing the $t_{jitter}$, the switching frequency of the converter can be spread out in a frequency range as shown in FIG. 16, similar to that described above in connection with FIGS. 4A-4D. The benefits of spectrum separating for electro-magnetic interference (EMI) and quasi-resonant control for $C_{OSS}$ switching loss can be achieved at the same time. However, the inventor has recognized that the switching loss of the power converter can be further improved. For example, the $C_{OSS}$ switching loss can still be large with high input voltage $V_{IN}$.

Figure 17:
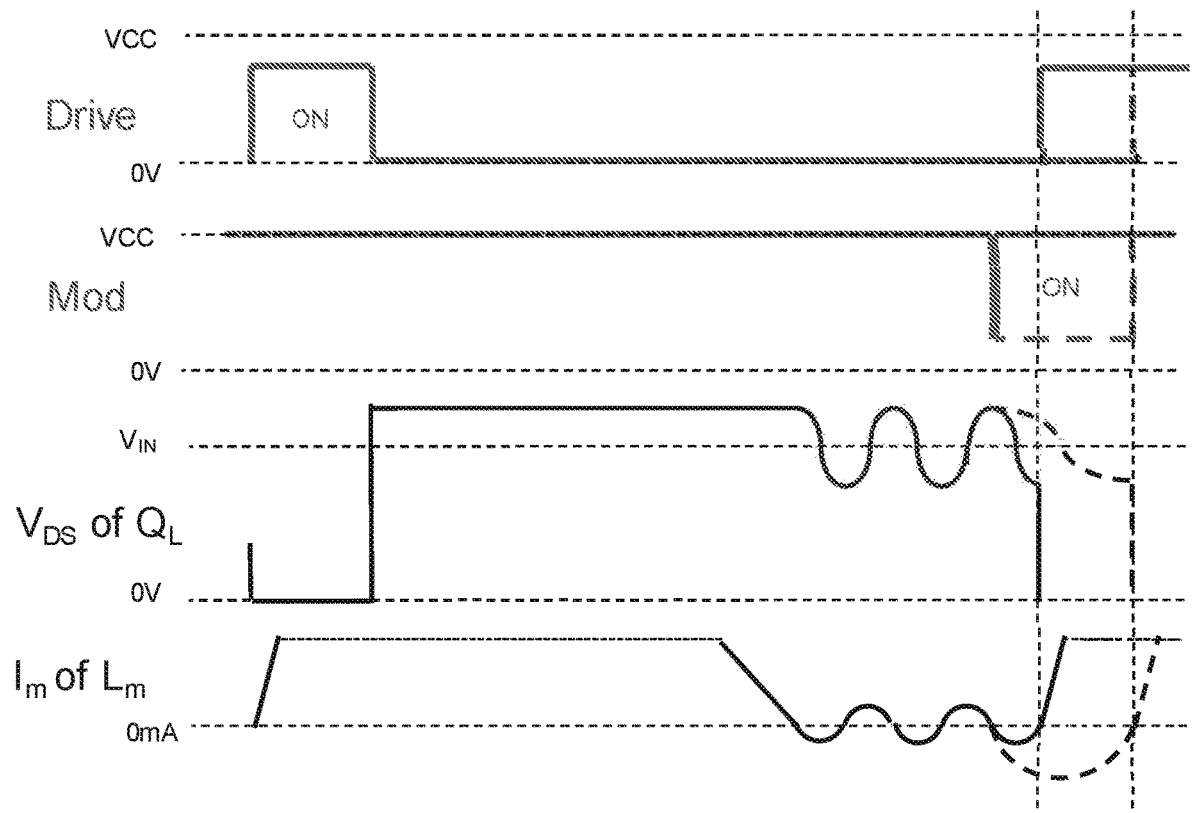
FIG. 17 illustrates waveforms for a converter that embodies certain aspects of this invention.

FIG. 17 plots the Drive signal that turns on the power switch $Q_L$, the Mod signal that turns on the modulation switch $Q_M$, the drain-source voltage $V_{DS}$ of the power switch $Q_L$, and the current $I_m$ in the primary winding $L_m$. As shown in FIG. 17, the $C_{SN}$ changes the resonant period, but keeps the resonant amplitude the same at the boundary of frequency modulation region. As a result, the switching loss is still similar to the traditional quasi-resonant control, and the flyback system can have lower efficiency with high input AC voltage.

This invention further teaches a technique to reduce the switching loss of $C_{OSS}$ associated with the power switch for the power converter. In an example, in order to reduce the switching loss of the power switch $C_{OSS}$, the inductor current $I_m$ flowing into input voltage source $V_{IN}$ is kept in inductor $L_m$ at the end of the modulation switch $Q_M$ modulation time.

Figure 18:
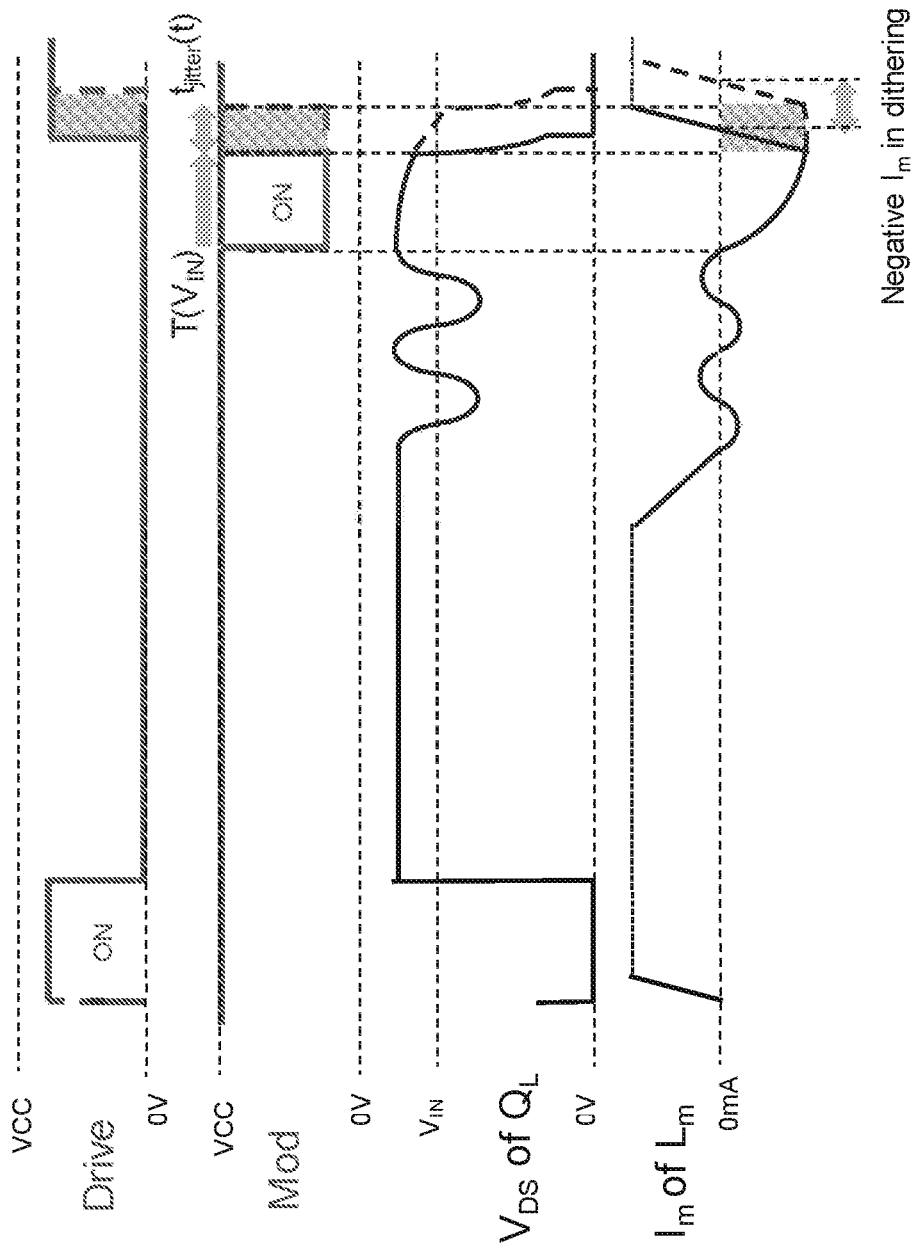
FIG. 18 illustrates waveforms for a converter that embodies certain aspects of this invention.

FIG. 18 shows an example of generating the negative inductor current $I_M$. FIG. 18 plots the Drive signal that turns on the power switch $Q_L$, the Mod signal that turns on the modulation switch $Q_M$, the drain-source voltage $V_{DS}$ of the power switch $Q_L$, and the current $I_m$ in the primary winding $L_m$. In an example, a large $C_{SN}$ is selected to have $T_{QR1} \gg t_{jitter\_MAX}$, and the modulation time of $Q_M$ includes a dithering $t_{jitter}(t)$ variant with time and an offset $T(V_{IN})$ controlled by input voltage $V_{IN}$. In other words, the frequency jitter includes a first portion that varies with the input voltage of the power converter and a second portion that is a time-varying function. With a high $V_{IN}$, the large $T(V_{IN})$ causes the $L_m$ to have a large negative $I_m$ as soon as the $Q_M$ is turned off. This initial current increases the amplitude of the following quasi-resonant waveform and reduces the valley switching voltage on $C_{OSS}$.

Figure 19A:
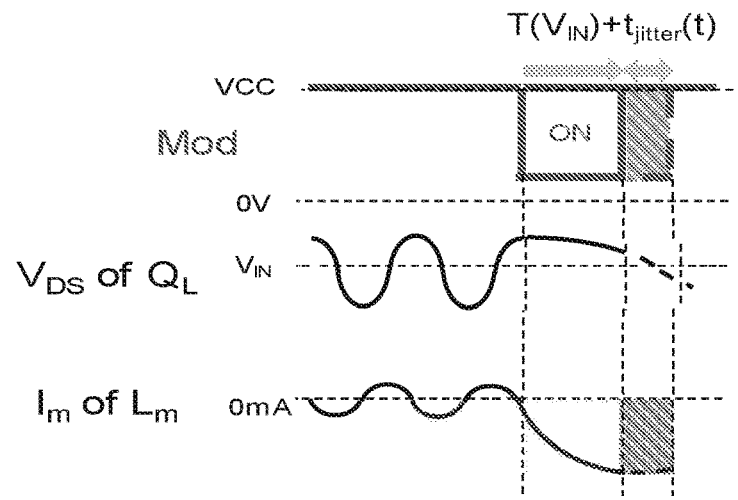
FIGS. 19A-19C illustrate waveforms for the converter that embodies certain aspects of this invention.
Figure 19B:
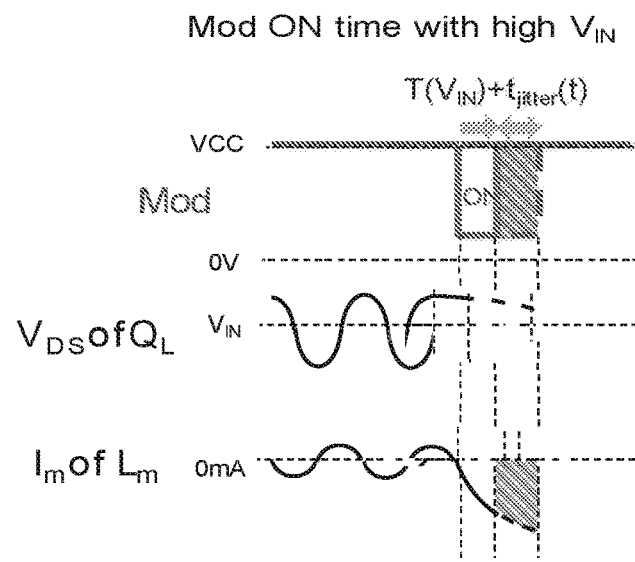
Figure 19C:
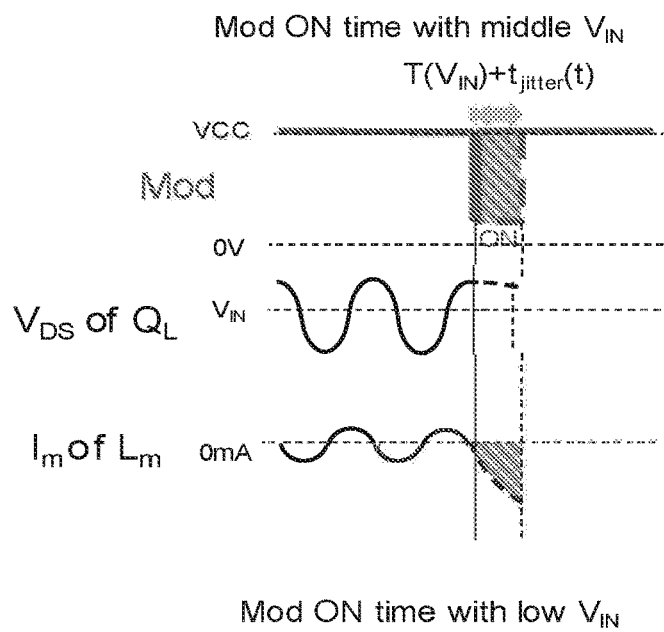

FIGS. 19A-19C plot the Mod signal that turns on the modulation switch $Q_M$, the drain-source voltage $V_{DS}$ of the power switch $Q_L$, and the current $I_m$ in the primary winding $L_m$ at different input voltages $V_{IN}$. FIG. 19A shows the waveforms at a high $V_{IN}$. FIG. 19B shows the waveforms at a medium $V_{IN}$, and FIG. 19C shows the waveforms at a low $V_{IN}$. With smaller input voltage $V_{IN}$, the smaller $T(V_{IN})$ can induce less $I_m$ and less resonant amplitude to adapt to less $Q_L$-$V_{DS}$ on capacitance $C_{OSS}$.

Figure 20:
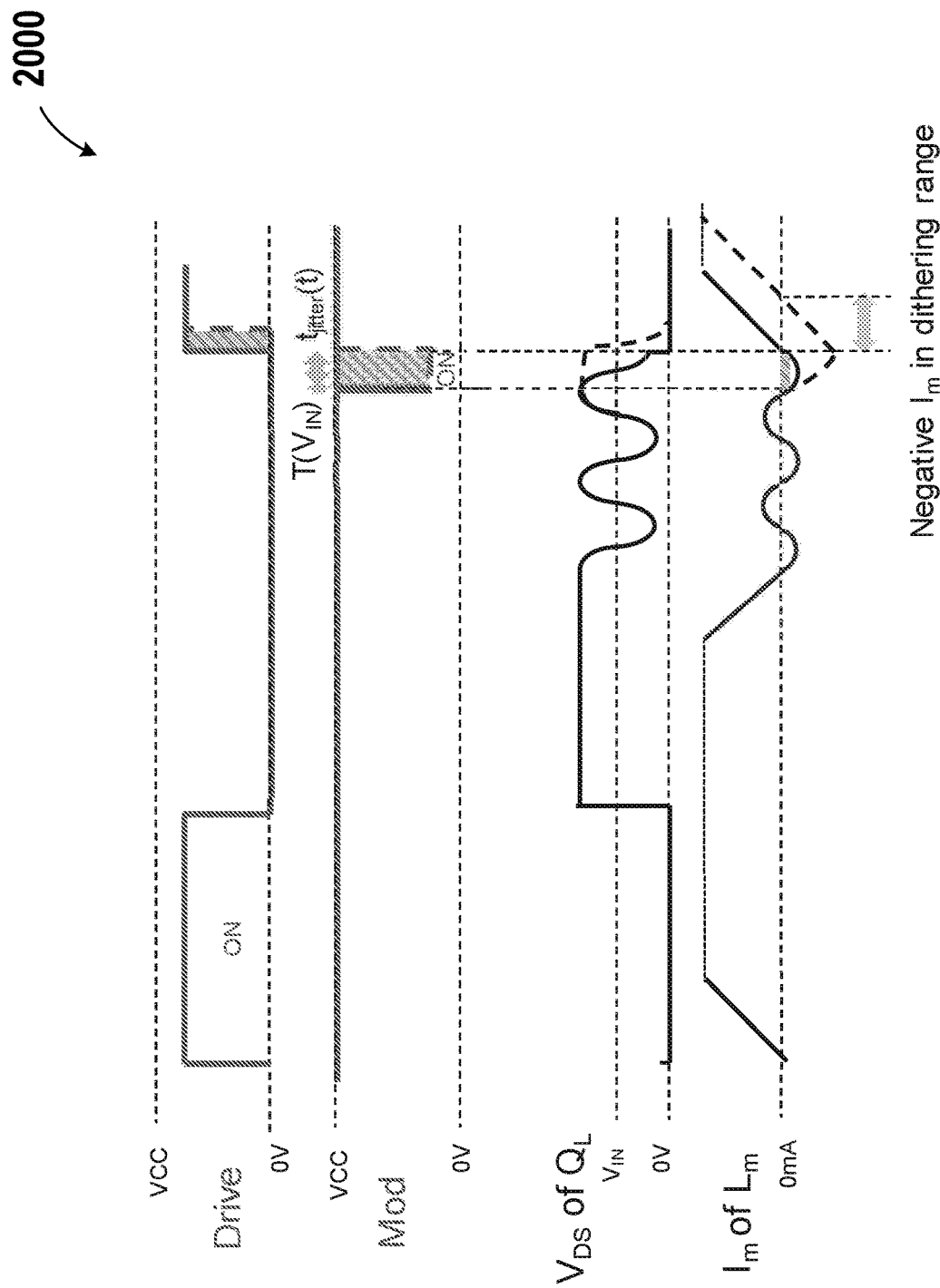
FIG. 20 illustrates waveforms for a converter that embodies certain aspects of this invention.

FIG. 20 shows the example of generating the negative $I_m$ at low $V_{IN}$. Similar to FIG. 18, FIG. 20 plots the Drive signal that turns on the power switch $Q_L$, the Mod signal that turns on the modulation switch $Q_M$, the drain-source voltage $V_{DS}$ of the power switch $Q_L$, and the current $I_m$ in the primary winding $L_m$. However, in FIG. 20, the $V_{IN}$ is relatively low, and $T(V_{IN})$ is small so the modulation switch $Q_M$ is turned off earlier. It induces less negative $I_m$ and less quasi-resonant amplitude subsequently, which is suitable for the low $V_{IN}$ since the resonant waveform already have low $V_{DS}$ drop at the valley point.

Figure 21:
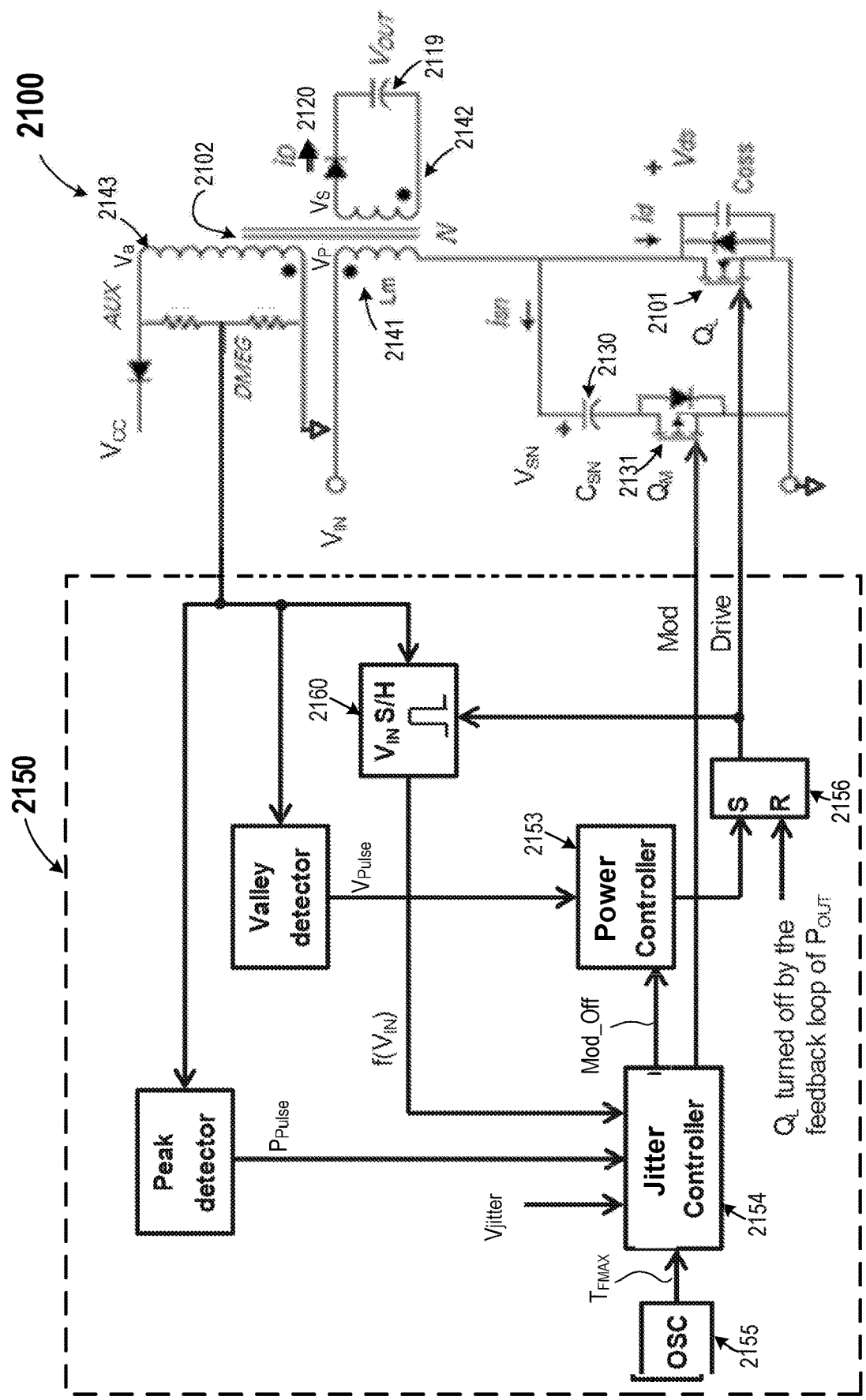
FIG. 21 is a simplified schematic diagram of a flyback converter that embodies certain aspects of this invention.

FIG. 21 is a simplified schematic diagram of a power converter that embodies certain aspects of this invention. Power converter 2100 includes many components similar to those in converter 100 of FIG. 1, as described in detailed below. However, in power converter 2100, an input voltage magnitude detector 2160 is added to provide a signal $f(V_{IN})$ to the jitter controller 2154 to provide a frequency jitter that includes a first portion that varies with the input voltage of the power converter and a second portion that is a time-varying function. The switching loss of the power transistor is reduced and power efficiency can be improved.

Power converter 2100 includes a transformer 2102, which includes a primary winding 2141 for coupling to an input voltage $V_{IN}$ and a secondary winding 2142 for providing the output voltage $V_{OUT}$ through a rectifying diode 2120 and a capacitor 2119. A current in the rectifying diode is $I_D$. Transformer 2102 also has an auxiliary winding 2143 for providing a sensing signal DMEG monitoring a resonant waveform of the converter during a discontinuous time. Auxiliary winding 2143 also provides a voltage $V_{CC}$, which can be used as a power supply for the support circuitry, such as a control circuit. In FIG. 21, Vp denotes the voltage at the primary winding, Vs denotes the voltage at the secondary winding, and Va denotes the voltage at the auxiliary winding. In FIG. 21, $L_m$ represents the inductance of the primary winding, and N represents the ratio of coil turns in the primary winding to the secondary winding. $C_{oss}$ represents the capacitance associated with primary switch 2101, including the capacitance from the body diode. Vds represents the drain-source voltage across the primary switch.

Converter 2100 includes a control circuit 2150. Converter 2100 also includes a power switch 2101 (also designated as $Q_L$) coupled to primary winding 2141 and control circuit 2150 for receiving a control signal to turn on and off power switch 2101 to control the primary current through primary winding 2141 in order to regulate output voltage $V_{OUT}$. In FIG. 21, power switch 2101 is shown as a MOSFET power transistor. In the embodiment of FIG. 21, control circuit 2150 can receive its operating power from $V_{cc}$ provided by the auxiliary winding. Control circuit 2150 can also receive sensing signal DMEG from auxiliary winding 2143. Control circuit 2150 can also receive a current sense signal representative of the primary current through a current sense resistor with a resistance (as shown in FIG. 1, but not shown in FIG. 21). Control circuit 2150 provides a control signal Drive to control power switch 2101. Control circuit 2150 turns on the power switch 2101 based on information provided by the sensing signal DMEG and turns off the power 2101 based on information provided by the current sense signal Vcs.

As shown in FIG. 21, converter 2100 also has a modulation capacitor 2130 (also designated as $C_{SN}$) and a modulation switch 2131 (also designated as $Q_M$) coupled in parallel to power switch 2101. In this arrangement, modulation switch 2131 is coupled in series with capacitor 2130. Control circuit 2150 includes a valley detector 2151 for detecting valley points in the resonant waveform in the sensing signal DMEG during the discontinuous time of converter 2100. Control circuit 2150 also includes a peak detector 2152 for detecting peak points in the resonant waveform in the sensing signal during the discontinuous time. Control circuit 2150 also includes a power controller 2153 for turning on the power switch 2101 at a valley point of a resonant waveform in the sensing signal during a discontinuous time. Control circuit 2150 further includes a jitter controller 2154 for turning on the modulation switch 2131 at a peak point of the resonant waveform in the sensing signal during the discontinuous time. Control circuit 2150 also includes an oscillator OSC 2155, which provides a $T_{FMAX}$ signal to jitter controller 2154. In addition to the $T_{FMAX}$ signal, jitter controller 2154 also receives a Ppulse signal from peak detector 2152, and provides a Mod_Off signal to power controller 2153. Power controller 2153 also receives a Vpulse signal from valley detector 2151. Control circuit 2150 also includes a flipflop 2156 that outputs the Drive signal.

As explained in detail below, jitter controller 2154 varies a turn-on time of the modulation switch 2131 to add a frequency jitter to the switching frequency of the converter. The waveform of Vds is mirrored to the auxiliary winding and detected by a peak detector and a valley detector. The jitter controller determines the target peak count to turn on $Q_M$ and linearly modulates the on time of $Q_M$. After $Q_M$ is turned off, the power controller is enabled by the jitter controller to wait for proper valley count and turn on $Q_L$ at the valley of Vds.

Power converter 2100 also includes an input voltage magnitude detector 2160 to provide a signal $f(V_{IN})$ to the jitter controller 2154 to provide a frequency jitter that includes a first portion that varies with the input voltage of the power converter and a second portion that is a time-varying function. In the example of FIG. 21, the input voltage magnitude detector 2160 includes a sample-and-hold block ($V_{IN}$ S/H) to sense the $V_{IN}$ information through the DMEG node during the on-time of $Q_L$. The sampled $f(V_{IN})$ is used to add a variable of $Q_M$ modulation time which is $T(V_{IN})+t_{jitter}(t)$. In an example, the controller turns on the $Q_M$ at a peak of $V_{ds}$ and turns off $Q_M$ according to the $Q_M$ modulation time. After the $Q_M$ is turned off, the $V_{ds}$ falls rapidly due to the increasing amplitude of quasi-resonant waveform. Thus the valley detector sends a signal to turn on $Q_L$ and a new switching cycle begins.

Figure 22:
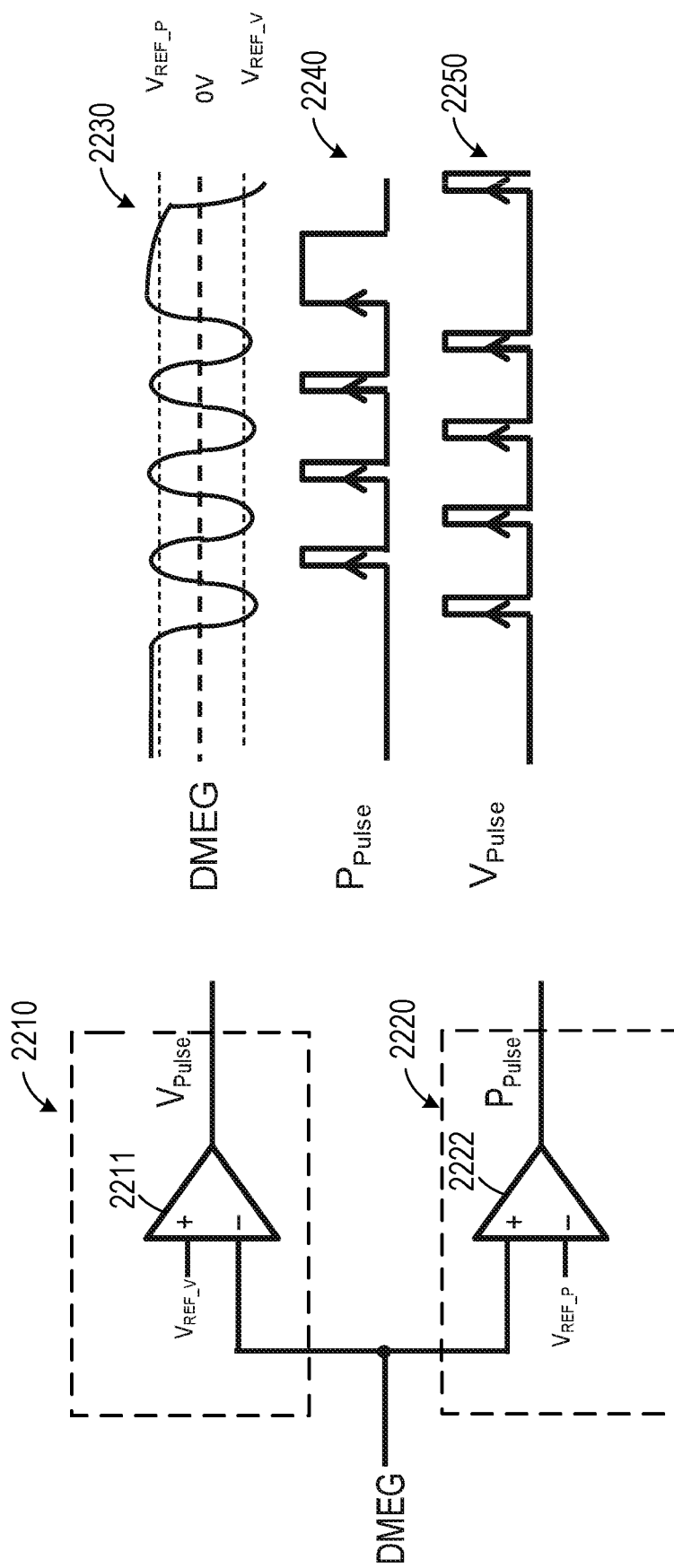
FIG. 22 shows a simplified schematic and waveform diagrams illustrating the structures and functions of a valley detector and a peak detector in the control circuit in a converter that embodies certain aspects of this invention.

FIG. 22 shows schematic and waveform diagrams illustrating the structures and functions of a valley detector and a peak detector in the control circuit in a converter that embodies certain aspects of this invention. In FIG. 22, a valley detector 2210 includes a first comparator 2211 for comparing a sensing signal DMEG and a valley reference voltage Vref_V. A peak detector 2220 includes a second comparator 2222 for comparing a sensing signal DMEG and a peak reference voltage Vref_P. Waveform 2230 illustrates the sensing signal DMEG, with the valley reference voltage Vref_V and peak reference voltage Vref_P. Waveform 2240 illustrates the output waveform of the second comparator 2222, showing a pulse signal $P_{Pulse}$ where the sensing signal DMEG is greater than peak reference voltage Vref_P. Waveform 2250 illustrates the output waveform of the first comparator 2211, showing a pulse signal $V_{Pulse}$ where the sensing signal DMEG is less than valley reference voltage Vref_V. This example detects peaks and valleys of $V_{ds}$ through the DMEG voltage. The rising edge of $P_{Pulse}$ and $V_{Pulse}$ are sent to turn on $Q_M$ at peak of $V_{ds}$ and turn on $Q_L$ at valley of $V_{ds}$.

Figure 23:
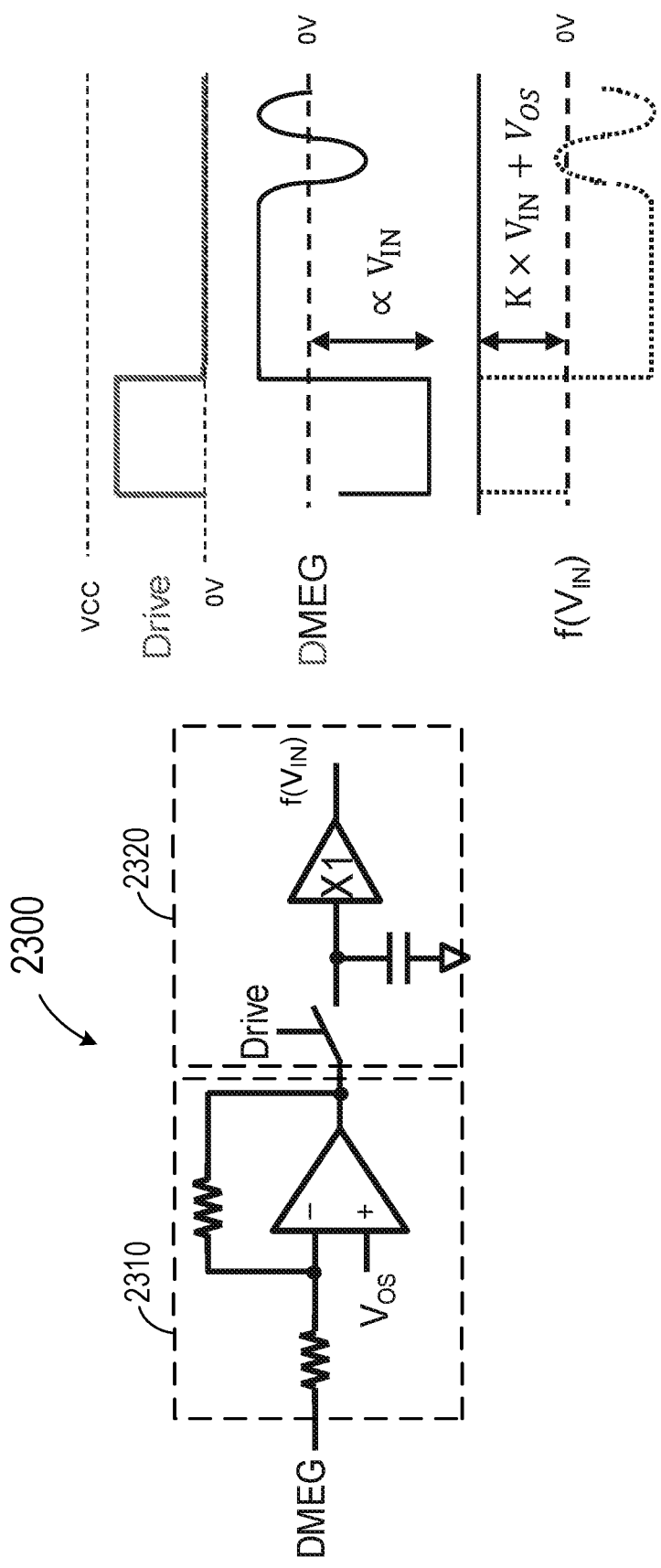
FIG. 23 shows a simplified schematic for detecting the input voltage that embodies certain aspects of this invention.

FIG. 23 shows a schematic for an input voltage magnitude detector 2300, which can be used as input voltage magnitude detector 2160 in control circuit 2150 in FIG. 21. As shown in FIG. 23, input voltage magnitude detector 2300 includes an inverting amplifier 2310 and a sample-and-hold block 2320 to sense the $V_{IN}$ information through the DMEG node during the on-time of $Q_L$. During the on-time of $Q_L$, the $V_{IN}$ is applied on the primary side of transformer to store energy into inductor $L_m$, and the auxiliary winding induces a negative voltage proportional to $V_{IN}$ according to the turn ratio. With the inverting amplifier, the $V_{IN}$ information on DMEG node is converted into a signal which is a function of $V_{IN}$, and a sample and hold circuit is applied to keep the signal measured during the $Q_L$ on time. The sampled signal $f(V_{IN})$ is used to add a variable of $Q_M$ modulation time which is $T(V_{IN})+t_{jitter}(t)$. Inverting amplifier 2310 is coupled to a reference signal $V_{OS}$. A switch in the ample-and-hold block 2320 is controlled by the Drive signal. FIG. 23 also plots the Drive signal that turns on the power switch $Q_L$, the DMEG signal, which has a negative amplitude proportional to $V_{IN}$ during the $Q_L$ on time, and the output $f(V_{IN})$ of the input voltage magnitude detector 2300.

Figure 24:
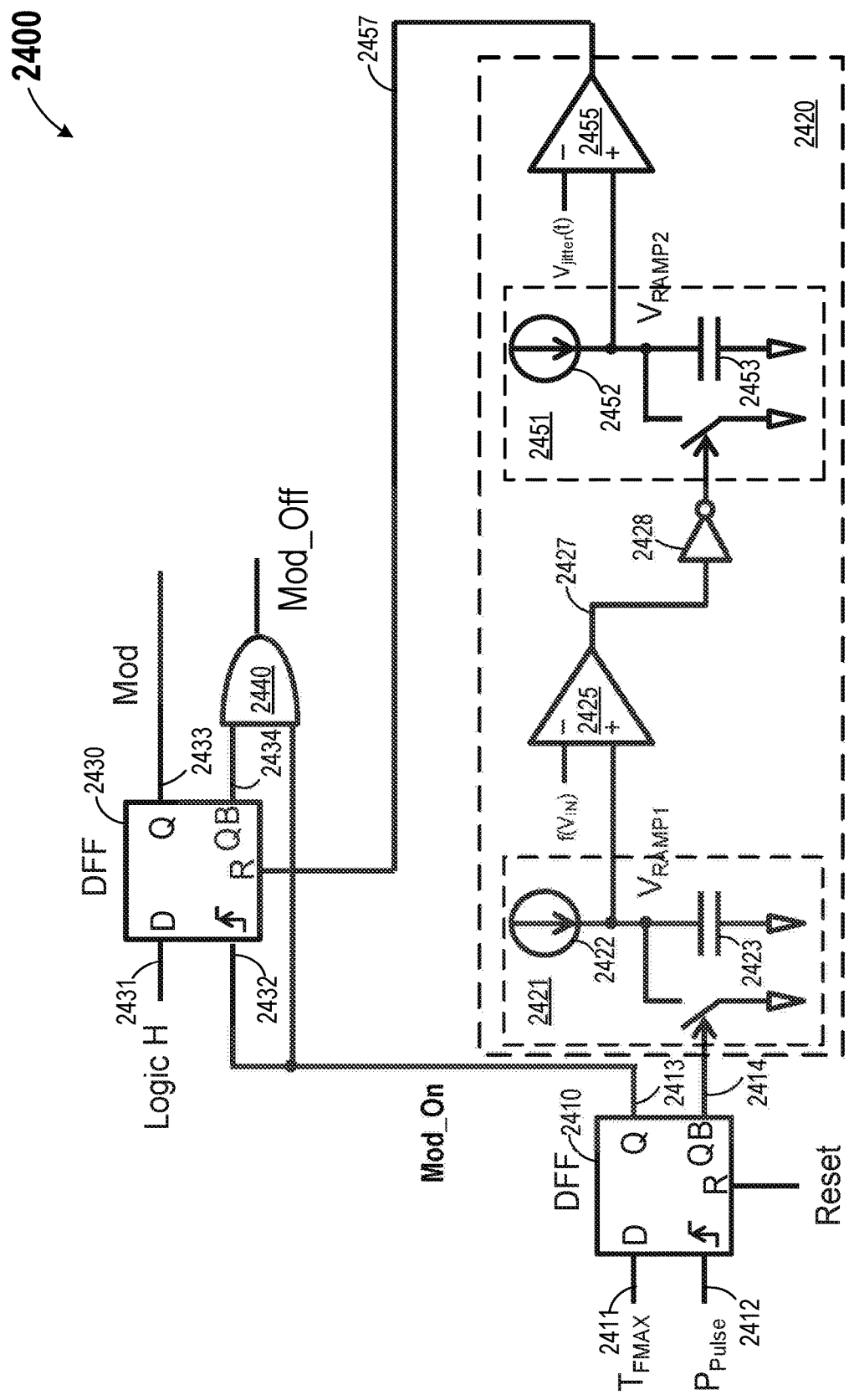
FIG. 24 is a simplified schematic diagram illustrating a jitter controller that embodies certain aspects of this invention.
Figure 25:
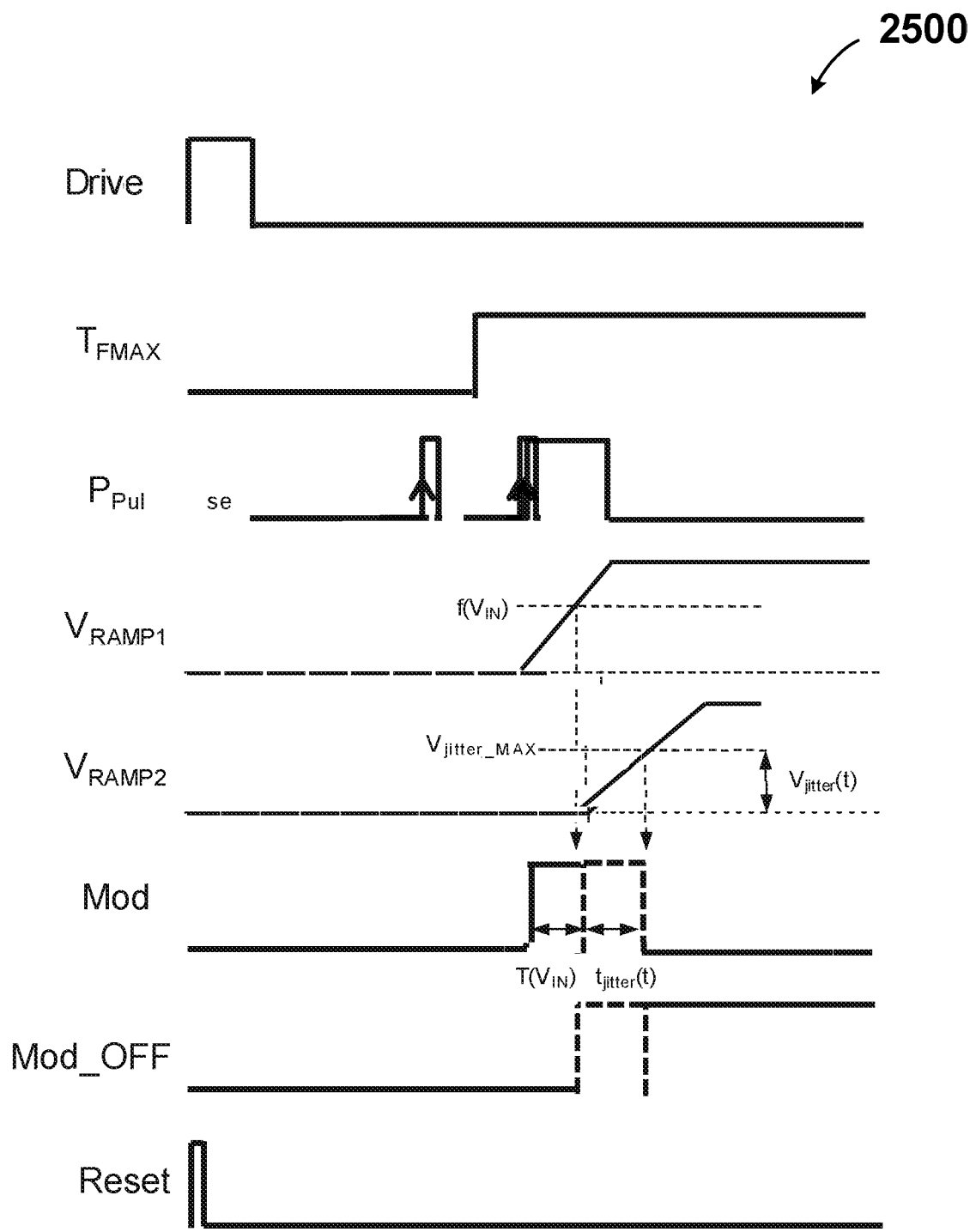
FIG. 25 illustrates a waveform diagram that describes the operation of the jitter controller of FIG. 24 that embodies certain aspects of this invention.

FIG. 24 is a simplified schematic diagram illustrating a jitter controller, and FIG. 25 illustrates a waveform diagram that describes the operation of the jitter controller that embodies certain aspects of this invention. As shown in FIGS. 24 and 25, jitter controller 2400 is an example of a jitter controller that can be used as jitter controller 2154 in converter 2100 in FIG. 21. Jitter controller 2400 includes two D flipflops. A first D flipflop 2410 has a first input terminal 2411 for receiving a blanking time signal $T_{FMAX}$, a second input terminal 2412 for receiving the peak pulse signal $P_{Pulse}$, a first output terminal 2413 for providing a modulation-on signal Mod_On, and a second output terminal 2414 for providing a complement of the modulation on signal.

Jitter controller 2400 also includes a jitter duration circuit 2420 having a first ramp signal circuit 2421 with a current source 2422 and capacitor 2423 that starts charging the capacitor upon receiving the complement of the modulation on signal, from the second output terminal 2414 of the first D flipflop 2410, to produce a first ramp signal $V_{RAMP1}$. Jitter duration circuit 2420 also has a first comparator 2425 for comparing the first ramp signal $V_{RAMP1}$ and an input voltage reference voltage $f(V_{IN})$ and providing a jitter offset signal 2427.

Jitter duration circuit 2420 also has a second ramp signal circuit 2451 with a current source 2452 and capacitor 2453 that starts charging the capacitor upon receiving jitter offset signal 2427 through an inverter 2428 to produce a second ramp signal $V_{RAMP2}$. Jitter duration circuit 2420 also has a comparator 2455 for comparing the second ramp signal $V_{RAMP2}$ and a time-varying jitter reference voltage $V_{jitter}(t)$ and providing a jitter stop signal 2457.

In FIG. 24, a second D flipflop 2430 has a first input terminal 2431 for receiving logic high signal Logic H, a second input terminal 2432 for receiving the modulation on signal Mod_On from the first D flipflop 2410, a reset terminal 2435 for receiving the jitter stop signal 2457, a first output terminal 2433 for providing a modulation switch turn-on signal Mod, and a second output terminal 2434 for providing a complement of the modulation switch turn-on signal. Jitter controller 2400 also has an AND circuit 2440 for receiving the modulation on signal Mod_On and the complement of the modulation switch turn-on signal Mod and providing a modulation switch turn-off signal Mod_Off.

FIG. 25 shows example waveforms of the jitter controller 2400, also referred to as the modulation time controller. FIG. 25 plots the Drive, $T_{FMAX}$, $P_{Pulse}$, $V_{RAMP1}$, $V_{RAMP2}$, Mod, Mod_Off, and Reset signals. As shown in FIG. 25, the beginning of the modulation time is triggered by the first $P_{Pulse}$ signal after a blanking time signal $T_{FMAX}$ goes high. The $T_{FMAX}$ signal in FIG. 25 is generated by a timer shown in FIG. 26 to limit the maximum value of the system switching frequency, and the $P_{Pulse}$ is signal from the peak detector to turn on $Q_M$ with less switching loss. As described above in connection with FIG. 24, the length of modulation time MOD is determined by two timers in series. The first timer generates a delay $T(V_{IN})$ according to the signal $f(V_{IN})$, and the second timer generates another delay $t_{jitter}(t)$ according to a time variant signal $V_{jitter}(t)$. The summation of the two delays determines a signal Mod to drive $Q_M$ and achieves the modulation time with time variant dithering and $V_{IN}$ controlled offset. In some embodiments, the time-varying signal can be provided by an oscillator, for example.

After the $Q_M$ turn off, the modulation time controller enables a Mod_Off flag. Since the offset of modulation time of $Q_M$ increases the resonant amplitude of $V_{ds}$, the $Q_L$ should be turned on at the first valley after the modulation time to have lower switching loss.

Figure 26:
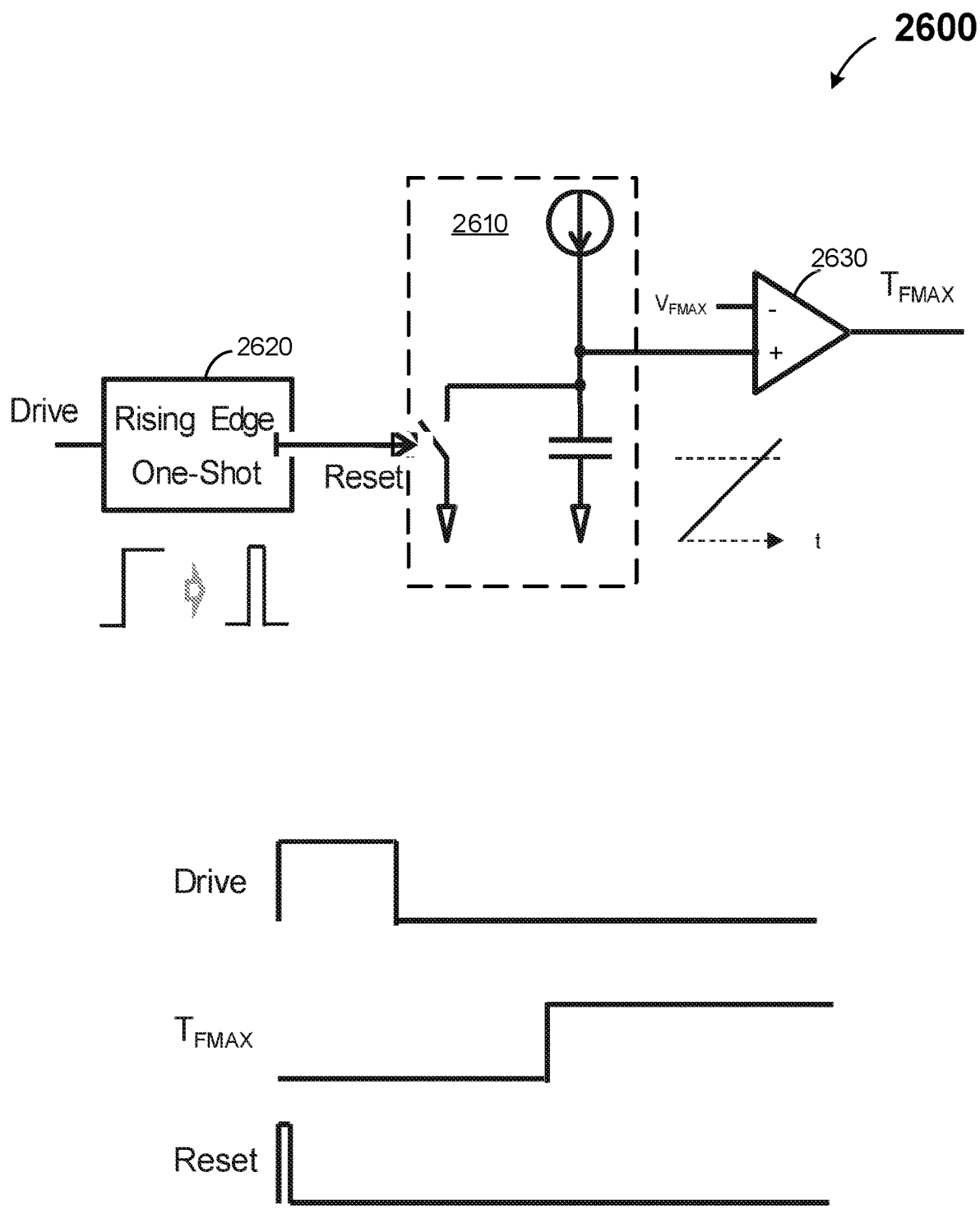
FIG. 26 is a simplified schematic diagram illustrating a blanking time generation circuit and waveform diagram that embodies certain aspects of this invention.

FIG. 26 shows a simplified schematic diagram illustrating a blanking time generation circuit and a waveform diagram that describes the operation of timer circuit 2600 that can be used as a blanking time generation circuit that embodies certain aspects of this invention. Timer circuit 2600 includes a ramp signal circuit 2610 with a current source and capacitor that starts charging the capacitor upon receiving a Reset signal to produce a ramp signal. As shown in FIG. 26, the Reset signal is a pulse signal produced by a rising edge one-shot circuit 2620 at the rising edge of the primary switch $Q_L$ turn-on signal. Blanking time generation circuit 2600 also has a comparator 2630 for comparing the ramp signal and a reference voltage $V_{FMAX}$ and providing blanking time signal $T_{FMAX}$. FIG. 26 also shows the waveforms for the primary switch control signal Drive, blanking time signal $T_{FMAX}$, and the Reset signal. Blanking time signal $T_{FMAX}$ can be used to select the on-set of the modulation switch turn-on signal, as described above in connection with FIGS. 24 and 25. It also limits the lower bound of the switching period.

Figure 27:
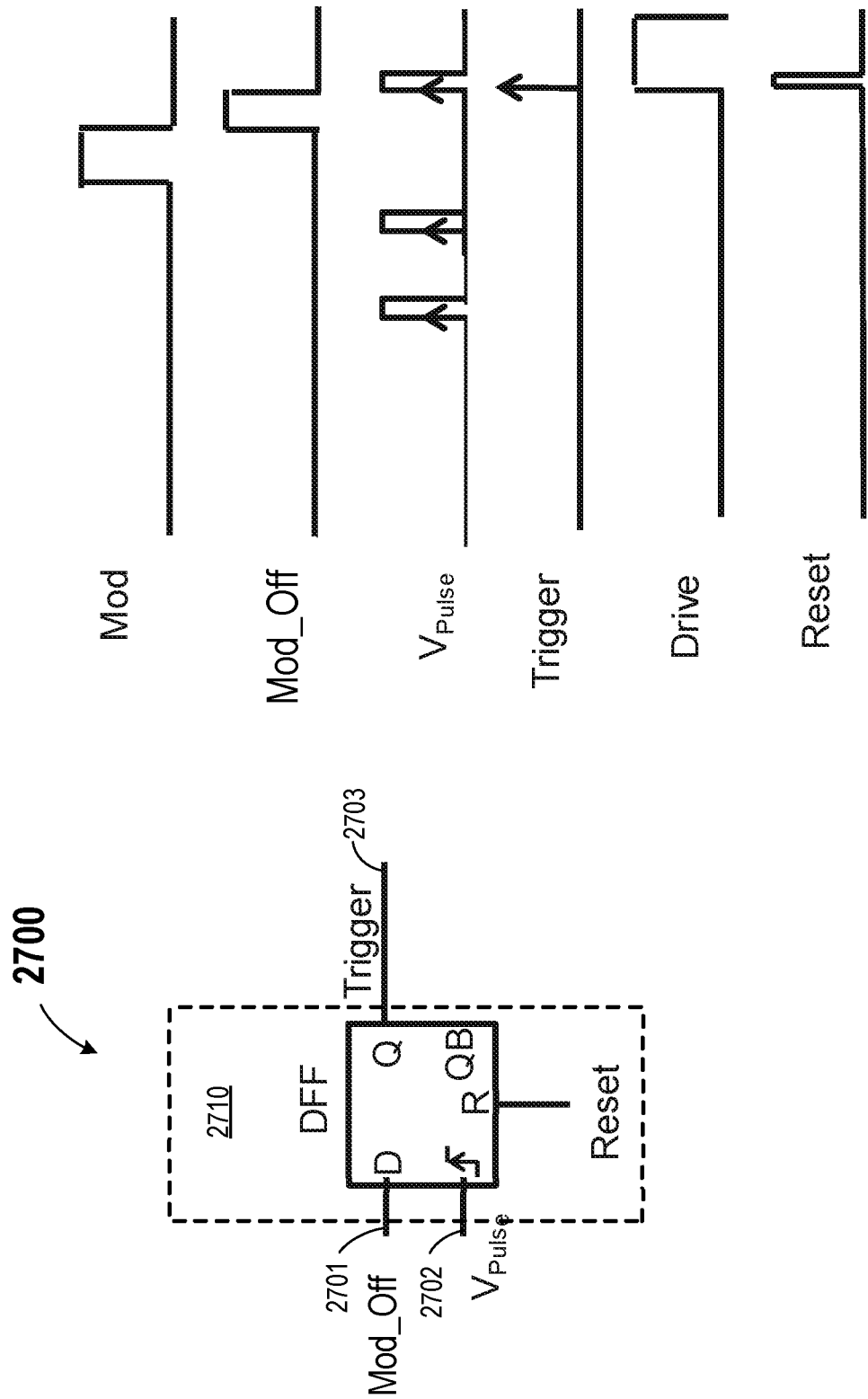
FIG. 27 is a simplified schematic diagram illustrating an example of a power controller that embodies certain aspects of this invention.

FIG. 27 is a simplified schematic diagram illustrating a first example of a power controller that embodies certain aspects of this invention. As shown in FIG. 27, power controller 2700 is an example of power controller that can be used as power controller 2153 in converter 2100 in FIG. 21. As shown in FIG. 27, power controller 2700 has a first input terminal 2701 for receiving the modulation switch turn-off signal Mod_Off, a second input terminal 2702 for receiving the valley pulse signal $V_{Pulse}$, and an output terminal 2703 for providing a primary switch turn on signal Trigger. Power controller 2700 provides a primary switch turn-on signal at a valley point of the resonant waveform in the discontinuous time.

As shown in FIG. 27, power controller 2700 has a D flipflop 2710 that includes a first input terminal 2701 for receiving the modulation switch off signal Mod_Off, a second input terminal 2702 for receiving the valley pulse signal $V_{Pulse}$, and an output terminal 2703 for providing the primary switch turn on signal Trigger. Waveform Mod illustrates the modulation switch turn-on signal. Waveform Mod_Off indicates that the modulation switch is turned off after the modulation switch has been on for a duration determined by the jitter control circuit. Waveform $V_{Pulse}$ shows the valley pulse signals. D flipflop 2710 produces the trigger signal Trigger at the rising edge of the first valley pulse signal $V_{Pulse}$ after the modulation switch is turned off. The primary switch control signal Drive is provided by control circuit 2150 in FIG. 21 in response to the Trigger signal. Turning on the primary switch indicates the beginning of a new switching cycle, and the D flipflop 2710 receives a global signal Reset to standby for the new cycle. The power controller sends the trigger signal with the first $V_{Pulse}$ after the Mod_Off flag is enabled. The trigger signal turns on $Q_L$ and begins the next switching cycle of system.

Figure 28:
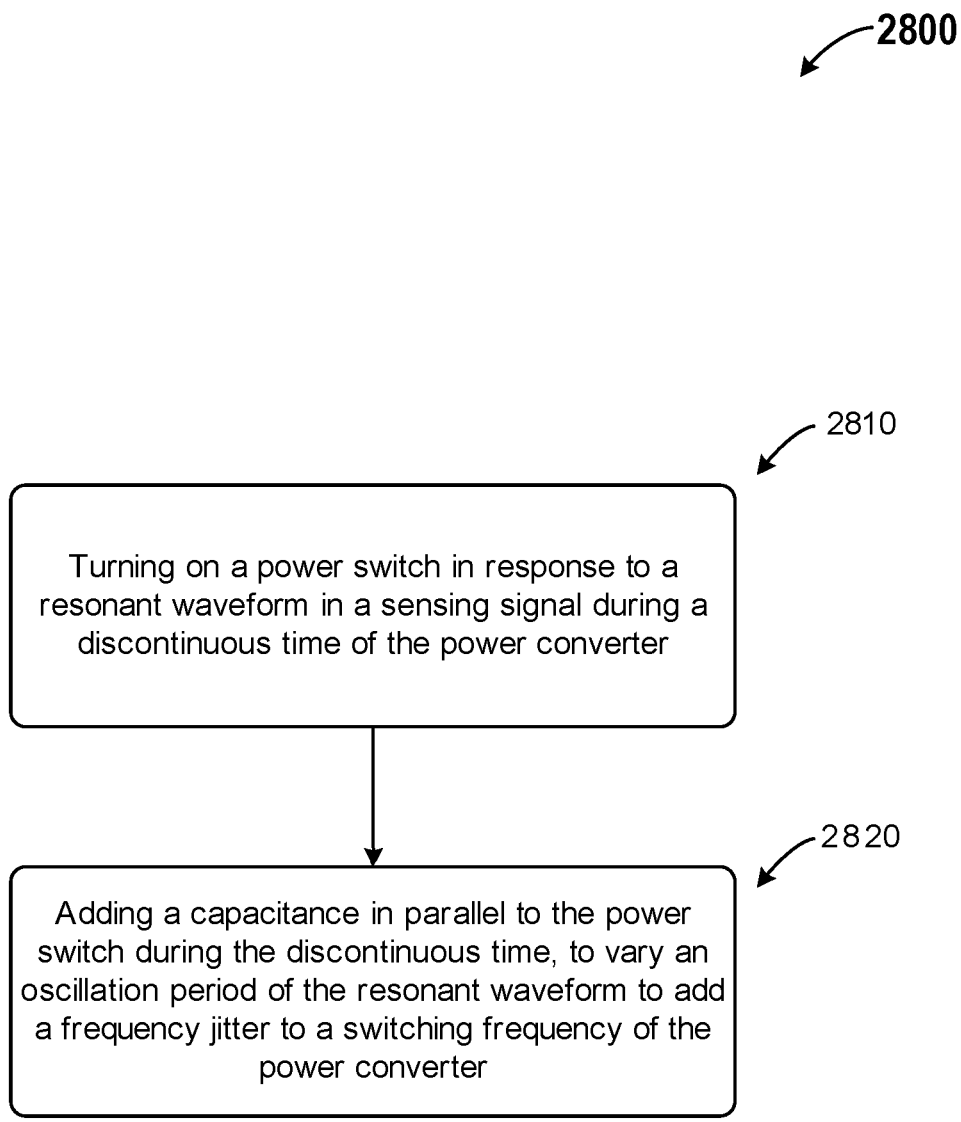
FIG. 28 is a simplified flowchart that illustrates a method for controlling a power converter that embodies certain aspects of this invention.

FIG. 28 is a simplified flowchart that illustrates a method for controlling a power converter that embodies certain aspects of this invention. As shown in FIG. 28, method 2800 includes, at 2810, turning on a power switch in response to a resonant waveform in a sensing signal during a discontinuous time of the power converter. Method 2800 also includes, at 2820, adding a capacitance in parallel to the power switch during the discontinuous time, to vary an oscillation period of the resonant waveform to add a frequency jitter to a switching frequency of the power converter.

Examples of power converters implementing method 2800 are described above in connection with FIGS. 14-27. In some embodiments, the frequency jitter can include a first portion that varies with an input voltage of the power converter and a second portion that is a time-varying function. In method 2800, adding a capacitance in parallel to the power switch can include turning on a modulation switch that is coupled in series with a modulation capacitor. Method 2800 can also include turning on a power switch in response to a resonant waveform in a sensing signal during a discontinuous time of the power converter, wherein the power switch is coupled to a primary winding of the power converter to control a primary current flow. The method can also include adding a capacitance in parallel to the power switch during the discontinuous time, to vary an oscillation period of the resonant waveform to add a frequency jitter to a switching frequency of the power converter. The method can add a capacitance in parallel to the power switch by turning on a modulation switch that is coupled in series with a capacitor, wherein the capacitor and the modulation switch are coupled in parallel with the power switch. The frequency jitter can include a first portion that varies with an input voltage of the power converter and a second portion that is a time-varying function.

Figure 29:
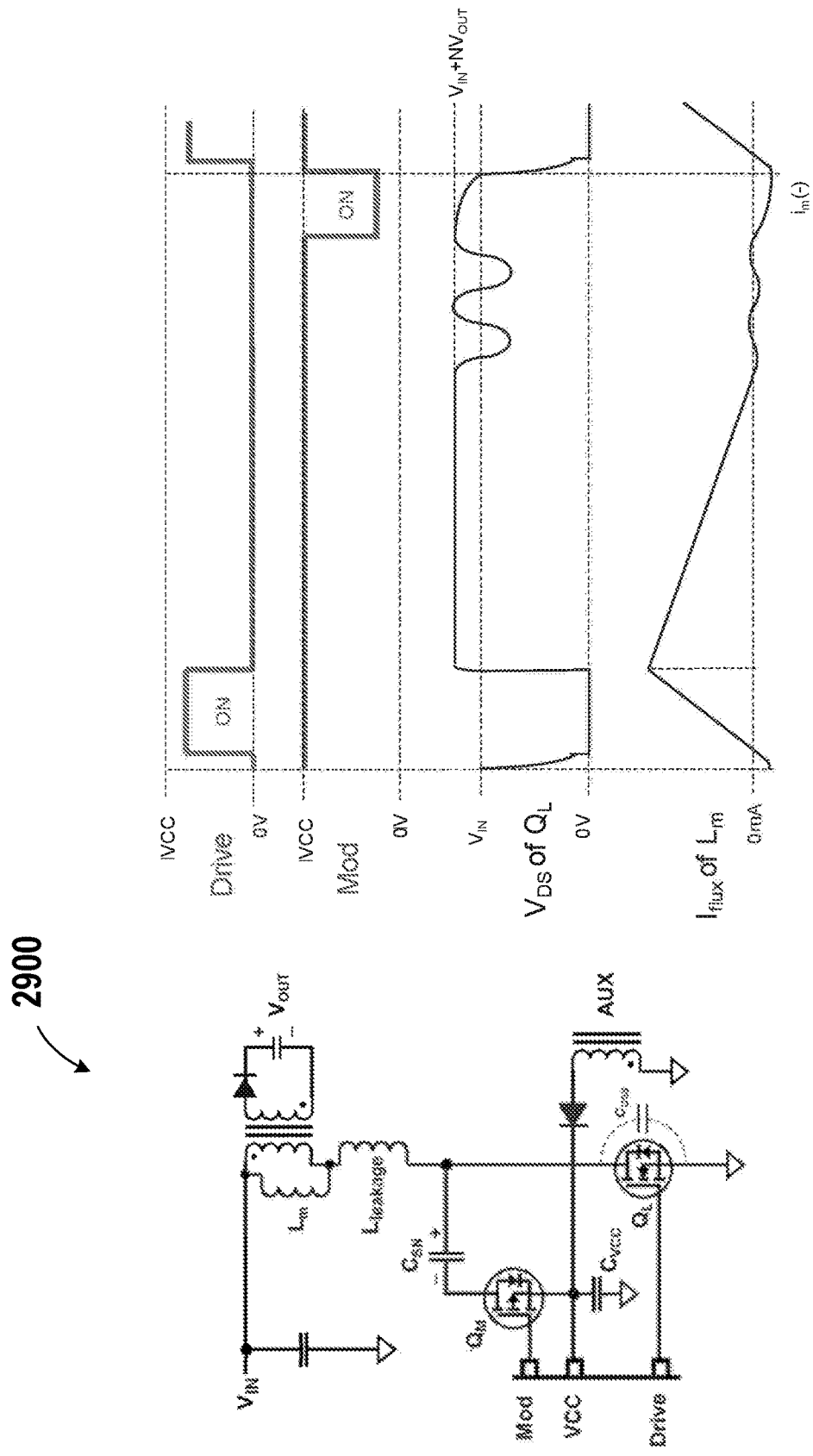
FIG. 29 is a simplified schematic diagram and a waveform diagram illustrating an example of a flyback convertor that embodies certain aspects of this invention.

FIG. 29 is a simplified waveform diagram illustrating signals for a flyback power controller that embodies certain aspects of this invention. FIG. 29 illustrates part of a power controller 2900, which is similar to flyback converter 2100 of FIG. 21. FIG. 29 illustrates similar components as those shown in FIG. 21. FIG. 29 also illustrates control signals and waveforms of a modulation circuit in the power controller, similar to those shown in FIG. 18. Therefore, detailed descriptions of the common components and signals are not repeated here. The modulation circuit is implemented to reduce switching loss of flyback system. During the discontinuous time of the system, a modulation switch $Q_M$ is turned on to connect a modulation capacitor $C_{SN}$ in parallel with the $C_{OSS}$ at the peak of the resonant waveform. The increasing total capacitance can enlarge the resonant current on the magnetizing inductor $L_m$. By turning off $Q_M$ at the proper time with larger negative $i_m(t)$ as shown in the plot of $I_{flux}$ of $L_m$ in FIG. 29, the following resonant waveform can have larger voltage amplitude and the control circuit can turn on the power switch $Q_L$ with less $V_{DS}$ drop, which means less switching loss.

However, this control method illustrated in FIG. 29 can have a drawback on transformer design. In order to precisely control the negative current on $L_m$, the control circuit needs to accurately detect the peak of a resonant waveform for turning on the $Q_M$. As a result, the transformer must be operated under discontinuous conduction mode (DCM).

Figure 30:
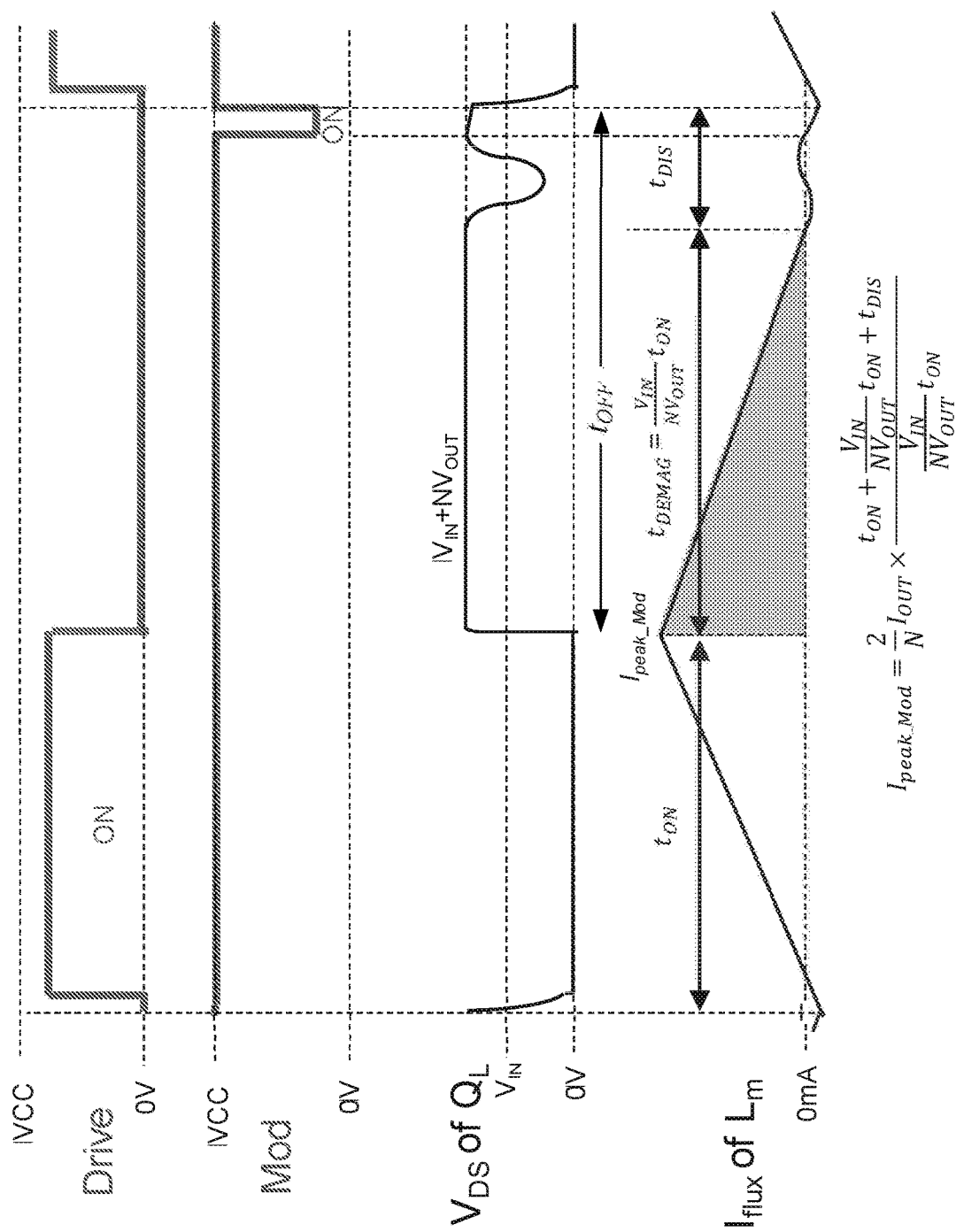
FIG. 30 illustrates discontinuous conduction mode (DCM) waveforms of flyback convertor 2900 of FIG. 29 operated by jitter controller that embodies certain aspects of this invention.

FIG. 30 is a simplified waveform diagram illustrating signals for flyback controller 2900 of FIG. 29 operated under discontinuous conduction mode (DCM) that embodies certain aspects of this invention. FIG. 30 shows the waveforms of the signals under full load and low input voltage. For example, $t_{ON}$ is the on time of power switch $Q_L$, and $t_{OFF}$ is the off time of power switch $Q_L$. The off time $t_{OFF}$ can include a demagnetization-time $t_{DEMAG}$ and a discontinuous time $t_{DIS}$. During the demagnetization-time $t_{DEMAG}$, the secondary winding discharges, and during the discontinuous time $t_{DIS}$, no current flows, but a resonant waveform can be detected. The demagnetization-time $t_{DEMAG}$ can be expressed as $$t_{DEMAG} = \frac{V_{IN}}{NV_{OUT}} t_{ON}.$$

In this example, at the beginning of a switching cycle, the low input voltage causes a long power switch $Q_L$ on-time $t_{ON}$. Further, at the end of the switching cycle, the control circuit needs a discontinuous time $t_{DIS}$ to detect the peak of the quasi-resonant (QR) waveform and turn on modulation switch $Q_M$. As shown in FIG. 30, the peak current can be expressed as $$I_{peak\_Mod} = \frac{2}{N} I_{OUT} \times \frac{t_{ON} + \frac{V_{IN}}{NV_{OUT}} t_{ON} + t_{DIS}}{\frac{V_{IN}}{NV_{OUT}} t_{ON}}.$$

It can be seen that the $t_{ON}$ and $t_{DIS}$ reduce the duty of $t_{DEMAG}$, and the system needs larger peak current $I_{peak\_Mod}$ to deliver the output current $I_{OUT}$. The higher peak current means that the transformer needs lower equivalent series resistance (ESR) and higher maximum flux density ($B_{MAX}$). Both of these requirements increase the size and cost of transformer.

An aspect of this invention teaches to change the operating mode of the flyback system according to the input voltage. The efficiency of a flyback system is determined by different factors depending on the input voltage. The efficiency of a flyback system is often dominated by switching loss under high input voltage, and can be dominated by conduction loss under low input voltage. By changing the operating mode, the flyback system can benefit from lower peak current under low input voltage and can also benefit from drain-source voltage $V_{DS}$ reduction under high input voltage.

An aspect of this invention teaches a control method to change the turn-on timing of modulation switch $Q_M$ in the flyback system according to the input voltage. When the input voltage is low, the $Q_M$ is turned on in the demagnetizing time. During the $Q_M$ on-time, the leakage inductor energy, which is stored into $C_{SN}$ when power switch $Q_L$ is turned off, is released to $V_{OUT}$ in parallel with the $I_{flux}$ through secondary side diode. Since the $Q_M$ does not have to be turned on again at the end of switching cycle, duty of $t_{DEMAG}$ increases with the reduced $t_{DIS}$ and the peak current in each switching cycle can be reduced.

Figure 31:
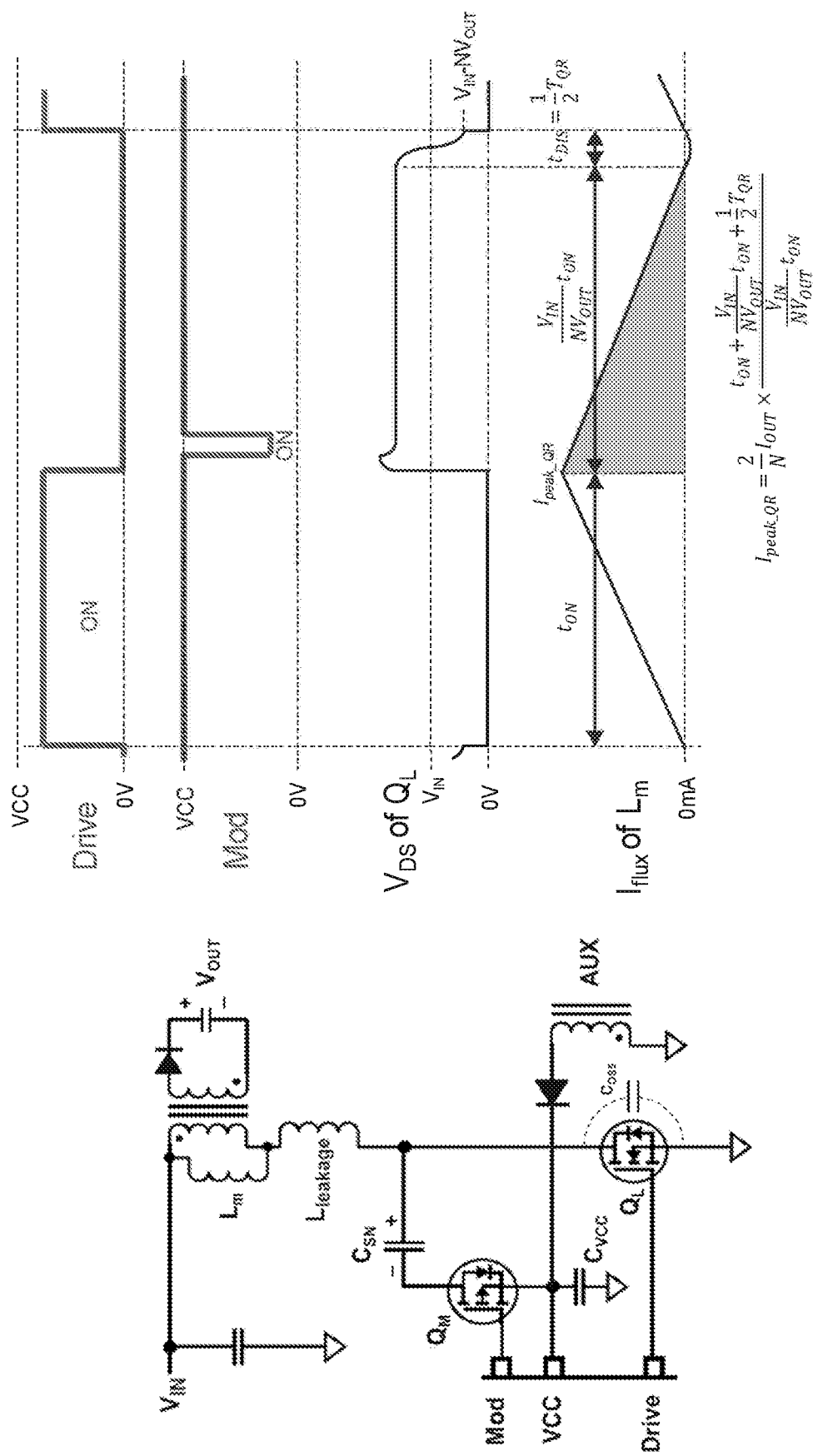
FIG. 31 illustrates the quasi-resonant (QR) waveforms of flyback convertor 2900 of FIG. 29 operated under low input voltage mode that embodies certain aspects of this invention.

FIG. 31 is a simplified waveform diagram illustrating signals for flyback controller 2900 of FIG. 29 operated under quasi-resonant (QR) that embodies certain aspects of this invention. FIG. 31 shows the waveforms of the QR mode flyback under low input voltage. The power switch $Q_L$ is turned on at the first valley of quasi-resonant waveform. It reduces the $t_{DIS}$ to $1/2T_{QR}$ and increases the turn-on $V_{DS}$ of $Q_L$ to $V_{IN}$-$NV_{OUT}$. Since the VDS is still small with low $V_{IN}$, this trade-off can slightly improve total efficiency and ease the requirement of transformer with less maximum flux density.

Figure 32:
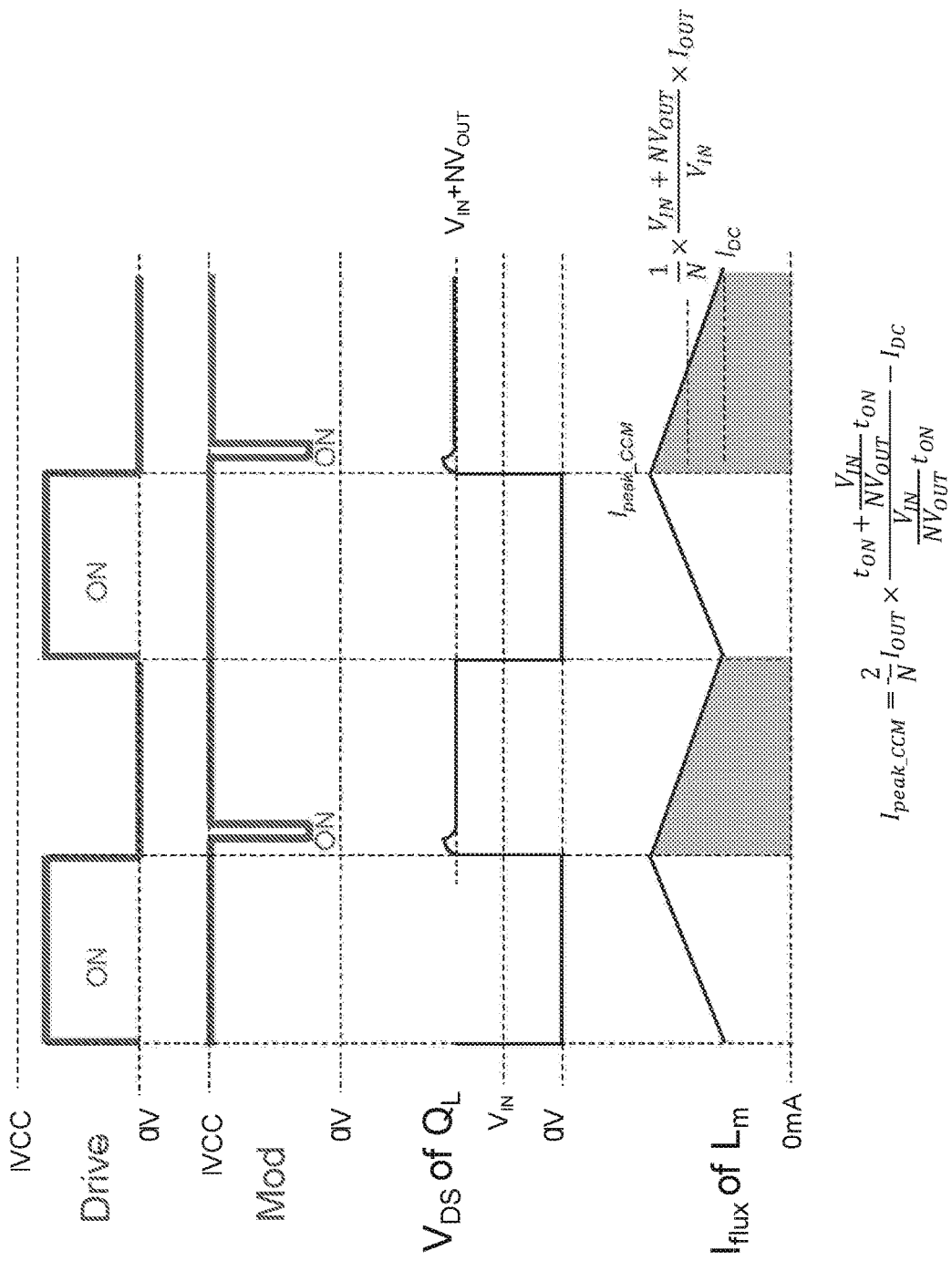
FIG. 32 illustrates the continuous conduction mode (CCM) waveforms of flyback convertor 2900 of FIG. 29 operated under low input voltage mode that embodies certain aspects of this invention.

FIG. 32 is a simplified waveform diagram illustrating signals for flyback controller 2900 of FIG. 29 operated under continuous conduction mode (CCM) that embodies certain aspects of this invention. FIG. 32 shows the waveforms of the CCM flyback under low input voltage. Since $Q_L$ is turned on when the In is still flowing to $V_{OUT}$, the peak current can be further reduced because of the trapezoidal demagnetizing current. The greatly reduced maximum flux density can save the cost and size of the transformer, but the switching loss of $Q_L$ increases because of the increasing turn-on $V_{DS}$ $V_{IN}$+$NV_{OUT}$. However, the low input voltage eases the drawback, and the low peak current may restore some efficiency with smaller conduction loss.

Figure 33:
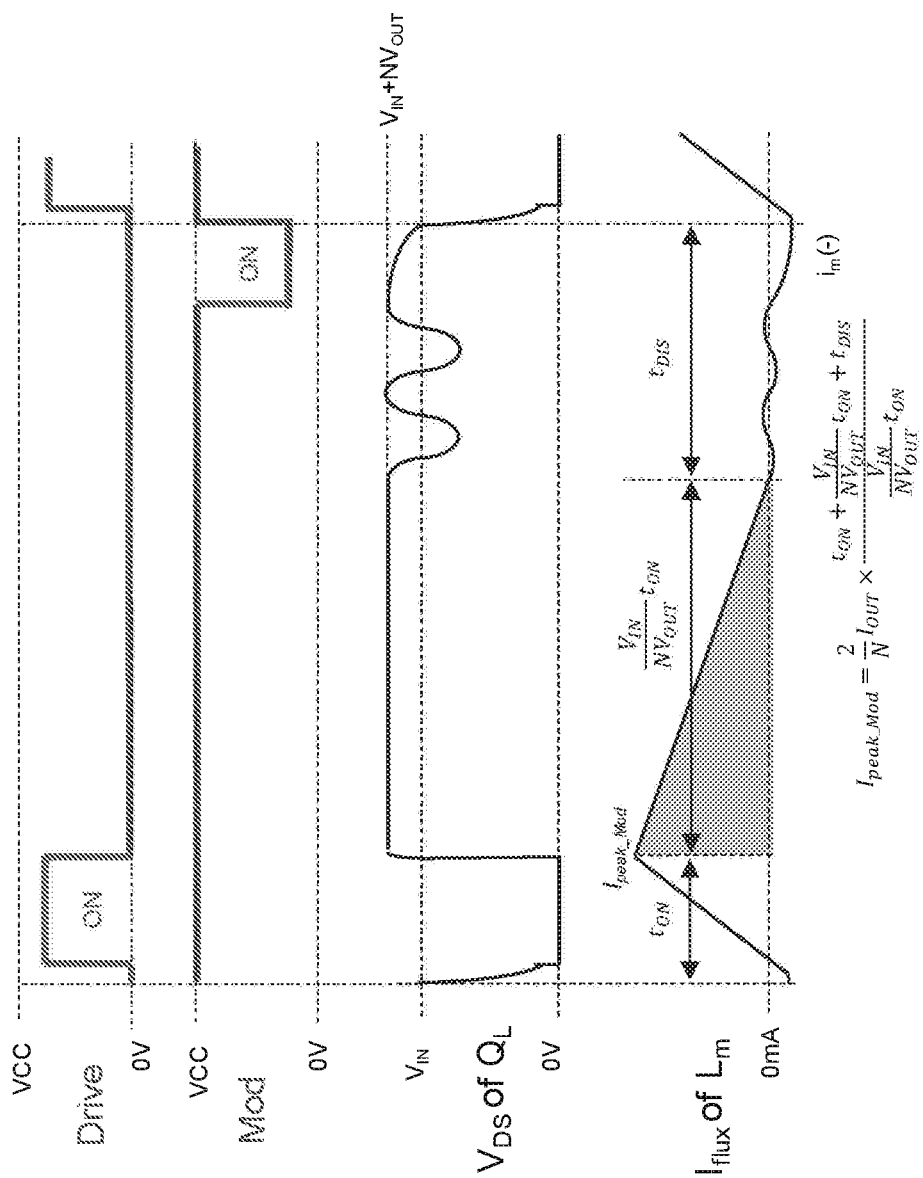
FIG. 33 illustrates the waveforms of flyback convertor 2900 of FIG. 29 operated under high input voltage mode that embodies certain aspects of this invention.

FIG. 33 is a simplified waveform diagram illustrating signals for flyback controller 2900 of FIG. 29 operated in high input voltage mode that embodies certain aspects of this invention. FIG. 33 shows the system waveforms under high input voltage. When the input voltage is high, the $Q_M$ is turned on at the end of $t_{DIS}$ to induce negative $i_m(-)$ for reducing $Q_L$ switching loss. Since the $t_{ON}$ of $Q_L$ is greatly reduced with high input voltage, the saved time can cover the requirement of $Q_M$ control. The flyback system may have similar peak current compared with low input voltage. It means that the control method can improve switching loss with the same transformer design.

Figure 34:
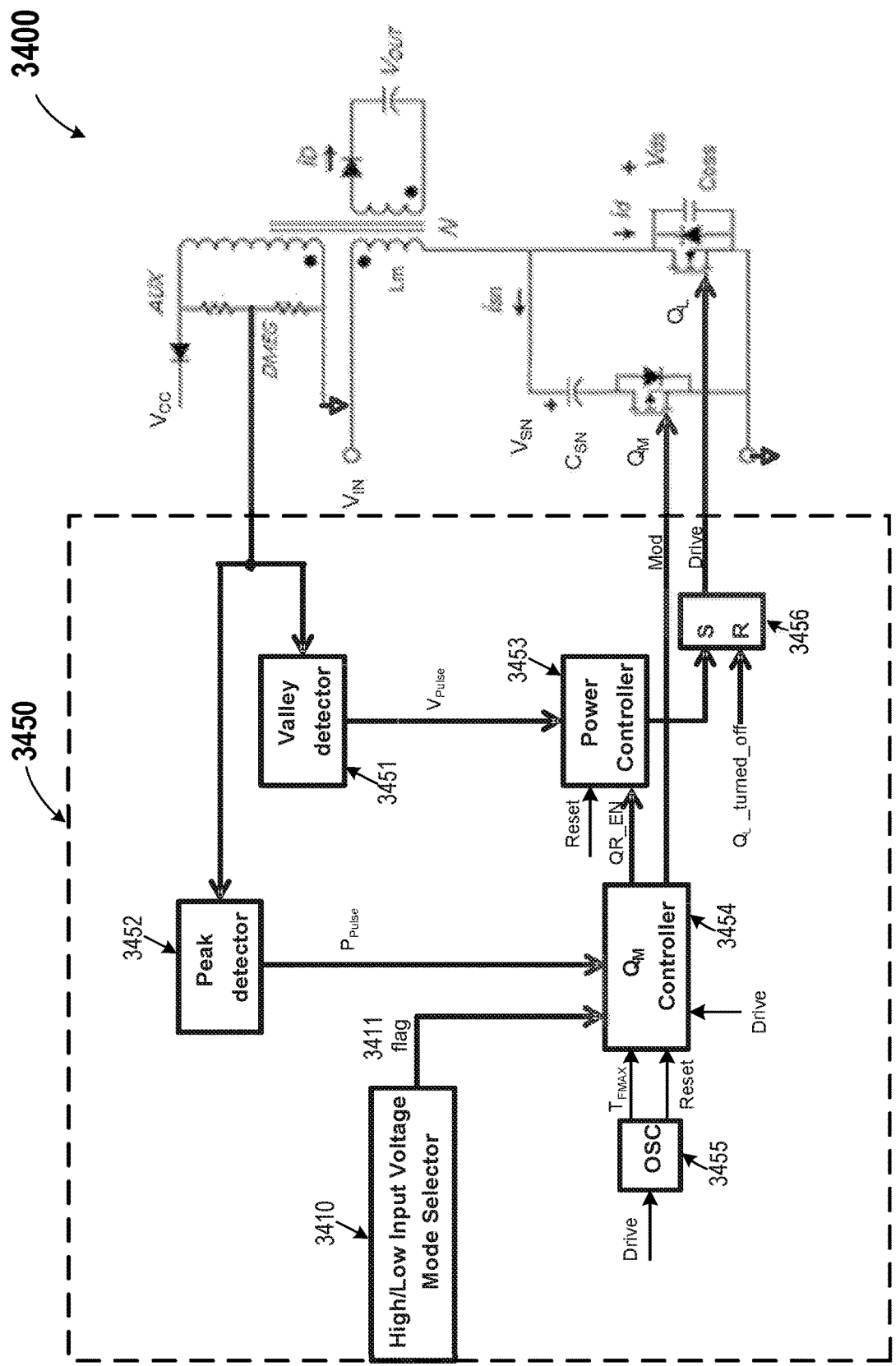
FIG. 34 is a simplified schematic diagram of a power converter that embodies certain aspects of this invention.

FIG. 34 is a simplified schematic diagram of a power converter that embodies certain aspects of this invention. Power converter 3400 includes many components similar to those in converter 2100 in FIG. 21 and converter 100 of FIG. 1. Therefore, detailed descriptions of the common components and operations are omitted here. It is noted that, in power converter 3400, controller circuit 3450 includes a high/low input voltage mode selector 3410, which provides a signal "flag" to modulation controller 3454 for changing the operating mode of the flyback system between low input voltage mode and high input voltage mode depending on the input voltage. As a result, the switching loss or conduction loss of the power transistor is reduced and power efficiency can be improved.

Mode selector 3410 in control circuit 3450 detects the input voltage of the system and sends a "flag" signal 3411 that determines the operating mode. In a high input voltage mode, the modulation switch $Q_M$ is turned on during a discontinuous time to generate the negative current $i_m(-)$ on $L_m$ for reducing switching loss of $Q_L$. In contrast, in a low input voltage mode, the modulation switch $Q_M$ is turned on during demagnetization-time to release the leakage energy stored in $C_{SN}$ to the output. Control circuit 3450 also includes a valley detector 3451, a peak detector 3452, a power controller 3453, a modulation controller 3454 (labeled as $Q_M$ controller), an oscillator 3455, and a flipflop 3456. The functions of these components are described below.

Figure 35:
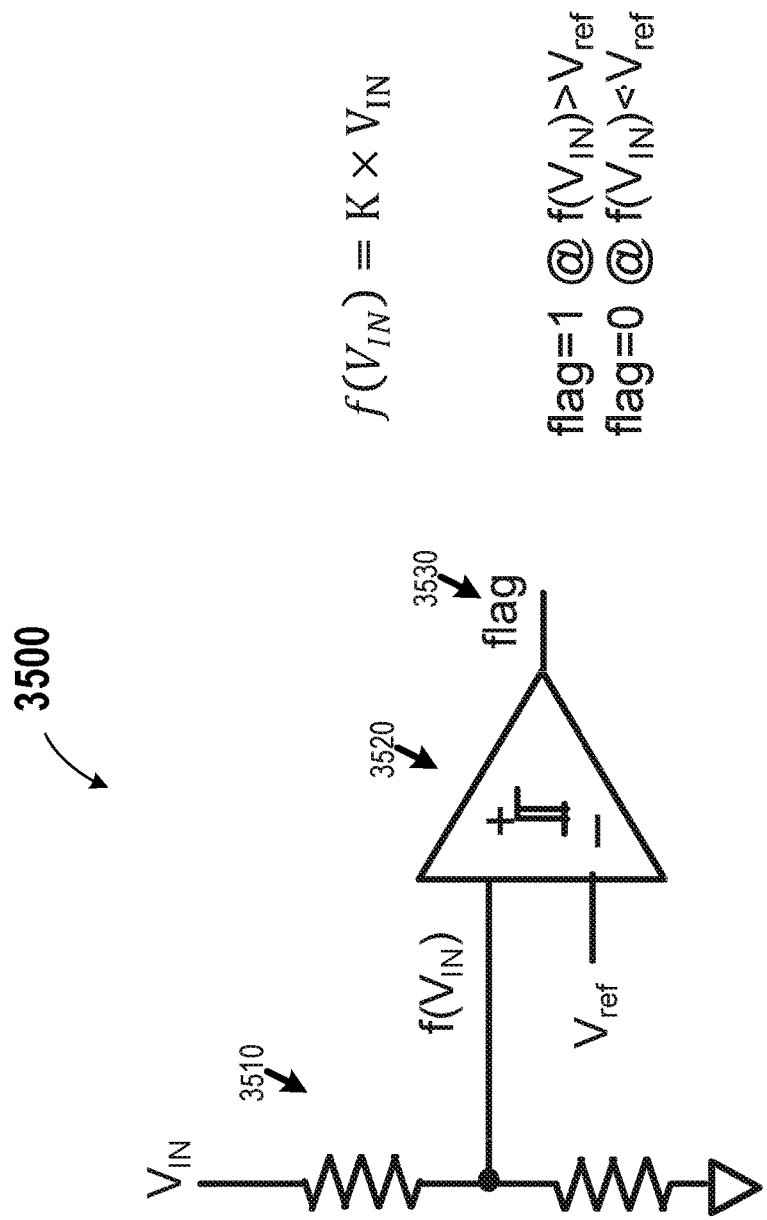
FIG. 35 is a simplified schematic diagram for a mode selector in power converter 3400 of FIG. 34 that embodies certain aspects of this invention.

FIG. 35 is a simplified schematic diagram for a mode selector that embodies certain aspects of this invention. As shown in FIG. 35, mode selector 3500 is an example of a mode selector that can be used as mode selector 3410 in power converter 3400 of FIG. 34. As shown, mode selector 3500 includes a voltage divider 3510 for sensing the input voltage $V_{IN}$ and a comparator 3520 for outputting a signal 3530, labeled "flag" in FIG. 35. The signal 3530, labeled "flag," indicates whether the input voltage $V_{IN}$ is high or low, and is used for changing the operating mode of the controller. As shown in FIG. 35, $f(V_{IN})$ is a sampled value of input voltage $V_{IN}$ and $V_{ref}$ is a reference voltage. The output of comparator 3520 sets the signal "flag" to 1, if $V_{IN}$ is greater than $V_{ref}$, and sets the signal "flag" to 0, if $V_{IN}$ is less than $V_{ref}$. As an example, the power converter can operate with an input voltage of either 110V or 220V. In this case, the parameters in the voltage divider and the reference voltage can be selected such that the power converter operates in the low input voltage mode if $V_{IN}$ is less than, e.g., 150V, and in the high input voltage mode, otherwise.

Figure 36:
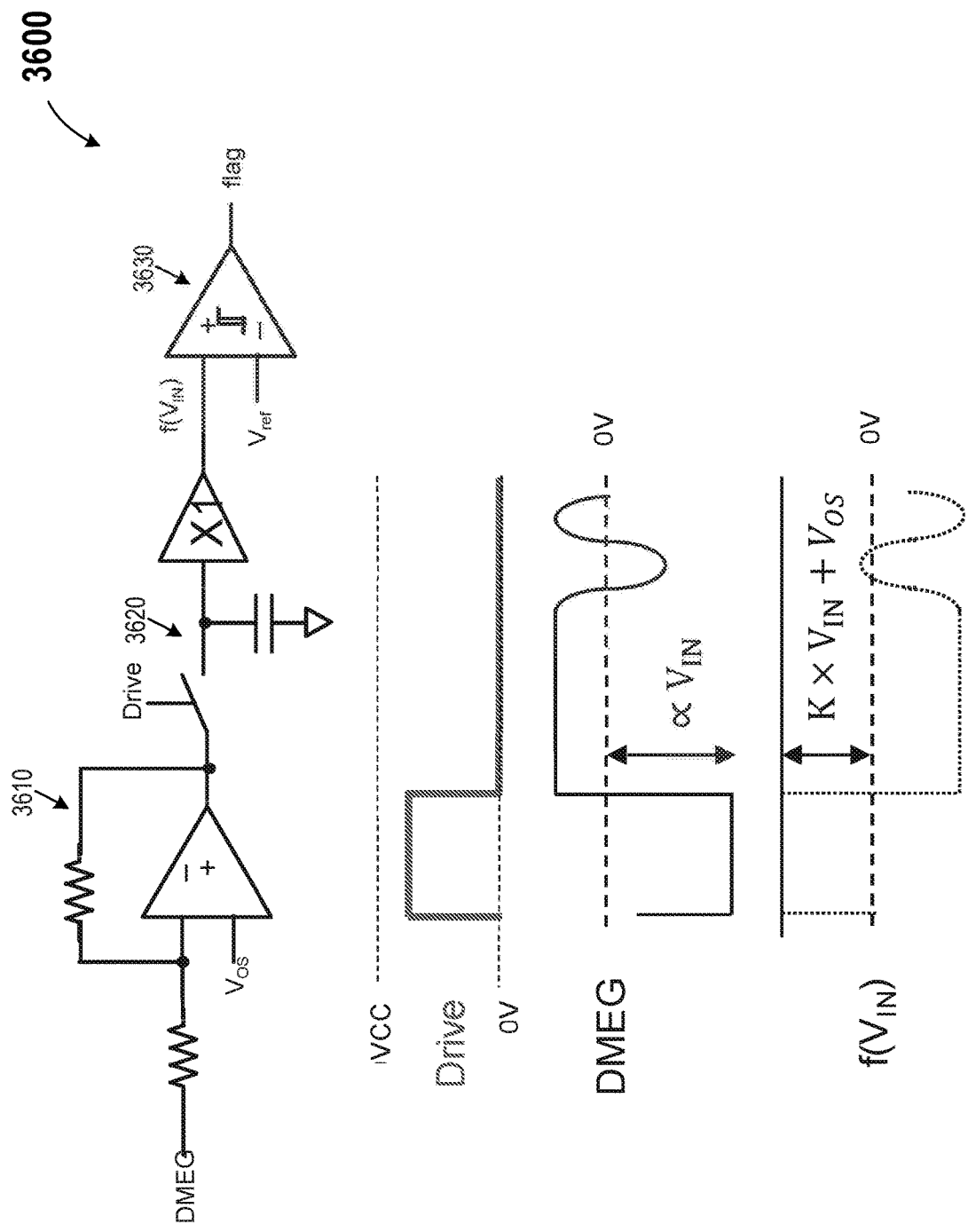
FIG. 36 is a simplified schematic diagram for an alternative mode selector in power converter 3400 of FIG. 34 that embodies certain aspects of this invention.

FIG. 36 is a simplified schematic diagram for an alternative mode selector that embodies certain aspects of this invention. As shown in FIG. 36, mode selector 3600 is another example of a mode selector that can be used as mode selector 3410 in power converter 3400 of FIG. 34. As shown in FIG. 36, mode selector 3600 obtains the information of input voltage through the auxiliary winding, for example, the DMEG signal in power converter 3400 in FIG. 34. Mode selector 3600 includes an inverting amplifier 3610 to sense the signal on DMEG during the on-time of the power switch $Q_L$, as shown by the Drive signal. Mode selector 3600 also includes a sample and hold circuit 3620 to provide an output signal $f(V_{IN})$, which is an input to a comparator 3630 to generate the "flag" signal for determining the operating mode of the converter.

Figure 37:
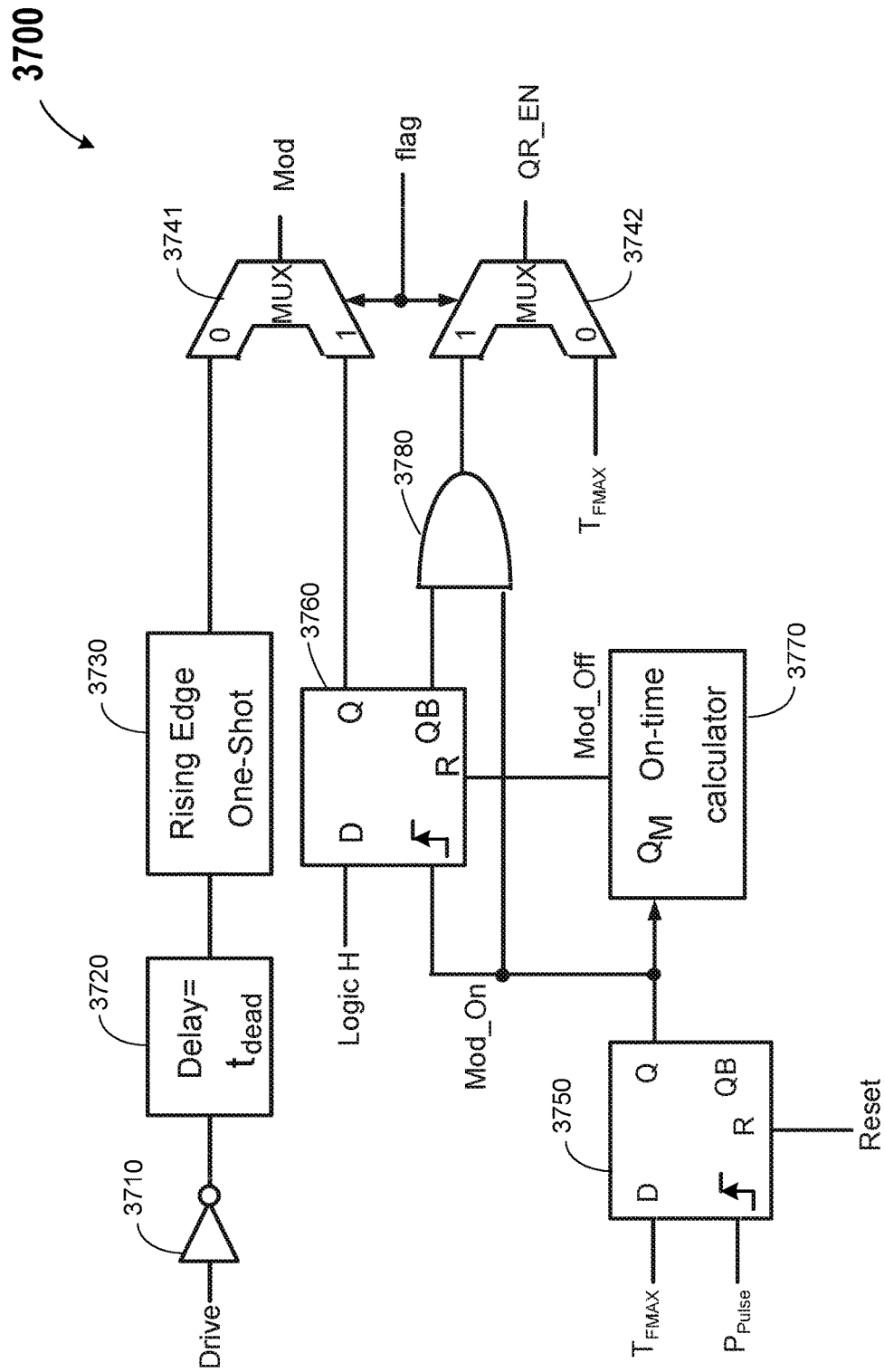
FIG. 37 is a simplified schematic diagram for an example of the $Q_M$ controller in power converter 3400 of FIG. 34 that embodies certain aspects of this invention.

FIG. 37 is a simplified schematic diagram for an example of the $Q_M$ controller in power converter 3400 of FIG. 34 that embodies certain aspects of this invention. As shown in FIG. 37, modulation controller 3700, also referred to as $Q_M$ controller, includes an inverter 3710, a delay circuit 3720, a one-shot circuit 3730, multiplexers 3741 and 3742, a first D-flipflop 3750, a second D-flipflop 3760, a $Q_M$ on-time calculator 3770, and an AND circuit 3780. The $Q_M$ controller 3700 provides a Mod signal to drive the modulation switch $Q_M$, and a QR_EN signal to enable the power controller block 3453 in flyback controller 3400 in FIG. 34. Two multiplexers are controlled by the flag signal to select the output signals Mod and QR_EN for different operating modes of the flyback system.

Figure 38:
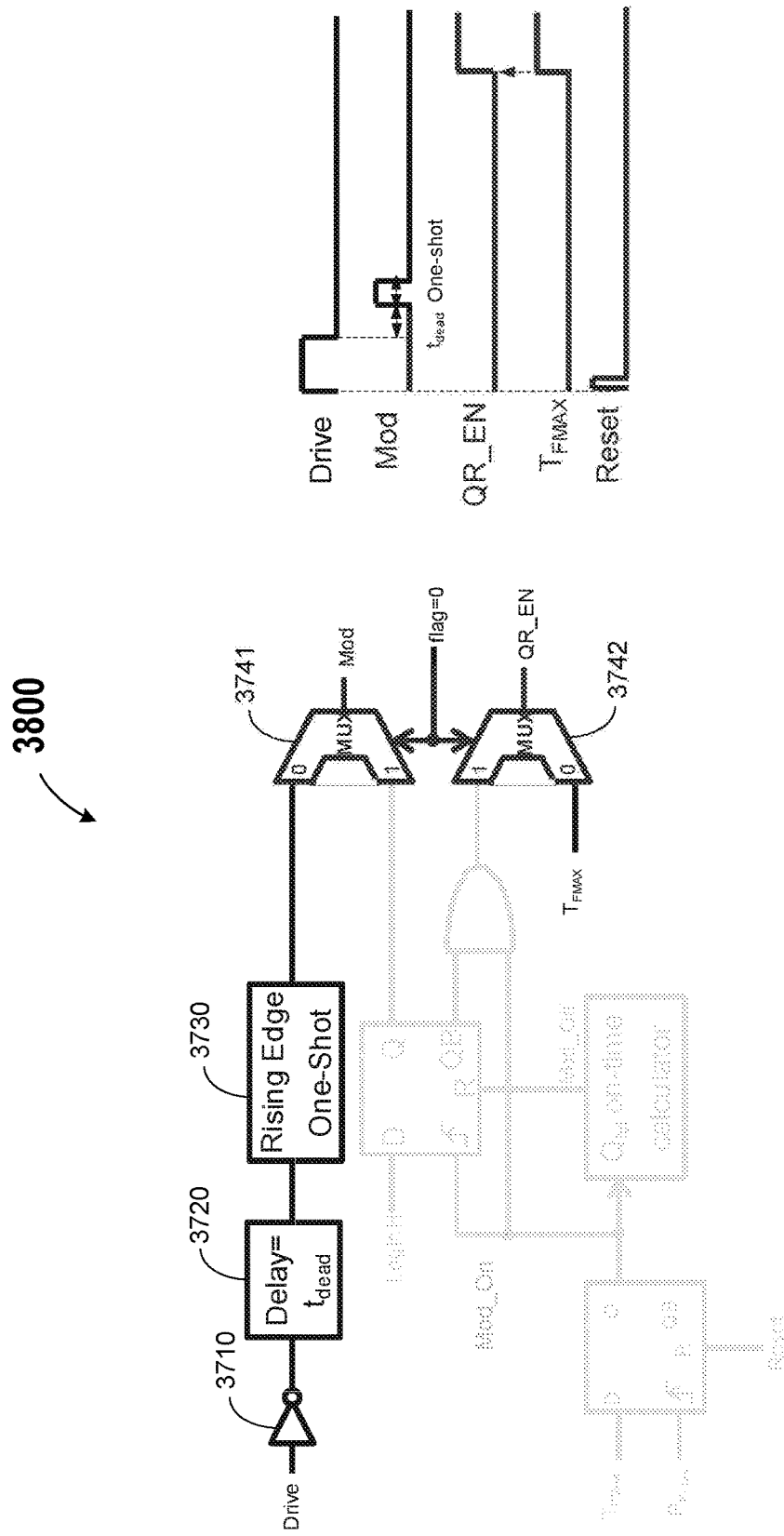
FIG. 38 shows a portion of $Q_M$ controller 3700 of FIG. 37 and signal waveforms for operation in low input voltage mode that embodies certain aspects of this invention.

FIG. 38 shows a portion of modulation controller 3700 of FIG. 37 and signal waveforms for operation in low input voltage mode that embodies certain aspects of this invention. Modulation controller 3700 (also referred to as $Q_M$ controller) is set in the low input voltage mode, when the flag signal is 0. In low input voltage mode, modulation switch $Q_M$ is turned on during the demagnetization-time to release the leakage inductance energy stored in $C_{SN}$ to the output. FIG. 38 shows a portion of modulation controller 3700, labeled circuit block 3800, for turning on and off the modulation switch $Q_M$ in low input voltage mode. As shown in FIG. 38, circuit block 3800 includes inverter 3710, delay circuit 3720, one-shot circuit 3730, and multiplexers 3741 and 3742 in modulation controller 3700 in FIG. 37. The modulation switch $Q_M$ is turned on by the Mod signal right after the power switch $Q_L$ is turned off by the Drive signal and a small dead time $t_{dead}$. A small on-time of $Q_M$ is generated by the one-shot circuit 3730. Since the modulation switch $Q_M$ is turned on and turned off quickly after the beginning of demagnetization-time, the on-time duration of $Q_M$ is in the demagnetization-time, and the $Q_M$ is turned off before the maximum frequency period $T_{FMAX}$. In this example, in the low input voltage mode, the modulation controller is configured to turn on the modulation switch after a pre-set delay time after the power switch is turned off in every switching cycle of the power converter. $t_{dead}$ is selected to ensure $Q_M$ is turned on in the demagnetization-time. For example, in an application with switching frequencies in the 60-70 kHz, the discharge time or demagnetization-time is 2-20 μsec, and the delay time can be 200-500 nsec. In applications with higher switching frequencies, the delay time can be adjusted accordingly.

Figure 39:
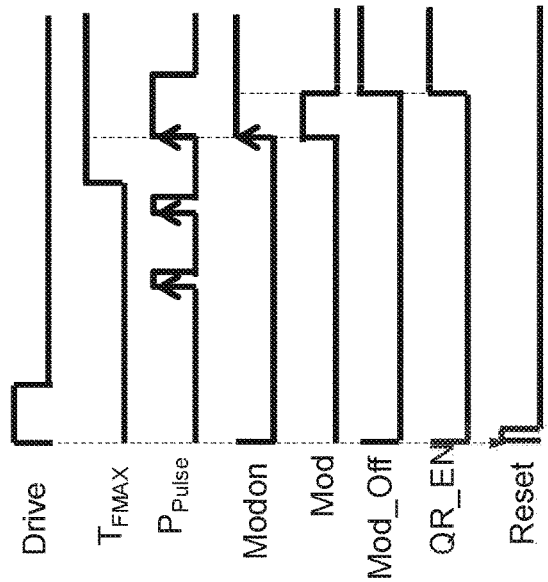
FIG. 39 shows another portion of $Q_M$ controller 3700 of FIG. 37 and signal waveforms for operation in high input voltage mode that embodies certain aspects of this invention.
Figure 39:
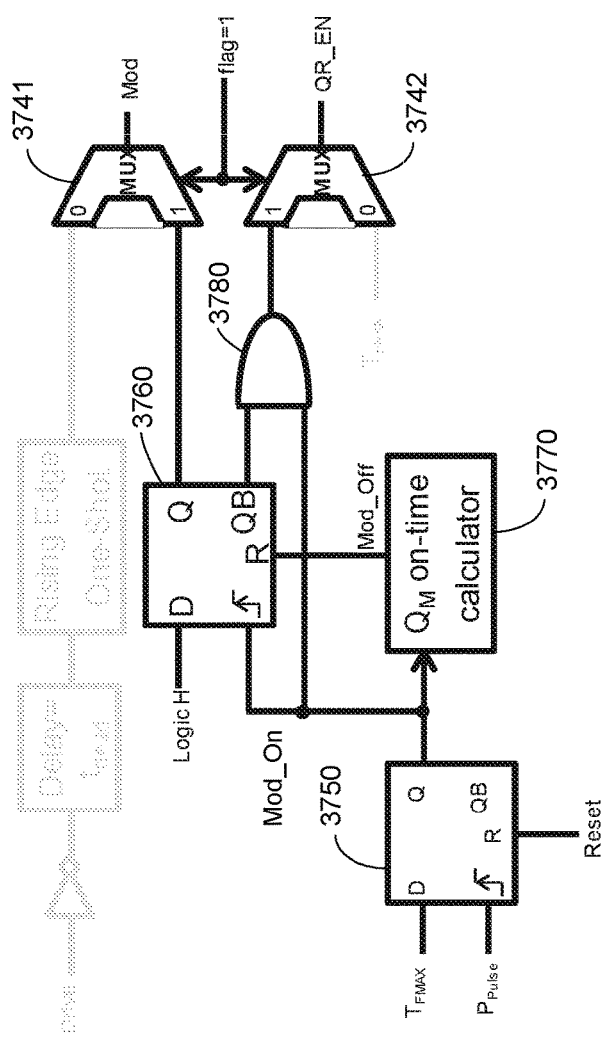

FIG. 39 shows another portion of $Q_M$ controller 3700 of FIG. 37 and signal waveforms for operation in high input voltage mode that embodies certain aspects of this invention. Modulation controller 3700 (also referred to as $Q_M$ controller) is set in the high input voltage mode, when the flag signal is 1. In the high input voltage mode, modulation switch $Q_M$ is turned on during the continuous time to release the leakage inductance energy stored in $C_{SN}$ to the output. FIG. 39 shows a portion of modulation controller 3700, labeled circuit block 3900, for turning on and off the modulation switch $Q_M$ in high input voltage mode. As shown in FIG. 39, circuit block 3900 is similar to jitter controller 2400 illustrated in FIG. 24, but without the time-varying components in the on-time calculator intended for introducing the jitters. As shown, circuit block 3900 includes the first D-flipflop 3750, the second D-flipflop 3760, $Q_M$ on-time calculator 3770, AND circuit 3780, and multiplexers 3741 and 3742 in modulation controller 3700 in FIG. 37. Their functions are similar to the corresponding components in FIG. 24.

FIG. 39 also shows the waveforms of the $Q_M$ controller in high input voltage mode when the flag signal is 1. In high input voltage mode, $Q_M$ is turned on during the discontinuous time to induce a negative current on $L_m$ before the power switch $Q_L$ is turned on. In this embodiment, $Q_M$ is turned on at the first peak of the resonant waveform after the maximum frequency period $T_{FMAX}$, and is turned off by a $Q_M$ on-time calculator. After $Q_M$ is turned off, the QR_EN signal is set high to enable the power controller block, which determines the turn on timing of the power switch $Q_L$.

Figure 40A:
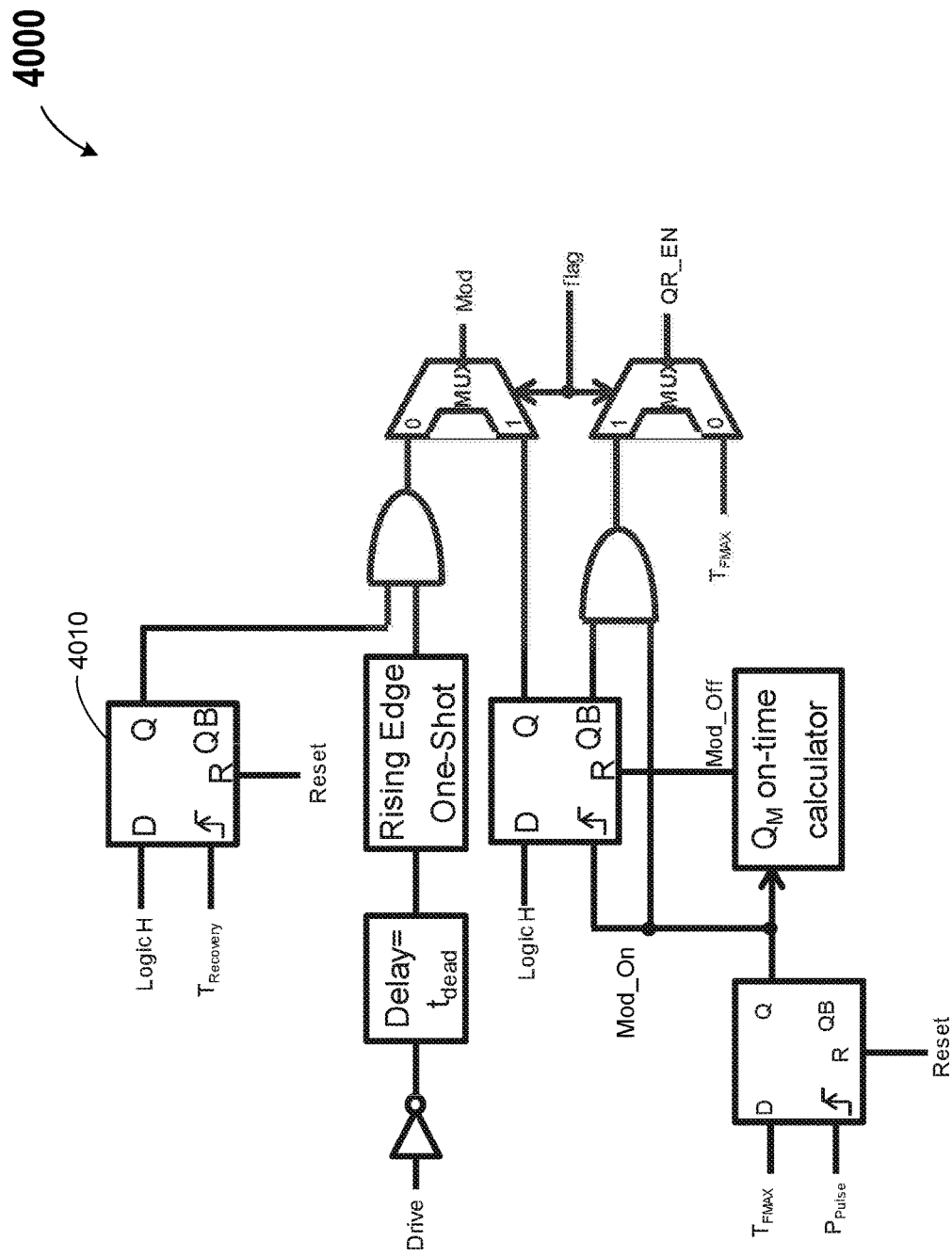
FIG. 40A is a simplified block diagram of an alternative $Q_M$ controller in power converter 3400 of FIG. 34.
Figure 40B:
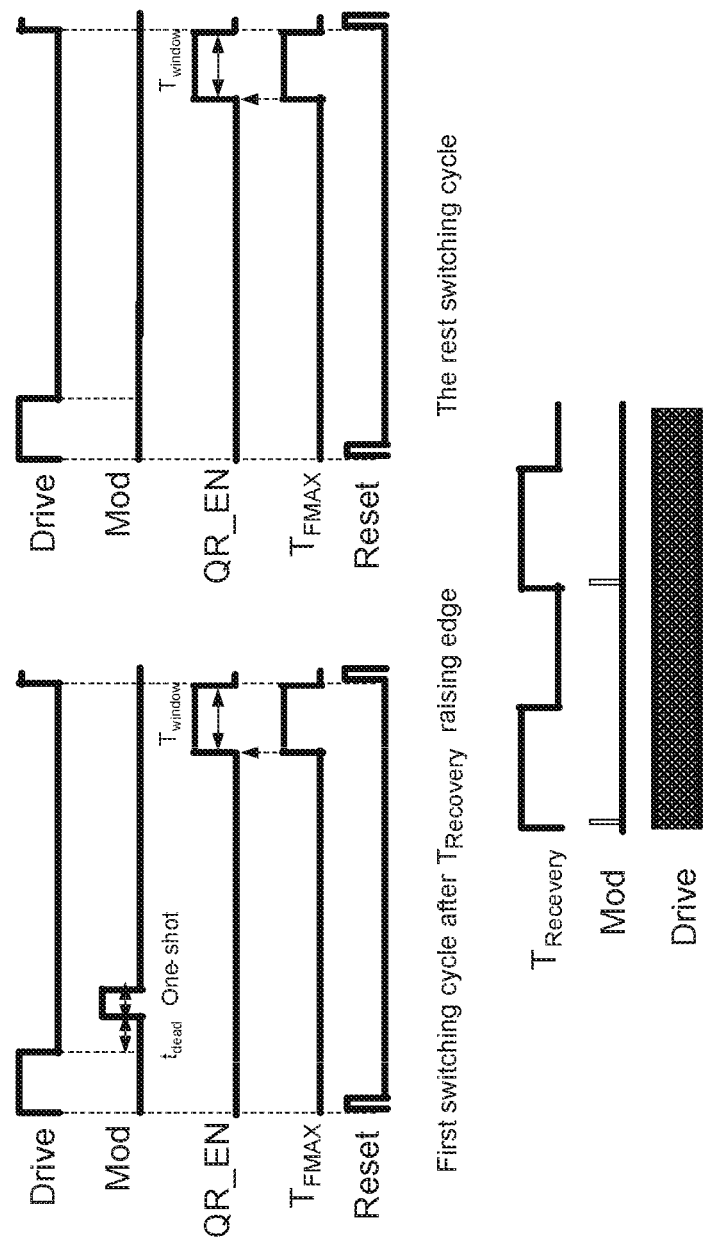
FIG. 40B illustrates corresponding signal waveforms for operation in low input voltage mode that embodies certain aspects of this invention.

FIG. 40A is a simplified block diagram of an alternative modulation controller for a multi-mode flyback system, and FIG. 40B illustrates corresponding signal waveforms for operation in a low input voltage mode that embodies certain aspects of this invention. Modulation controller 4000 in FIG. 40 is similar to modulation controller 3700 in FIG. 37. One difference is that modulation controller 4000 includes a low-frequency enable signal to block most of the Mod driving signal in low input voltage mode. Since the function of $Q_M$ is to release the leakage energy stored in $C_{SN}$ to output, in some cases, $Q_M$ does not need to be turned on in each switching cycle. In this embodiment, the $Q_M$ is turned on in the first switching cycle after the rising edge of a timing signal $T_{Recovery}$. The timing signal can be selected to extend through multiple switching cycles of the power converter. Therefore, the modulation controller is configured to turn on the modulation switch after the pre-set delay time after the power switch is turned off once in multiple switching cycles of the power converter. During the other switching cycles, $Q_M$ stays open to save switching loss and the leakage energy is stacked into $C_{SN}$ through the body diode of $Q_M$. This function is implemented with a D flipflop 4010 with an input Logic high and the timing signal $T_{Recovery}$. FIG. 40B shows various timing signals for modulation controller 4000.

Figure 41:
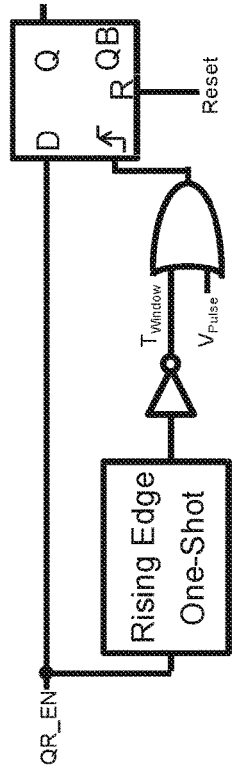
FIG. 41 illustrates a simplified block diagram of a power controller and its operating waveforms in different operating mode that embodies certain aspects of this invention.
Figure 41:
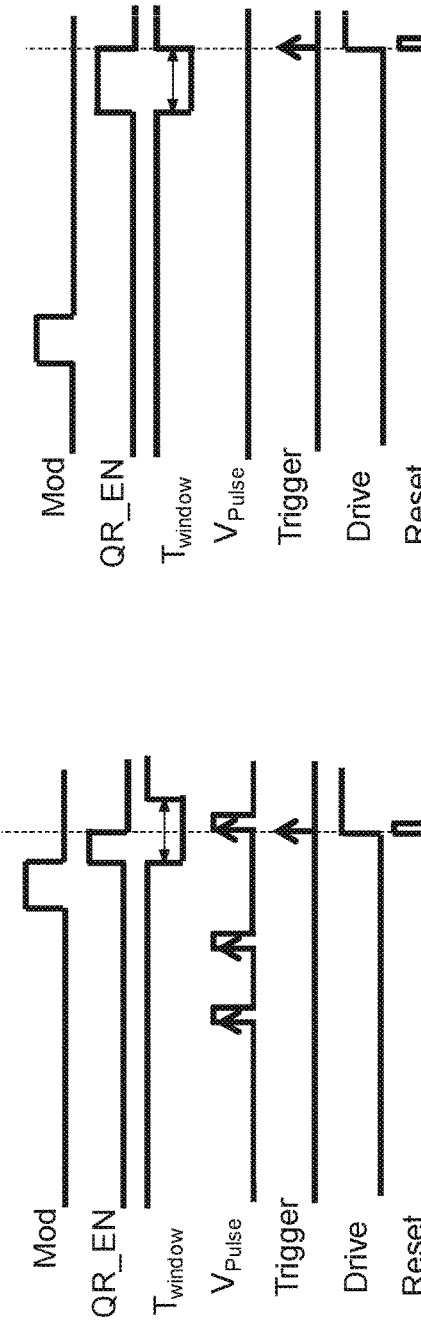

FIG. 41 illustrates a simplified block diagram of a power controller and its operating waveforms in different operating mode that embodies certain aspects of this invention. As shown in FIG. 41, power controller 4100 is an example of a power controller that can be used as power controller 3453 in power converter 3400 in FIG. 34. Many components and signals in FIG. 41 are similar to those in the examples described above. After the QR_EN is set to high, the power controller generates duration $T_{window}$ to detect the $V_{Pulse}$ signal. If the system is in a high input voltage mode or low input voltage mode with light load, the power controller will send the Trigger signal to turn on $Q_L$ at the rising edge of the first $V_{Pulse}$ signal in $T_{window}$. If the system is in low input voltage mode with a heavy load, there will be no $V_{Pulse}$ signal and the power controller will send the Trigger signal at the end of $T_{window}$ to turn on $Q_L$. Thus, the flyback system will be operated in continuous conduction mode (CCM).

Figure 42:
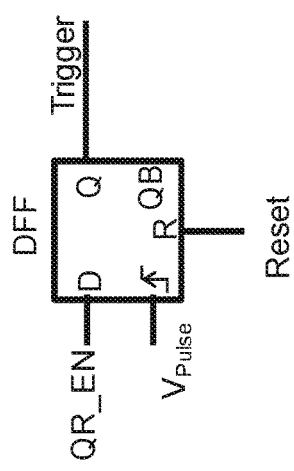
FIG. 42 illustrates a simplified block diagram of another example a power controller and its operating waveforms in different operating mode that embodies certain aspects of this invention.
Figure 42:

FIG. 42 illustrates a simplified block diagram of another example of a power controller and its operating waveforms in different operating mode that embodies certain aspects of this invention. As shown in FIG. 42, power controller 4200 is another example of a power controller that can be used as power controller 3453 in power converter 3400 in FIG. 34. With this power controller, the flyback system will not enter continuous conduction mode (CCM). In low input voltage mode, the power controller keeps waiting until the first quasi-resonant (QR) valley arrives and sends the Trigger signal to turn on $Q_L$. In High Input Voltage mode, the power controller will turn on the $Q_L$ after the modulation switched $Q_M$ inducing proper $i_m(-)$.

Figure 43:
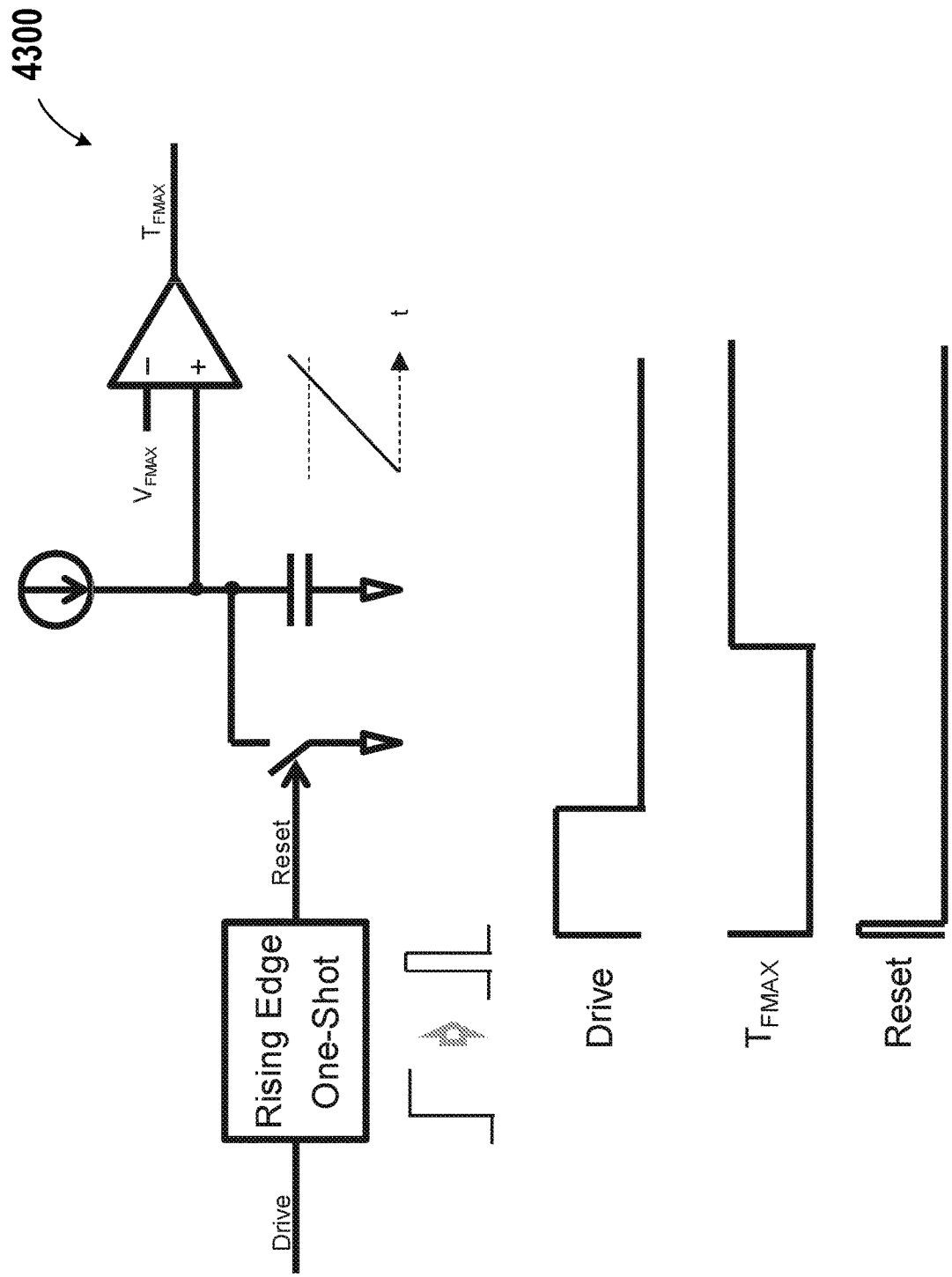
FIG. 43 illustrates a simplified block diagram of an oscillator block that embodies certain aspects of this invention.

FIG. 43 illustrates a simplified block diagram of an oscillator block that embodies certain aspects of this invention. As shown in FIG. 43, oscillator 4300 is an example of an oscillator that can be used as oscillator 3455 in power converter 3400 in FIG. 34. The oscillator block 4300 generates a global signal Reset to inform the beginning of a new switching cycle, and generates a blanking time signal $T_{FMAX}$ for the $Q_M$ controller. Since the switching cycle is ended after the operation of $Q_M$ controller and power controller, the $T_{FMAX}$ limits the lower bound of the system switching period.

Figure 44:
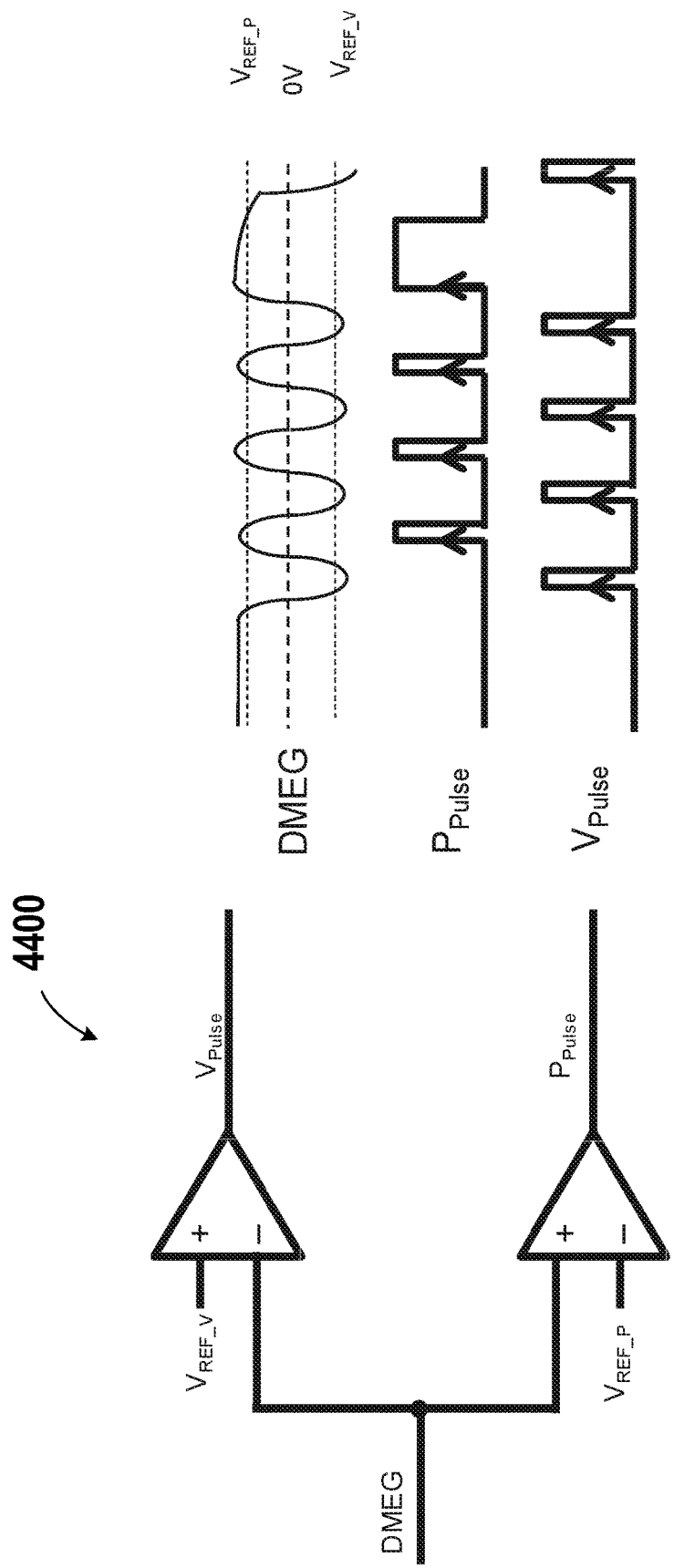
FIG. 44 illustrates a simplified block diagram of the peak detector and valley detector and the associated waveforms that embodies certain aspects of this invention.

FIG. 44 illustrates a simplified block diagram of the peak detector and valley detector and the associated waveforms that embodies certain aspects of this invention. As shown in FIG. 44, circuit 4400 is an example of a peak detector and valley detector that can be used as peak detector 3452 and valley detector 3451 in power converter 3400 in FIG. 34. FIG. 44 shows an embodiment which detects peaks and valleys of $V_{DS}$ through DMEG voltage during $t_{DIS}$. The rising edges of $P_{Pulse}$ and $V_{Pulse}$ are sent to turn on $Q_M$ at peak of $V_{DS}$ and turn on QL at valley of $V_{DS}$.

Figure 45:
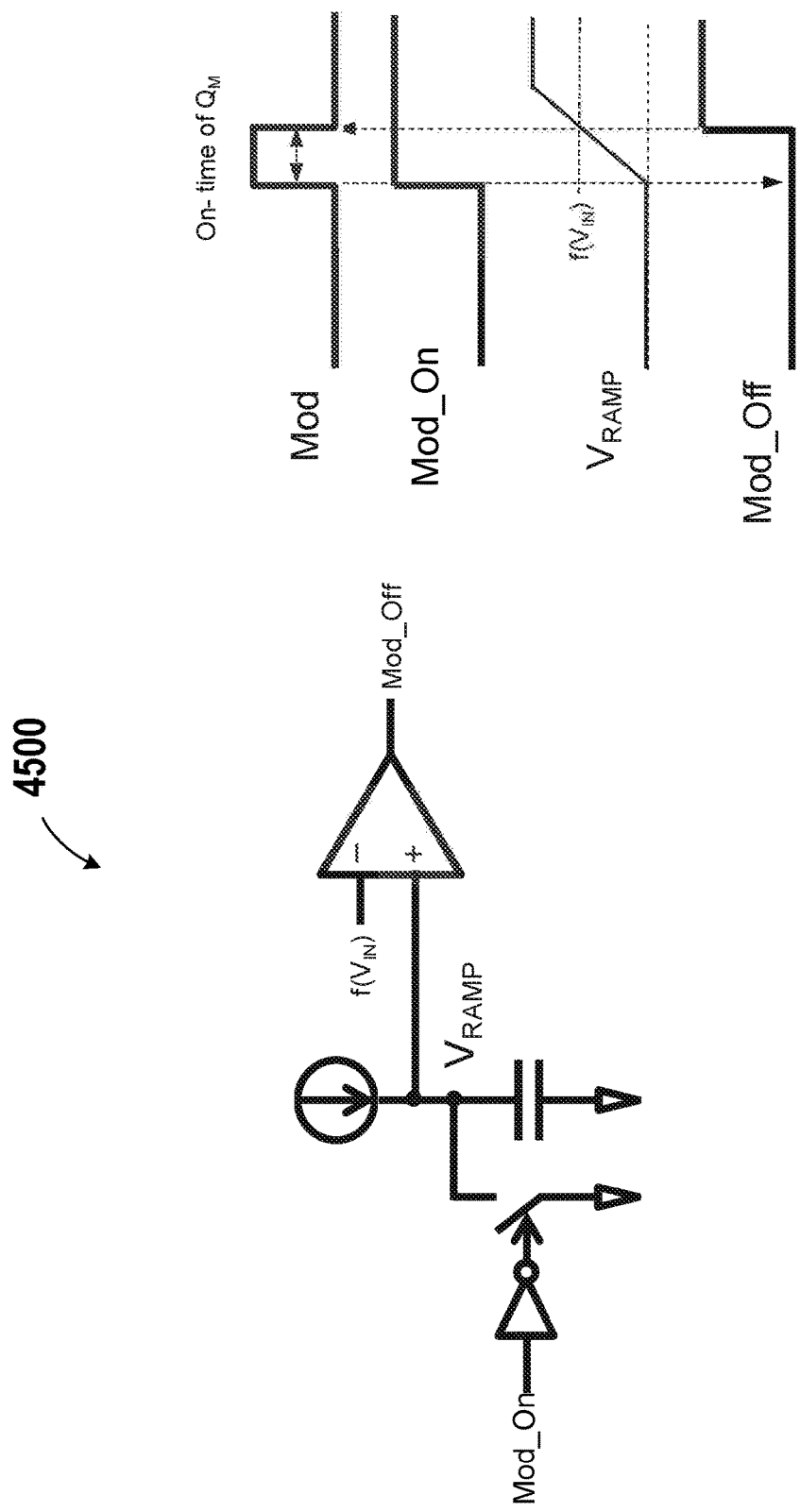
FIG. 45 illustrates a simplified block diagram of an embodiment of a $Q_M$ on-time calculator and the associated waveforms that embodies certain aspects of this invention.

FIG. 45 illustrates a simplified block diagram of an embodiment of a $Q_M$ on-time calculator and the associated waveforms that embodies certain aspects of this invention. As shown in FIG. 45, circuit 4500 is an example of a $Q_M$ on-time calculator that can be used as the $Q_M$ on-time calculator in modulation converter 3700 in FIG. 37. $Q_M$ on-time calculator 4500 determines the on-time of $Q_M$ in high input voltage mode for specific purpose. With this embodiment, the on-time of $Q_M$ is increasing with the input voltage $V_{IN}$, which can induce larger negative $i_m(-)$ corresponding to larger $V_{DS}$ voltage.

Figure 46:
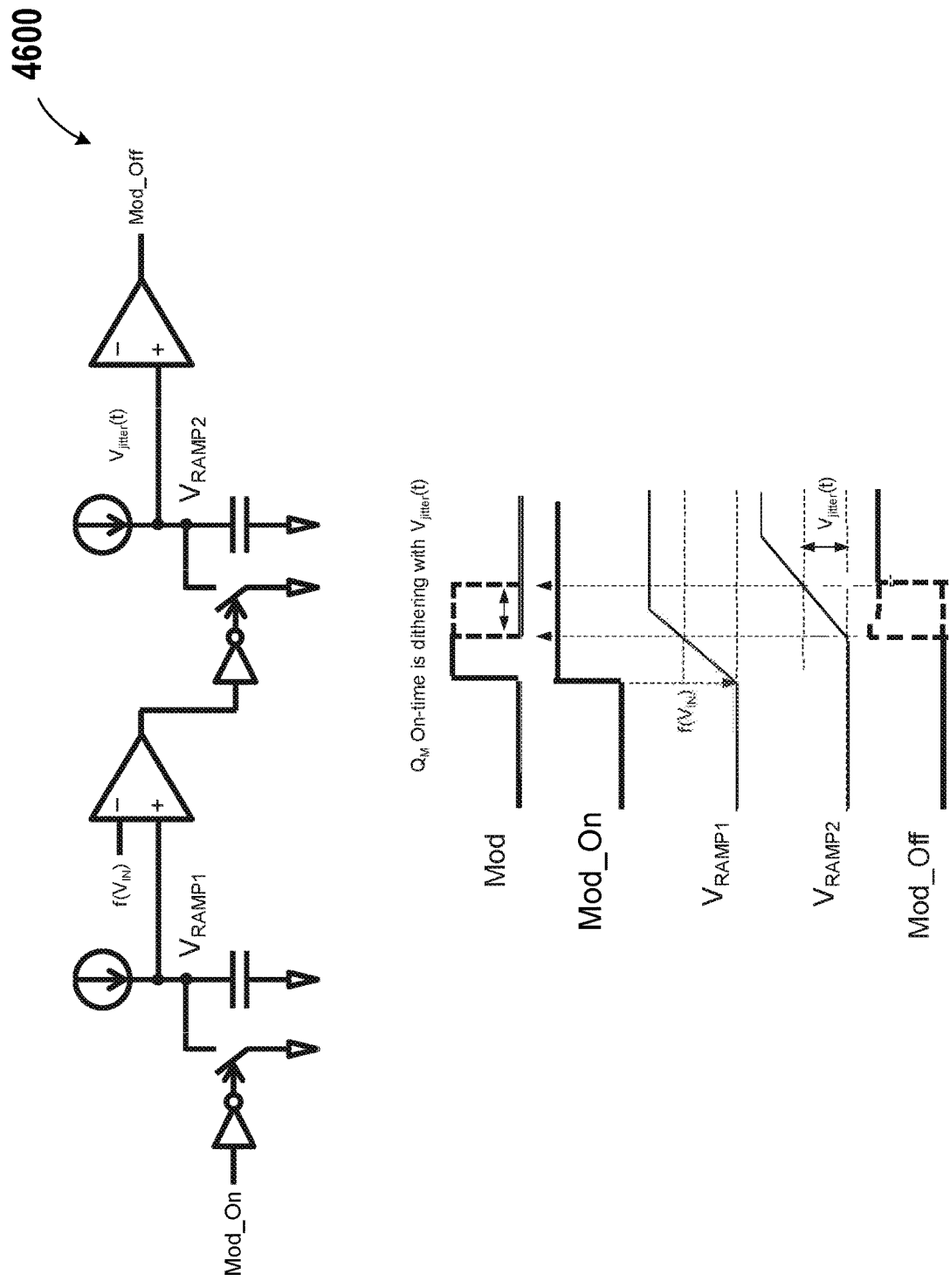
FIG. 46 illustrates a simplified block diagram of another embodiment of a $Q_M$ on-time calculator and the associated waveforms that embodies certain aspects of this invention.

FIG. 46 illustrates a simplified block diagram of another embodiment of a $Q_M$ on-time calculator and the associated waveforms that embodies certain aspects of this invention. As shown in FIG. 46, circuit 4600 is an example of another $Q_M$ on-time calculator that can be used as the $Q_M$ on-time calculator in modulation converter 3700 in FIG. 37. In $Q_M$ on-time calculator 4600, the on-time of $Q_M$ includes an offset period determined by $V_{IN}$ and a time varying period. This embodiment can generate a time varying $Q_M$ on-time in high input voltage mode for both $V_{DS}$ switching loss reduction and system switching frequency jitter.

Figure 47:
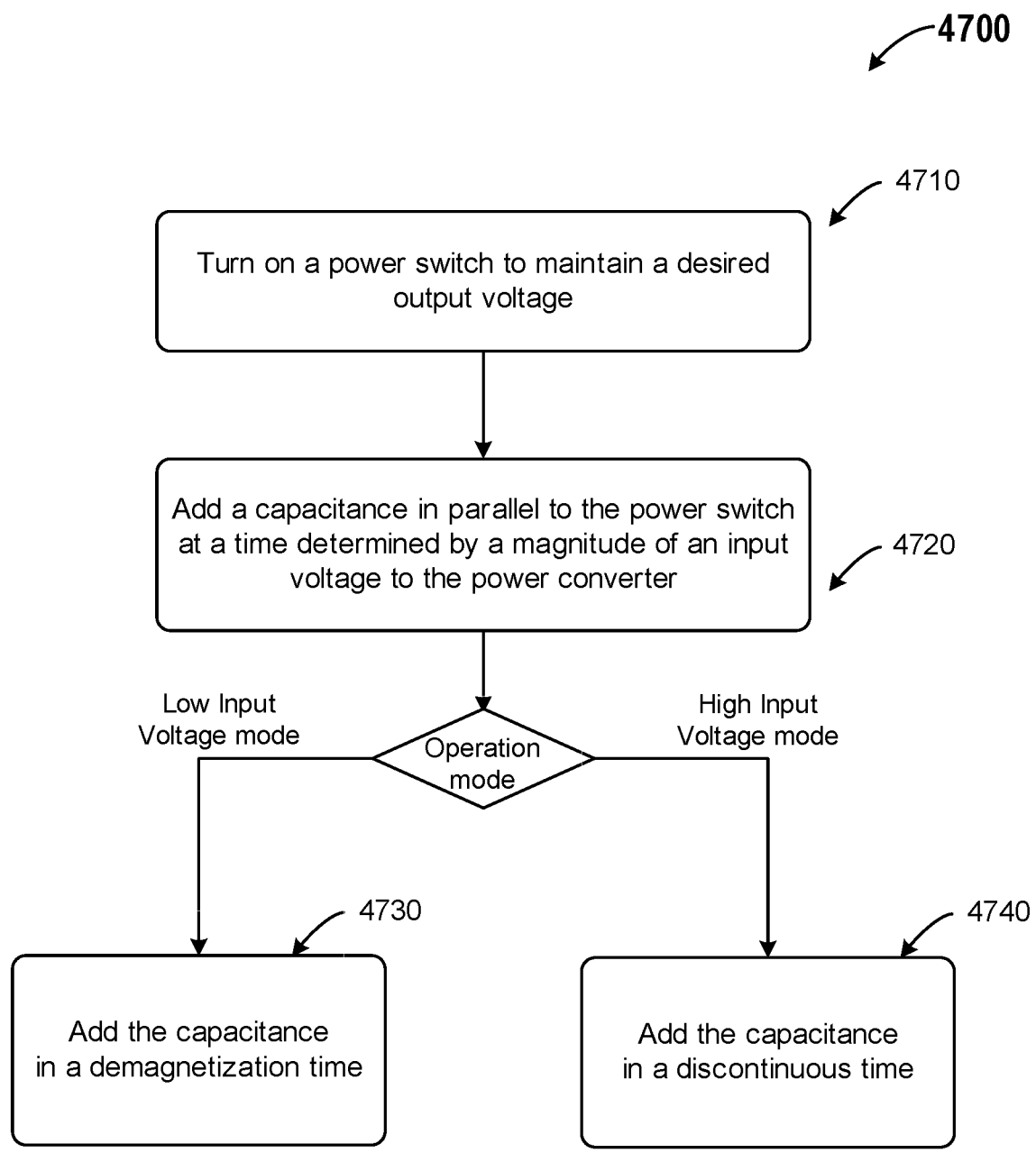
FIG. 47 is a simplified flowchart that illustrates a method for controlling a power converter that embodies certain aspects of this invention.

FIG. 47 is a simplified flowchart that illustrates a method for controlling a power converter that embodies certain aspects of this invention. As shown in FIG. 47, method 4700 for controlling a power converter includes, at 4710, turning on a power switch to maintain a desired output voltage, wherein the power switch is coupled to a primary winding to control a primary current flow and the output voltage is provided by a secondary winding. Method 4700 also includes, at 4720, adding a capacitance in parallel to the power switch at a time determined by a magnitude of an input voltage to the power converter. Here, the timing of adding the capacitance depends on the operation mode of the power controller. In a low input voltage mode, at 4730, the capacitance is added in a demagnetization-time during which the secondary winding discharges. In a high input voltage mode, at 4740, the capacitance is added in a discontinuous time.

In the examples described above, adding the capacitance in parallel to the power switch comprises turning on a modulation switch that is coupled in series with a capacitor. The capacitor and the modulation switch are coupled in parallel with the power switch.

In another example described above, in the low input voltage mode, adding the capacitance comprises turning on the modulation switch after a pre-set delay time after the power switch is turned off. In the high input voltage mode, adding the capacitance includes turning on the modulation switch at a first peak point in a resonant waveform in the discontinuous time after a blanking time, and turning off the modulation switch after a time period based on a time-varying function to vary a turn-on-time of the modulation switch.

What is claimed is:

1. A power converter, comprising:
   a transformer having a primary winding for coupling to an input voltage of the power converter, a secondary winding providing an output voltage of the power converter, and a sensing circuit for providing a sensing signal through auxiliary winding,
   a power switch for coupling to the primary winding of the power converter to control a primary current flow;
   a capacitor and a modulation switch coupled in parallel to the power switch, the modulation switch being coupled in series with the capacitor; and
   a control circuit, comprising:
     a power controller for turning on the power switch to maintain a desired output voltage;
     a mode selection circuit for determining the operating mode depending on the magnitude of the input voltage of the power converter, in which the mode selection circuit compares the input voltage of the power converter with a reference voltage and provides a mode selection signal that indicates a high input voltage mode if the input voltage of the power converter is higher than the reference voltage; and a low input voltage mode if the input voltage of the power converter is lower than the reference voltage; and a modulation controller configured to turn on the modulation switch to activate the capacitor according to the mode selection signal, wherein:
when the power converter is operated in the low input voltage mode, the modulation switch is turned on in a demagnetization-time during which the secondary winding discharges; and
when the power converter is operated in the high input voltage mode, the modulation switch is turned on in a discontinuous time during which no current flows in the transformer and the sensing signal is characterized by a resonant waveform.

2. The power converter of claim 1, wherein the modulation controller varies a turn-on-time of the modulation switch to add a frequency jitter to a switching frequency of the power converter.

3. The power converter of claim 1, wherein the modulation controller comprises a delay circuit and a one-shot circuit.

4. The power converter of claim 3, wherein, in the low input voltage mode, the modulation controller is configured to turn on the modulation switch after a pre-set delay time after the power switch is turned off in every switching cycle of the power converter.

5. The power converter of claim 3, wherein, in the low input voltage mode, the modulation controller is configured to turn on the modulation switch after a pre-set delay time after the power switch is turned off once in multiple switching cycles of the power converter.

6. The power converter of claim 1, wherein the control circuit further comprises:
a valley detector for detecting valley points in the resonant waveform in the sensing signal during the discontinuous time; and
a peak detector for detecting peak points in the resonant waveform in the sensing signal during the discontinuous time.

7. The power converter of claim 6, wherein, in the high input voltage mode, the modulation controller is configured to:
turn on the modulation switch at a first peak point in the resonant waveform after a blanking time; and
turn off the modulation switch after a time period based on a time-varying function to vary a turn-on-time of the modulation switch.

8. The power converter of claim 7, wherein the power controller is configured to turn on the power switch at a valley point of the resonant waveform after a preset off time of the modulation switch.

9. The power converter of claim 8, wherein the power controller is configured to turn off the power switch based on a constant on-time, a feedback signal, or a peak primary current sense signal.

10. A control circuit for a power converter, comprising:
a valley detector for providing valley pulse signals at valley points in a resonant waveform in the sensing signal during the discontinuous time;
a peak detector for providing peak pulse signals at peak points in a resonant waveform in the sensing signal during the discontinuous time;
a power controller for turning on a power switch to maintain a desired output voltage, wherein the power switch is coupled to a primary winding of the power converter to control a primary current flow, and the output voltage is provided by a secondary winding, and a sensing circuit provides a sensing signal through an auxiliary winding;

a modulation controller, coupled in parallel to the power switch, configured to activate a modulation capacitance at a time determined by the magnitude of an input voltage of the power converter and to turn on a modulation switch that is coupled in series with a capacitor, wherein the capacitor and the modulation switch are coupled in parallel with the power switch, wherein:
when the power converter is operated in a low input voltage mode, the modulation switch is turned on in a demagnetization-time during which the secondary winding discharges; and
when the power converter is operated in a high input voltage mode, the modulation switch is turned on in a discontinuous time.

11. The control circuit of claim 10, wherein, in the high input voltage mode, the modulation controller is configured to:
turn on the modulation switch at a first peak point in the resonant waveform after a blanking time; and
turn off the modulation switch after a time period based on a time-varying function to vary a turn-on-time of the modulation switch.

12. The control circuit of claim 11, wherein the modulation controller is coupled to the valley detector, the peak detector, and an input voltage magnitude detector to provide a frequency jitter that includes a first portion that varies with the input voltage of the power converter and a second portion that is a time-varying function.

13. A control circuit for a power converter, comprising:
a power controller for turning on a power switch to maintain a desired output voltage, wherein the power switch is coupled to a primary winding of the power converter to control a primary current flow, and the output voltage is provided by a secondary winding, and a sensing circuit provides a sensing signal through an auxiliary winding; and
a modulation controller, comprising a delay circuit and a one-shot circuit, is configured to activate a modulation capacitance, coupled in parallel to the power switch, at a time determined by the magnitude of an input voltage of the power converter, wherein:
when the power converter is operated in a low input voltage mode, the modulation switch is turned on in a demagnetization-time during which the secondary winding discharges, wherein, in the low input voltage mode, the modulation controller is further configured to turn on the modulation switch after a pre-set delay time after the power switch is turned off; and
when the power converter is operated in a high input voltage mode, the modulation switch is turned on in a discontinuous time.

14. A power converter, comprising:
a transformer having a primary winding for coupling to an input voltage of the power converter, a secondary winding providing an output voltage of the power converter, and a sensing circuit for providing a sensing signal through auxiliary winding,
a power switch for coupling to the primary winding of the power converter to control a primary current flow;
a capacitor and a modulation switch coupled in parallel to the power switch, the modulation switch being coupled in series with the capacitor; and
a control circuit, comprising:
a power controller for turning on the power switch to maintain a desired output voltage;
a mode selection circuit for determining the operating mode depending on the magnitude of the input voltage of the power converter, in which the mode selection circuit compares the input voltage of the power converter with a reference voltage and provides a mode selection signal that indicates a high input voltage mode if the input voltage of the power converter is higher than the reference voltage; and a low input voltage mode if the input voltage of the power converter is lower than the reference voltage; and a modulation controller configured to turn on the modulation switch to activate the capacitor according to the mode selection signal, wherein: when the power converter is operated in the low input voltage mode, the modulation switch is turned on in a demagnetization-time during which the secondary winding discharges.

15. A power converter, comprising:

a transformer having a primary winding for coupling to an input voltage of the power converter, a secondary winding providing an output voltage of the power converter, and a sensing circuit for providing a sensing signal through auxiliary winding, a power switch for coupling to the primary winding of the power converter to control a primary current flow;

a capacitor and a modulation switch coupled in parallel to the power switch, the modulation switch being coupled in series with the capacitor; and a control circuit, comprising:

a power controller for turning on the power switch to maintain a desired output voltage;

a mode selection circuit for determining the operating mode depending on the magnitude of the input voltage of the power converter, in which the mode selection circuit compares the input voltage of the power converter with a reference voltage and provides a mode selection signal that indicates a high input voltage mode if the input voltage of the power converter is higher than the reference voltage; and a low input voltage mode if the input voltage of the power converter is lower than the reference voltage; and a modulation controller configured to turn on the modulation switch to activate the capacitor according to the mode selection signal, wherein: when the power converter is operated in the high input voltage mode, the modulation switch is turned on in a discontinuous time during which no current flows in the transformer and the sensing signal is characterized by a resonant waveform.

* * * * *